US012804900B2

(12) United States Patent
Kim et al.

(10) Patent No.: US 12,804,900 B2
(45) Date of Patent: Nov. 17, 2026

(54) SEMICONDUCTOR DEVICE WITH DECREASED RC DELAY

(71) Applicant: SAMSUNG ELECTRONICS CO., LTD., Suwon-si (KR)

(72) Inventors: Seungyoon Kim, Suwon-si (KR); Doohyun Kim, Suwon-si (KR); Hyunju Kim, Suwon-si (KR); Heesuk Kim, Suwon-si (KR); Yejin Park, Suwon-si (KR); Jaehwang Sim, Suwon-si (KR); Jongseon Ahn, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 635 days.

(21) Appl. No.: 18/210,729

(22) Filed: Jun. 16, 2023

(65) Prior Publication Data

US 2024/0074193 A1 Feb. 29, 2024

(30) Foreign Application Priority Data

Aug. 29, 2022 (KR) ........................ 10-2022-0108336

(51) Int. Cl.

*H10B 43/27* (2023.01)
*H10B 43/35* (2023.01)
*H10B 43/40* (2023.01)

(52) U.S. Cl.

CPC ............. *H10B 43/27* (2023.02); *H10B 43/35* (2023.02); *H10B 43/40* (2023.02)

(58) Field of Classification Search

CPC ........ H10B 53/00; H10B 53/10; H10B 53/20; H10B 53/30; H10B 53/40; H10B 53/50;

(Continued)

(56) References Cited

U.S. PATENT DOCUMENTS 10,903,229 B2 1/2021 Baek et al.
10,903,237 B1 1/2021 Hosoda et al.

(Continued)

FOREIGN PATENT DOCUMENTS

KR 10-2021-0106672 A 8/2021
KR 10-2022-0018343 A 2/2022
KR 10-2022-0077399 A 6/2022

OTHER PUBLICATIONS

Communication issued on Apr. 13, 2026 by the Korean Ministry of Intellectual Property (MOIP) in Korean Patent Application No. 10-2022-0108336.

*Primary Examiner* — William B Partridge
*Assistant Examiner* — Gustavo G Ramallo
(74) *Attorney, Agent, or Firm* — Sughrue Mion, PLLC

(57) ABSTRACT

A semiconductor device includes a lower circuit pattern on a substrate, a common source plate (CSP) on the lower circuit pattern, a gate electrode structure including gate electrodes spaced apart from each other on the CSP in a first direction that is substantially perpendicular to an upper surface of the substrate, each of the gate electrodes extending in a second direction that is substantially parallel to the upper surface of the substrate, a first insulation pattern structure on a portion of the CSP that is adjacent to the gate electrode structure in the second direction, and a first division pattern extending on the CSP in a third direction that is substantially parallel to the upper surface of the substrate and that crosses the second direction, the first division pattern extending through a portion of the gate electrode structure that is adjacent to the first insulation pattern structure.

20 Claims, 42 Drawing Sheets

(58) Field of Classification Search
CPC ........ H10B 41/00; H10B 41/10; H10B 41/20; H10B 41/23; H10B 41/27; H10B 41/30; H10B 41/35; H10B 41/40–44; H10B 41/46; H10B 41/50; H10B 41/60; H10B 41/70; H10B 43/00; H10B 43/10; H10B 43/20; H10B 43/23; H10B 43/27; H10B 43/30; H10B 43/35; H10B 43/40; H10B 43/50; H10B 51/00; H10B 51/10; H10B 51/20; H10B 51/30; H10B 51/40; H10B 51/50
See application file for complete search history.

(56) References Cited

U.S. PATENT DOCUMENTS

| | | | | |
|---|---|---|---|---|
| 11,239,209 | B2 | 2/2022 | Oh et al. | |
| 11,282,827 | B2 | 3/2022 | Yun et al. | |
| 11,289,504 | B2 | 3/2022 | Yang et al. | |
| 2018/0247953 | A1* | 8/2018 | Lee | H10B 43/40 |
| 2019/0326319 | A1* | 10/2019 | Yun | H10B 43/10 |
| 2020/0168547 | A1 | 5/2020 | Lim et al. | |
| 2021/0384210 | A1 | 12/2021 | Jo et al. | |
| 2022/0093630 | A1* | 3/2022 | Koh | H10B 43/50 |
| 2022/0139831 | A1 | 5/2022 | Kim et al. | |

* cited by examiner

SEMICONDUCTOR DEVICE WITH DECREASED RC DELAY

CROSS-REFERENCE TO RELATED APPLICATION(S)

This application claims priority to Korean Patent Application No 10-2022-0108336, filed on Aug. 29, 2022 in the Korean Intellectual Property Office (KIPO), the disclosure of which is incorporated herein by reference in its entirety.

BACKGROUND

1. Field

One or more example embodiments of the disclosure relate to a semiconductor device, and more particularly, to a vertical memory device.

2. Description of Related Art

In an electronic system requiring data storage needs a high capacity semiconductor device that may store high capacity data. Thus, a method of increasing the data storage capacity of the semiconductor device has been studied. For example, a semiconductor device including memory cells that may be three-dimensionally stacked has been suggested.

In the semiconductor device, as the number of memory cells stacked in a vertical direction increases, areas of contact plugs for applying electrical signals to the memory cells increase, and thus a method of highly integrating the semiconductor device is needed.

SUMMARY

One or more example embodiments provide a semiconductor device having improved characteristics.

Additional aspects will be set forth in part in the description which follows and, in part, will be apparent from the description, or may be learned by practice of the presented embodiments.

According to an aspect of an example embodiment, a semiconductor device may include a lower circuit pattern on a substrate, a common source plate (CSP) on the lower circuit pattern, a gate electrode structure including gate electrodes spaced apart from each other on the CSP in a first direction that is substantially perpendicular to an upper surface of the substrate, each of the gate electrodes extending in a second direction that is substantially parallel to the upper surface of the substrate, a first insulation pattern structure on a portion of the CSP that is adjacent to the gate electrode structure in the second direction, a first division pattern extending on the CSP in a third direction that is substantially parallel to the upper surface of the substrate and that crosses the second direction, the first division pattern extending through a portion of the gate electrode structure that is adjacent to the first insulation pattern structure and separating the gate electrode structure in the second direction, a channel extending through the gate electrode structure in the first direction, the channel being connected to the CSP, a first through via extending through the CSP and the gate electrode structure in the first direction, the first through via being connected to the lower circuit pattern, and a second through via extending through the CSP and the first insulation pattern structure in the first direction, the second through via being connected to the lower circuit pattern, where a first gate electrode among the gate electrodes is commonly connected to the first through via and the second through via.

According to an aspect of an example embodiment, a semiconductor device may include a lower circuit pattern on a substrate, a CSP on the lower circuit pattern, a gate electrode structure including gate electrodes spaced apart from each other on the CSP in a first direction that is substantially perpendicular to an upper surface of the substrate, each of the gate electrodes extending in a second direction that is substantially parallel to the upper surface of the substrate, division patterns on the CSP, each of the division patterns extending through the gate electrode structure in a third direction that is substantially parallel to the upper surface of the substrate and that crosses the second direction, an insulation pattern structure on a portion of the CSP between the division patterns, a channel extending through the gate electrode structure in the first direction, the channel being connected to the CSP, a first through via extending through the CSP and the gate electrode structure in the first direction, the first through via being connected to the lower circuit pattern, and a second through via extending through the CSP and the insulation pattern structure in the first direction, the second through via being connected to the lower circuit pattern, where a first gate electrode among the gate electrodes is commonly connected to the first through via and the second through via.

According to an aspect of an example embodiment, a semiconductor device may include a first pass transistor on a second region of a substrate and a second pass transistor on a third region of the substrate, the substrate including first regions at opposite sides of the third region, wherein the second region is at a side of at least one of the first regions, a CSP on the first pass transistor and the second pass transistor, a gate electrode structure including gate electrodes spaced apart from each other on the CSP in a first direction that is substantially perpendicular to an upper surface of the substrate, each of the gate electrodes extending in a second direction that is substantially parallel to the upper surface of the substrate on the first regions, the second region, and the third region of the substrate, division patterns on the third region of the substrate, each of the division patterns extending through the gate electrode structure in a third direction that substantially parallel to the upper surface of the substrate and that crosses the second direction, an insulation pattern structure on a portion of the CSP between the division patterns, a memory channel structure extending through the gate electrode structure in the first direction on each of the first regions of the substrate, the memory channel structure being connected to the CSP, a dummy memory channel structure extending through the gate electrode structure in the first direction on the third region of the substrate, the dummy memory channel structure being connected to the CSP, a first through via extending through the CSP and the gate electrode structure in the first direction on the second region of the substrate, the first through via being connected to the first pass transistor, and a second through via extending through the CSP and the insulation pattern structure in the first direction on the third region of the substrate, the second through via being connected to the second pass transistor, where a first gate electrode among the gate electrodes is commonly connected to the first through via and the second through via and the first gate electrode is configured as a string selection line (SSL).

BRIEF DESCRIPTION OF DRAWINGS

The above and other aspects, features, and advantages of certain example embodiments of the present disclosure will be more apparent from the following description taken in conjunction with the accompanying drawings, in which.

DETAILED DESCRIPTION

Figure 1:
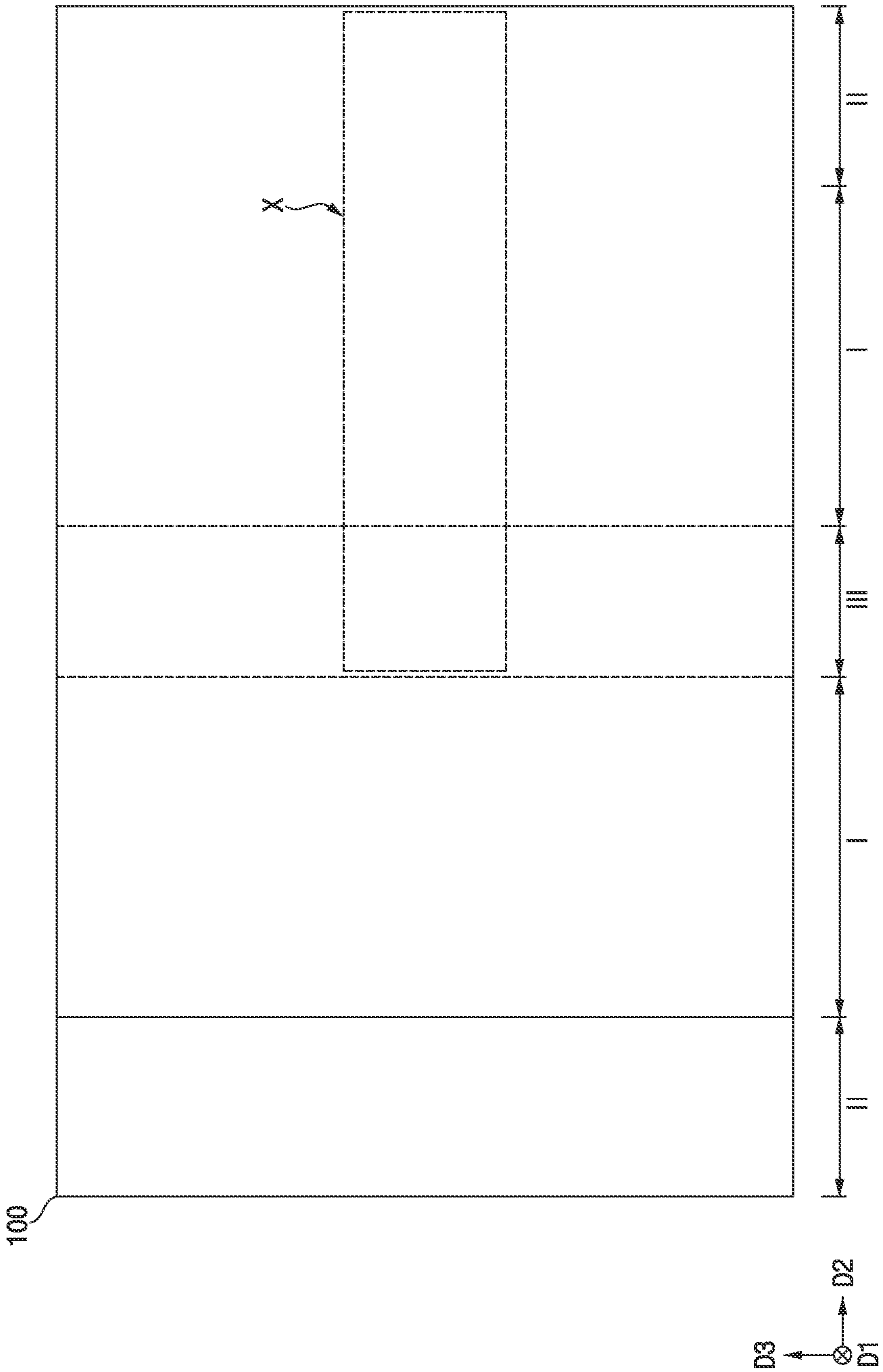
FIGS. 1 and 2 are diagrams illustrating a method of manufacturing a semiconductor device in accordance with example embodiments.

Hereinafter, example embodiments of the disclosure will be described in detail with reference to the accompanying drawings. The same reference numerals are used for the same components in the drawings, and redundant descriptions thereof will be omitted. The embodiments described herein are example embodiments, and thus, the disclosure is not limited thereto and may be realized in various other forms.

As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

It will be understood that, although the terms "first," "second," and/or "third" may be used herein to describe various elements, these elements should not be limited by these terms. These terms are only used to distinguish one element from another element.

Hereinafter, a vertical direction substantially perpendicular to an upper surface of a substrate may be defined as a first direction D1, and two directions among horizontal directions substantially parallel to the upper surface of the substrate, which cross each other, may be defined as second and third directions D2 and D3, respectively. In example embodiments, the second and third directions D2 and D3 may be substantially perpendicular to each other.

Figure 2:
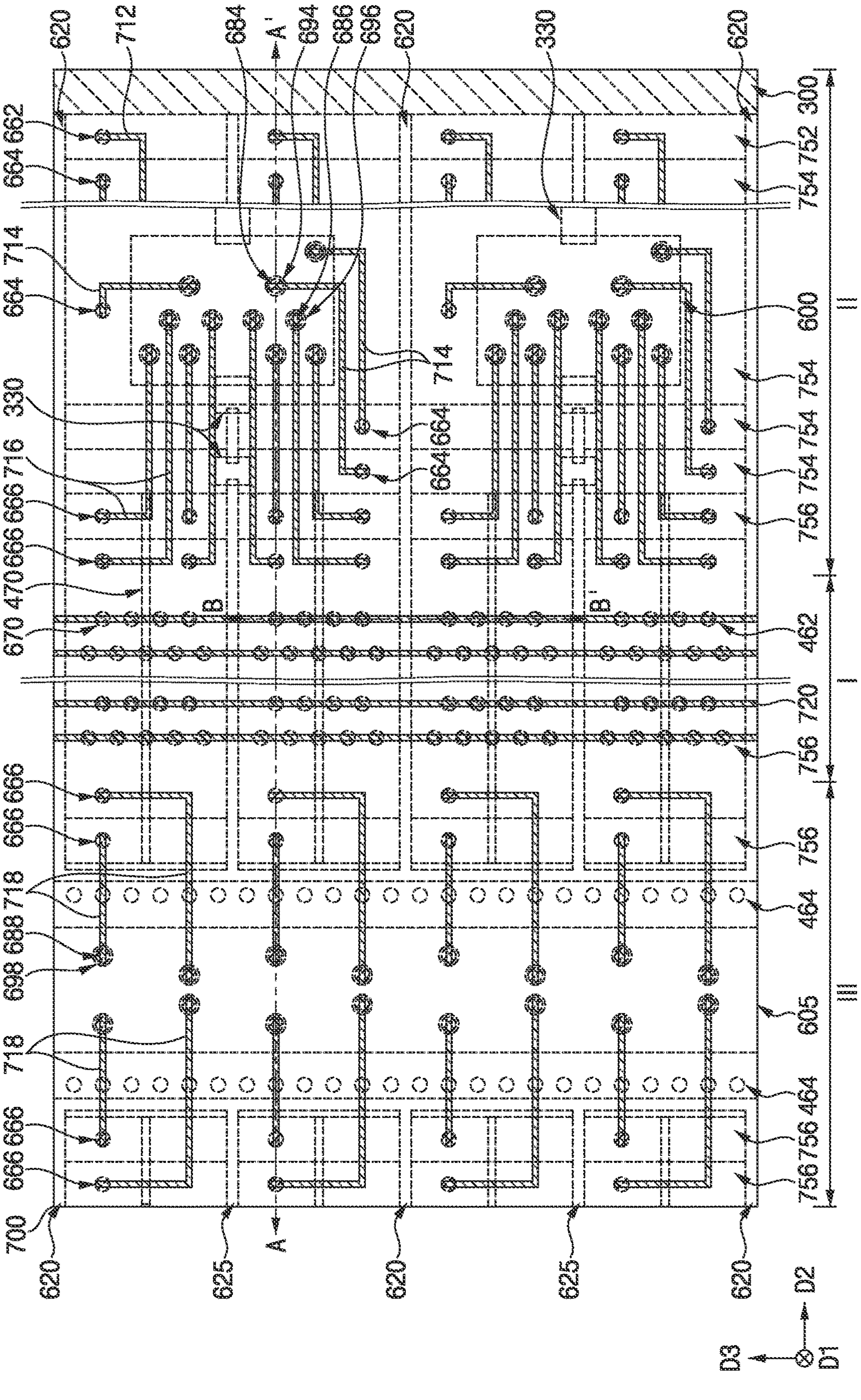
Figure 3:
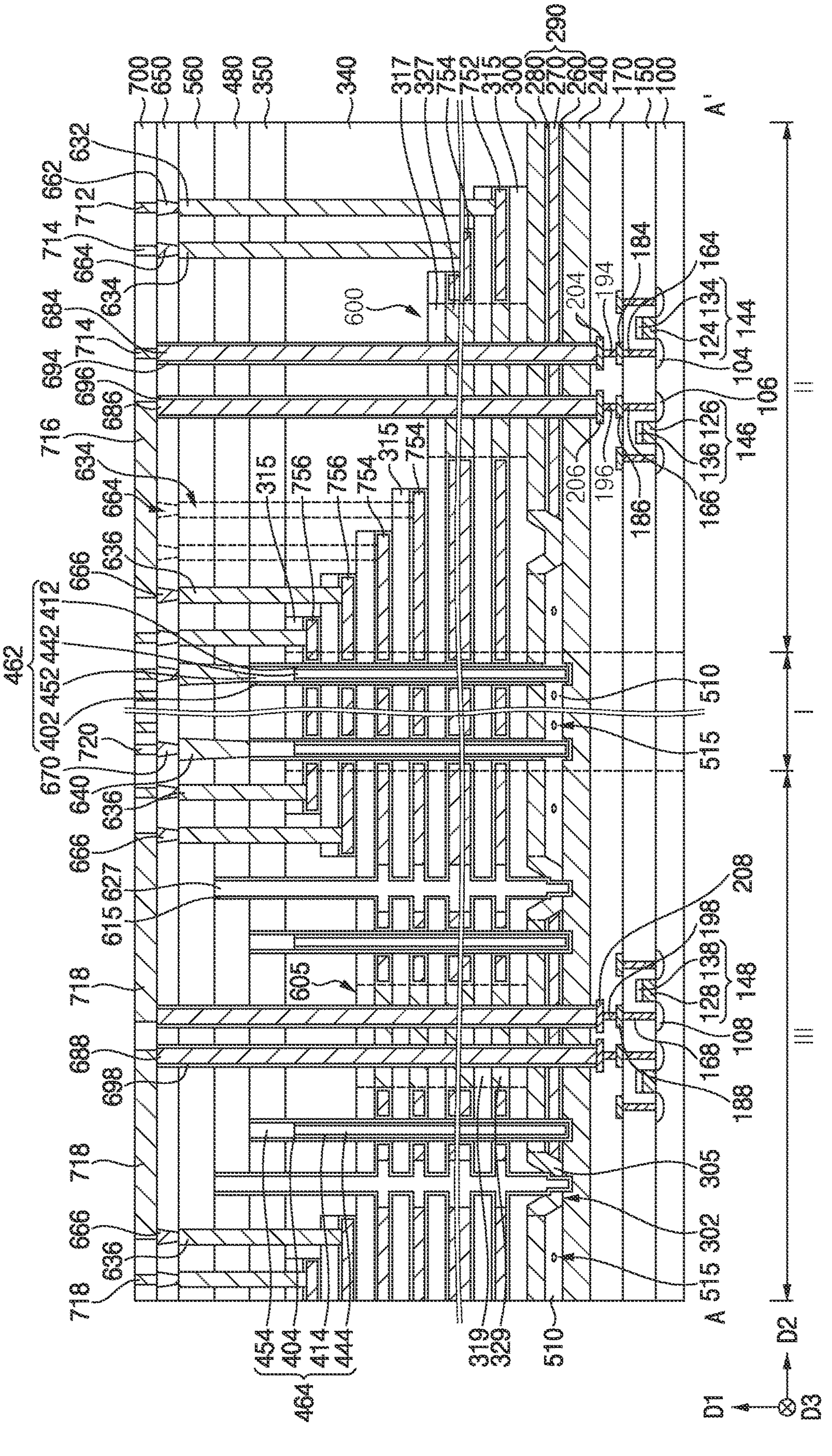
FIGS. 3 and 4 are a cross-sectional views illustrating a method of manufacturing a semiconductor device in accordance with example embodiments.
Figure 4:
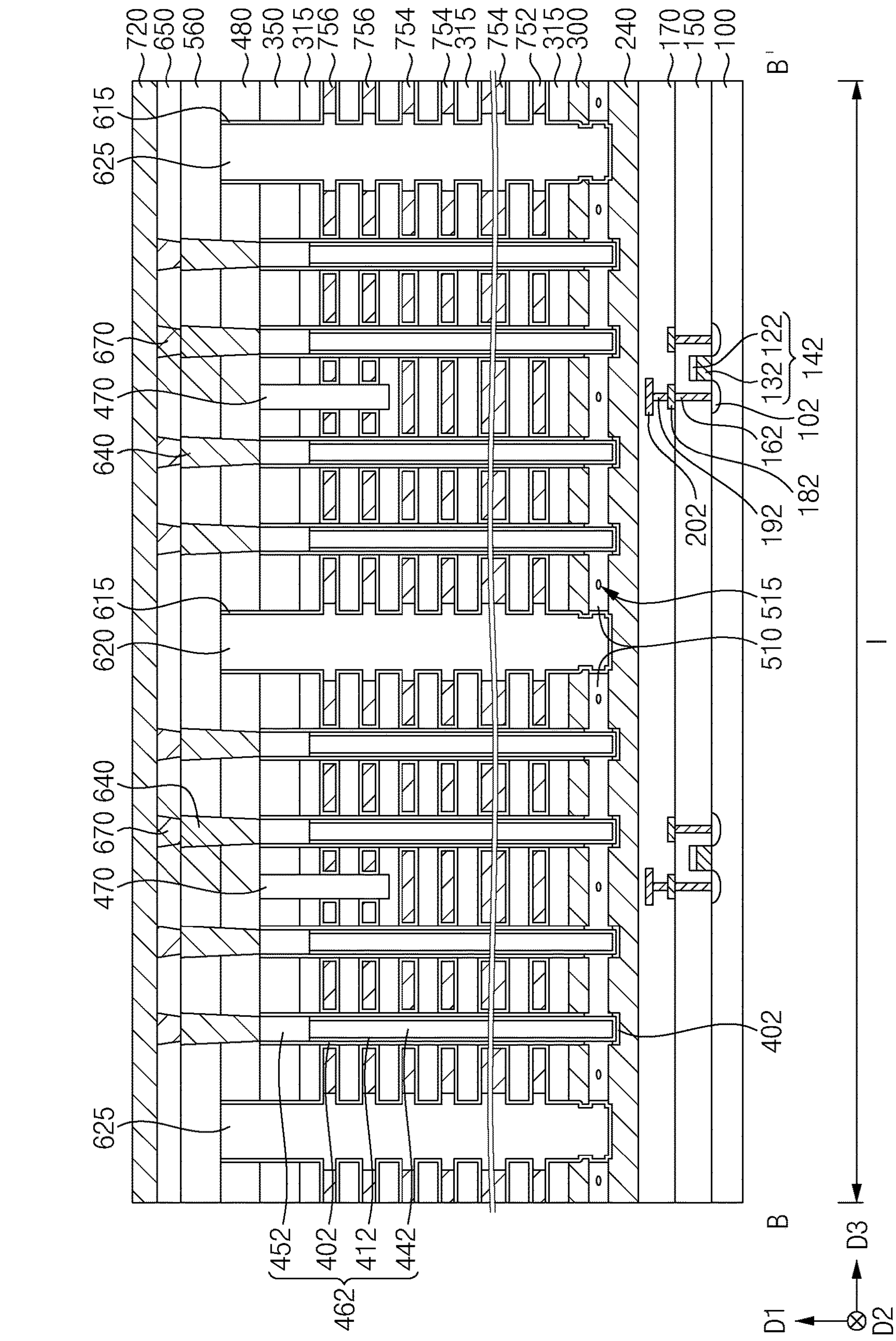

FIGS. 1 and 2 are diagrams illustrating a method of manufacturing a semiconductor device in accordance with example embodiments. FIGS. 3 and 4 are a cross-sectional views illustrating a method of manufacturing a semiconductor device in accordance with example embodiments. Particularly, FIGS. 1 and 2 are plan views, FIG. 3 is a cross-sectional view taken along line A-A' of FIG. 2, and FIG. 4 is a cross-sectional view taken along line B-B' of FIG. 2. FIGS. 2 to 4 are drawings of region X of FIG. 1.

Referring to FIGS. 1 to 4, the semiconductor device may include a lower circuit pattern, a common source plate (CSP), a gate electrode structure, first to fifth division patterns 330, 470, 620, 625 and 627, first and second insulation pattern structures 600 and 605, a memory channel structure 462, a dummy memory channel structure 464, first to eighth upper contact plugs 632, 634, 636, 640, 662, 664, 666 and 670, first to third through vias 684, 686 and 688, and first to fifth upper wirings 712, 714, 716, 718 and 720.

The semiconductor device may further include a support layer 300, a support pattern 305, a sacrificial layer structure 290, a channel connection pattern 510, a second blocking pattern 615, a first insulation pattern 315, sixth to eighth insulation patterns 694, 696 and 698, and first to eighth insulating interlayers 150, 170, 340, 350, 480, 560, 650 and 700.

The substrate 100 may include a semiconductor material (e.g., silicon, germanium, silicon-germanium), or III-V group compounds (e.g., GaP, GaAs GaSb, etc.). In an example embodiment, the substrate 100 may be a silicon-on-insulator (SOI) substrate or germanium-on-insulator (GOI) substrate.

In example embodiments, the substrate 100 may include a third region III, a first region I at each of opposite sides in the second direction D2 of the third region III, and a second region II at a side in the second direction D2 of each of the first regions I. The first region I may be a cell region in which memory cells are formed, the second region II may be an extension region in which upper contact plugs for applying electrical signals to the memory cells are formed, and the third region III may be a connection region for connecting the first regions I, which are spaced apart from each other in the second direction D2, to each other.

In example embodiments, the semiconductor device may have a cell over periphery (COP) structure. That is, a lower circuit pattern may be formed on the substrate 100, and memory cells, upper contact plugs and an upper circuit pattern may be formed over the lower circuit pattern. The lower circuit pattern may include, for example, transistors, lower contact plugs, lower wirings, lower vias, etc.

For example, a first transistor may be formed on the first region I of the substrate 100, second and third transistors may be formed on the second region II of the substrate 100, and a fourth transistor may be formed on the third region III of the substrate 100.

The first transistor may include a first lower gate structure 142 on the substrate 100 and first impurity regions 102 at upper portions of the substrate 100 adjacent to the first lower gate structure 142, each of which may serve as source/drain of the first transistor. The second transistor may include a second lower gate structure 144 on the substrate 100 and second impurity regions 104 at upper portions of the substrate 100 adjacent to the second lower gate structure 144, each of which may serve as source/drain of the second transistor. The third transistor may include a third lower gate structure 146 on the substrate 100 and third impurity regions 106 at upper portions of the substrate 100 adjacent to the third lower gate structure 146, each of which may serve as source/drain of the third transistor. The fourth transistor may include a fourth lower gate structure 148 on the substrate 100 and fourth impurity regions 108 at upper portions of the substrate 100 adjacent to the fourth lower gate structure 148, each of which may serve as source/drain of the fourth transistor.

In example embodiments, each of the first to fourth transistors may be a pass transistor.

The first lower gate structure 142 may include a first lower gate insulation pattern 122 and a first lower gate electrode 132 stacked on the substrate 100. The second lower gate structure 144 may include a second lower gate insulation pattern 124 and a second lower gate electrode 134 stacked on the substrate 100. The third lower gate structure 146 may include a third lower gate insulation pattern 126 and a third lower gate electrode 136 stacked on the substrate 100. The fourth lower gate structure 148 may include a fourth lower gate insulation pattern 128 and a fourth lower gate electrode 138 stacked on the substrate 100.

The first insulating interlayer 150 may be formed on the substrate 100, and may cover the first to fourth transistors. The first to fourth lower contact plugs 162, 164, 166 and 168 may extend through the first insulating interlayer 150, and may contact the first to fourth impurity regions 102, 104, 106 and 108, respectively.

The first to fourth lower wirings 182, 184, 186 and 188 may be formed on the first insulating interlayer 150, and may contact upper surfaces of the first to fourth lower contact plugs 162, 164, 166 and 168, respectively. A first lower via 192 and a fifth lower wiring 202 may be stacked on the first lower wiring 182, a second lower via 194 and a sixth lower wiring 204 may be stacked on the second lower wiring 184, a third lower via 196 and a seventh lower wiring 206 may be stacked on the third lower wiring 186, and a fourth lower via 198 and an eighth lower wiring 208 may be stacked on the lower wiring 188.

The second insulating interlayer 170 may be formed on the first insulating interlayer 150, and may cover the first to eighth lower wirings 182, 184, 186, 188, 202, 204, 206 and 208, and the first to fourth lower vias 192, 194, 196 and 198.

Each of the first and second insulating interlayers 150 and 170 may include an oxide (e.g., silicon oxide).

The CSP 240 may be formed on the second insulating interlayer 170. The CSP 240 may include polysilicon doped with, for example, n-type impurities. Alternatively, the CSP 240 may include a metal silicide layer and a polysilicon layer doped with n-type impurities stacked on each other. The metal silicide layer may include, for example, tungsten silicide.

The sacrificial layer structure 290, the channel connection pattern 510, the support layer 300 and the support pattern 305 may be formed.

The channel connection pattern 510 may be formed on the first region I of the substrate 100, and portions of the second and third regions II and III of the substrate 100 adjacent to the first region I. The sacrificial layer structure 290 may be formed on other portions of the second and third regions II and III of the substrate 100. The channel connection pattern 510 may include an air gap 515 therein.

The support layer 300 may be formed on the channel connection pattern 510 and the sacrificial layer structure 290, and may also be formed in a first opening 302 exposing an upper surface of the CSP 240. Thus, a portion of the support layer 300 in the first opening 302 may be referred to as a support pattern 305.

The support pattern 305 may have various layouts in a plan view. For example, a plurality of support patterns 305 may be spaced apart from each other in the second and third directions D2 and D3 on the first region I of the substrate 100, the support patterns 305 may extend in the third direction D3 on a portion of the second region II of the substrate 100 adjacent to the first region I, and a plurality of support patterns 305 may be spaced apart from each other in the second direction D2 on the third region III of the substrate 100, each of which may extend in the third direction D3.

The channel connection pattern 510 may include polysilicon doped with, for example, n-type impurities or undoped polysilicon. The sacrificial layer structure 290 may include first to third sacrificial layers 260, 270 and 280 sequentially stacked in the first direction D1. Each of the first and third sacrificial layers 260 and 280 may include an oxide (e.g., silicon oxide), and the second sacrificial layer 270 may include a nitride (e.g., silicon nitride). The support layer 300 and the support pattern 305 may include a material having an etching selectivity with respect to the first to third sacrificial layers 260, 270 and 280 (e.g., polysilicon doped with n-type impurities).

The gate electrode structure may include a plurality of gate electrodes spaced apart from each other in the first direction D1 on the support layer 300 and the support pattern 305, each of which may extend in the second direction D2. The first insulation pattern 315 may be formed between the gate electrodes and between the gate electrode and the support layer 300 and the support pattern 305. The first insulation pattern 315 may include an oxide (e.g., silicon oxide).

In example embodiments, the gate electrode structure may include first, second and third gate electrodes 752, 754 and 756 sequentially stacked in the first direction D1. The first gate electrode 752 may be formed at one or two levels, the second gate electrode 754 may be formed at a plurality of levels, and the third gate electrode 756 may be formed at one or two levels. FIGS. 3 and 4 show that the first gate electrode 752 is formed at one level, and the third gate electrode 756 is formed at two levels, however, the disclosure is not limited thereto.

In example embodiments, the first gate electrode 752 may serve as a ground selection line (GSL), the second gate electrode 754 may serve as a word line, and the third gate electrode 756 may serve (i.e., may be configured as) as a string selection line (SSL).

The gate electrode structure may further include a gate induced drain leakage (GIDL) gate electrode that may be used in an erase operation for erasing data stored in the memory channel structure 462 through GIDL phenomenon. In an example embodiment, the GIDL gate electrode may be formed at a level under the first gate electrode 752 and at a level over the third gate electrode 756. The GIDL gate electrode may be formed at a level between the second gate electrode 754 and the third gate electrode 756 and at a level under the first gate electrode 752.

In example embodiments, the gate electrode structure may have a staircase shape in which a length in the second direction D2 decreases from a lowermost level toward an uppermost level in the first direction D1, and may include a plurality of steps arranged in the second direction D2 on the second region II of the substrate 100. The gate electrode structure may further include steps arranged in the third direction D3 on the second region II of the substrate 100.

Hereinafter, an end portion of each of the gate electrode not overlapped by upper gate electrodes in the first direction D1 may be referred to as a pad. Thus, the pad of each of the gate electrodes may be formed on the second region II of the substrate 100.

The gate electrode structure may include first pads having a relatively small length in the second direction D2 and second pads having a relatively large length in the second direction D2, and the number of the first and second pads is not limited.

In example embodiments, the gate electrode structure may further include steps arranged in the second direction D2 at upper levels, respectively, on an edge portion of the third region III of the substrate 100 adjacent to the first region I. That is, a portion of the gate electrode structure in which the third gate electrodes 756 serving as SSLs, respectively, are formed may have a staircase shape.

Thus, the third gate electrode 756 may include a pad on the third region III of the substrate 100 as well as the pad on the second region II of the substrate 100. FIG. 3 shows a portion of the gate electrode structure in which the third gate electrodes 756 at upper two levels, respectively, are formed has a staircase shape.

Each of the first to third gate electrodes 752, 754 and 756 may include a gate conductive pattern and a gate barrier pattern covering a surface of the gate conductive pattern. The gate conductive pattern may include a metal having a low resistance (e.g., tungsten, titanium, tantalum, platinum, etc.), and the gate barrier pattern may include a metal nitride (e.g., titanium nitride, tantalum nitride, etc.).

In example embodiments, a plurality of gate electrode structures may be spaced apart from each other in the third direction D3, and the third division pattern 620 may be formed between the gate electrode structures on the CSP 240. The third division pattern 620 may extend in the second direction D2 on the first and second regions I and II of the substrate 100 and a portion of the third region III of the substrate 100 adjacent to the first region I.

In example embodiments, the fifth division pattern 627 may extend in the third direction D3 through the gate electrode structures disposed in the third direction D3 on the third region III of the substrate 100. The fifth division pattern 627 may be spaced apart from an edge portion of the gate electrode structure having a staircase shape in the second direction D2 on the third region III of the substrate 100, and thus two fifth division patterns 627 may be spaced apart from each other in the second direction D2 on the third region III of the substrate 100. Each of the gate electrode structures extending in the second direction D2 on the first to third regions I, II and III of the substrate 100 may be divided by each of the fifth division patterns 627 on the third region III of the substrate 100.

The fourth division pattern 625 may extend in the second direction through each of the gate electrode structures on the first region I, a portion of the third region III adjacent to the first region I and a portion of the second region II adjacent to the first region I of the substrate 100. The fourth division pattern 625 may not continuously extend to an end portion in the second direction D2 of the second region II of the substrate 100 unlike the third division pattern 620, and a plurality of fourth division patterns 625 may be spaced apart from each other in the second direction D2.

However, the fourth division pattern 625 may extend from the first region I of the substrate 100 to a portion of the second region II of the substrate 100 overlapping the third gate electrodes 756 in the first direction D1, and to a portion of the third region III of the substrate 100 overlapping the third gate electrodes 756 in the first direction D1, and thus each of the third gate electrodes 756 may be divided by the fourth division pattern 625 in the third direction D3.

In example embodiments, the fifth division pattern 627 may contact and be connected to an end portion in the second direction D2 of each of the third and fourth division patterns 620 and 625.

Each of the third gate electrodes 756 may be further divided by the second division pattern 470 extending through an upper portion of each of the gate electrode structures, that is, for example, two upper levels at which the third gate electrodes 756 are formed. The second division pattern 470 may extend from the first region I of the substrate 100 to the portion of the second region II of the substrate 100 overlapping the third gate electrodes 756 in the first direction D1, and to the portion of the third region III of the substrate 100 overlapping the third gate electrodes 756 in the first direction D1.

Figure 8:
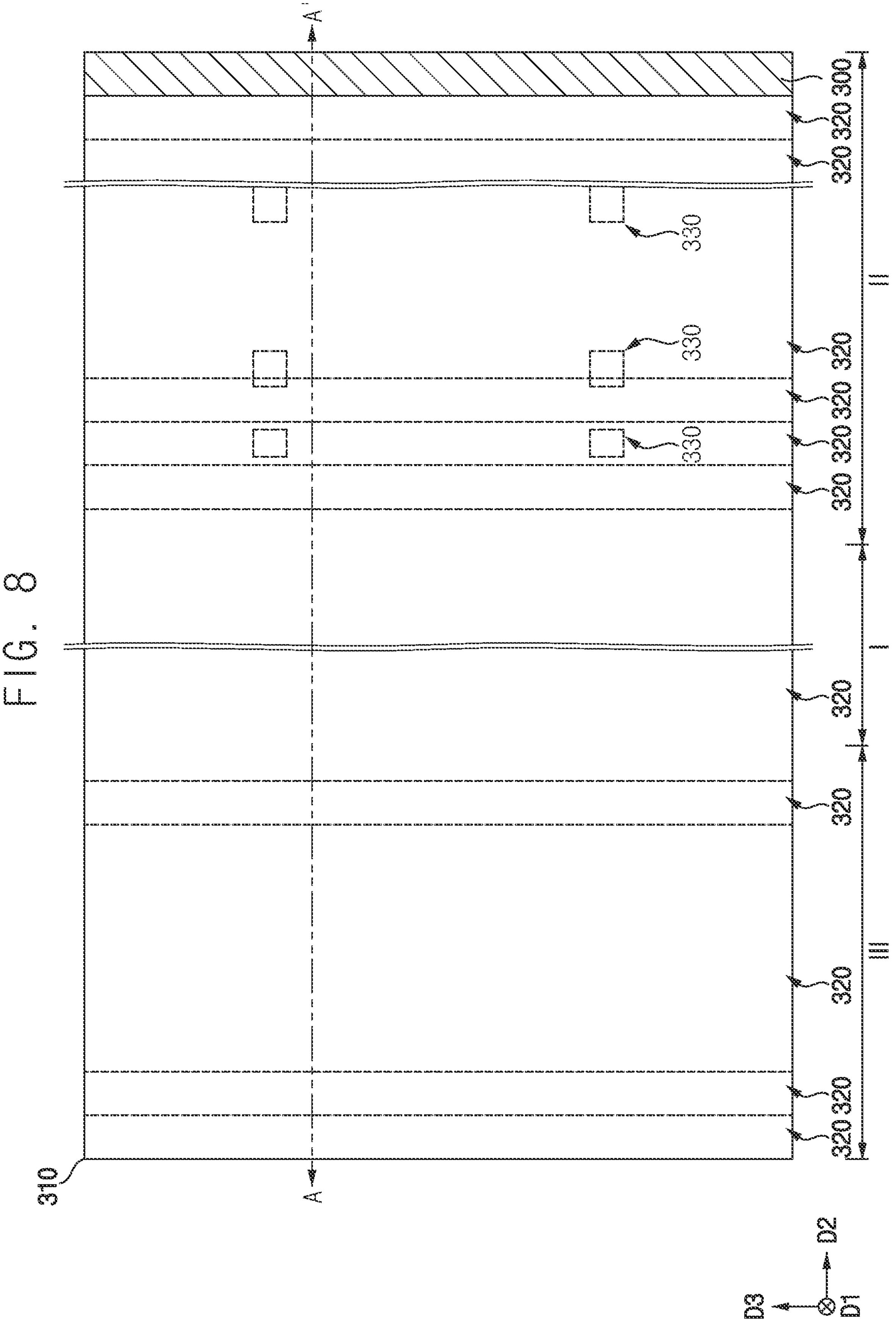

Referring to FIGS. 1 to 4 together with FIG. 8, the first division pattern 330 may extend through the first gate electrode 752 on the second region II of the substrate 100. A plurality of first division patterns 330 may be spaced apart from each other in the second and third directions D2 and D3. In example embodiments, the first division pattern 330 may contact an end portion in the second direction D2 of the fourth division pattern 625, and may overlap an end portion in the second direction D2 of the first insulation pattern structure 600 in the first direction D1.

Each of the first to fifth division patterns 330, 470, 620, 625 and 627 may include an oxide (e.g., silicon oxide).

A memory block may include one of the gate electrode structures and a number of the memory channel structures 462 in an area that may be defined by division patterns of the third division patterns 620 being adjacent in the third direction D3 and the fifth division pattern 627. In example embodiments, a plurality of memory blocks may be disposed in the third direction D3 to form a memory block column, and the memory block column may be disposed at each of opposite sides in the second direction D2 of the third region III of the substrate 100.

In an example embodiment, each of the memory block may include two first gate electrodes 752 divided by the first division pattern 330 at each level, one second gate electrode 754 at each level, and four third gate electrodes 756 divided by the second and fourth division patterns 470 and 625 at each level, however, the disclosure is not limited thereto. Alternatively, each of the memory block may include two first gate electrodes 752 at each level, one second gate electrode 754 at each level, and sixth third gate electrodes 756 at each level.

Figure 15:
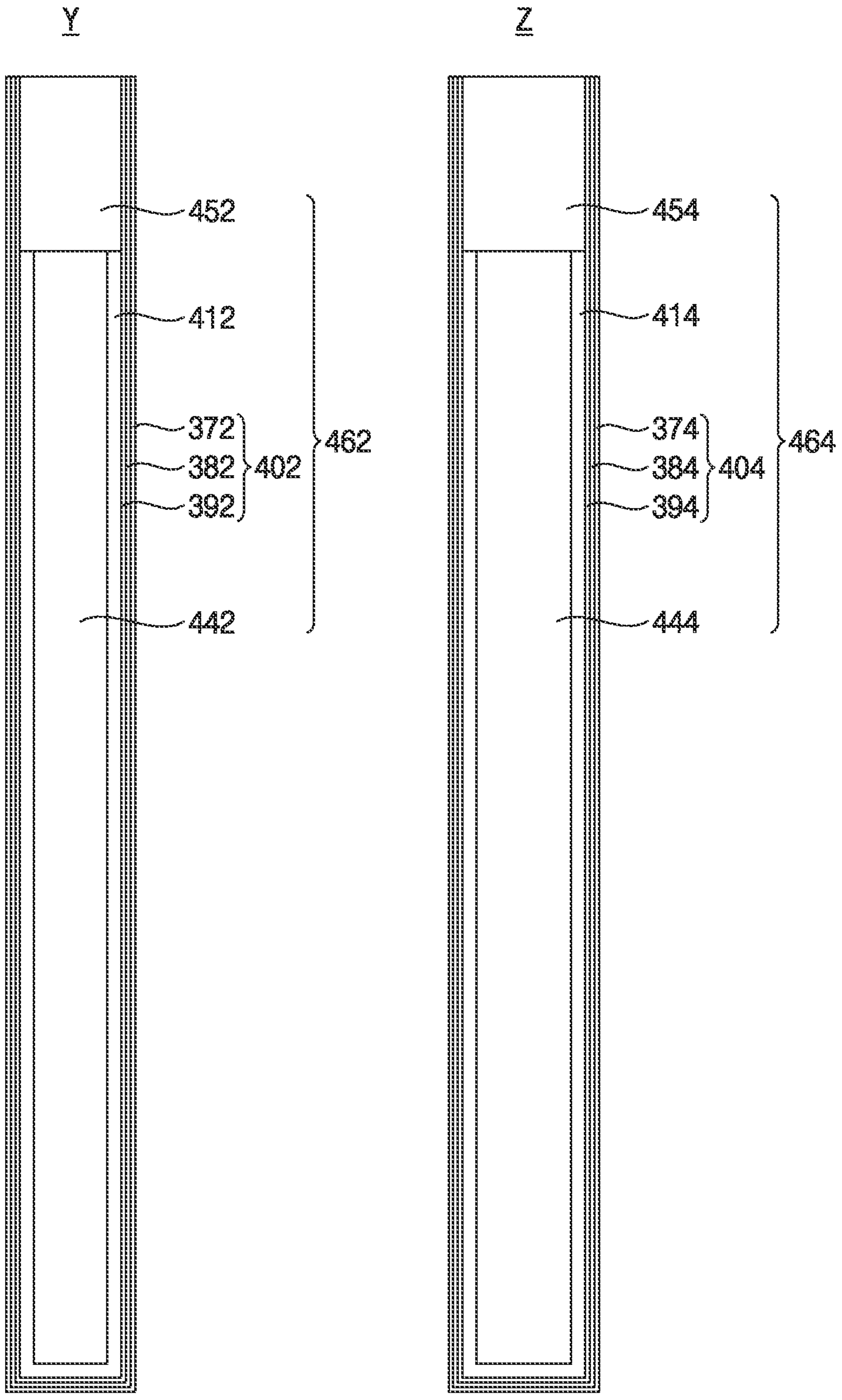

Referring to FIGS. 1 to 4 together with FIG. 15, the memory channel structure 462 may contact an upper surface of the CSP 240 on the first region I of the substrate 100, and may extend through the channel connection pattern 510, the gate electrode structure, the first insulation pattern 315 and the fourth insulating interlayer 350. In example embodiments, the memory channel structure 462 may include a first filling pattern 442 having a pillar shape extending in the first direction D1, a channel 412 having a cup shape on a sidewall of the first filling pattern 442, a first capping pattern 452 contacting upper surfaces of the first filling pattern 442 and the channel 412, and a charge storage structure 402 on an outer sidewall of the channel 412 and a sidewall of the first capping pattern 452.

The charge storage structure 402 may include a tunnel insulation pattern 392, a charge storage pattern 382 and a first blocking pattern 372 sequentially stacked on the outer sidewall of the channel 412 in the horizontal direction.

In example embodiments, a plurality of memory channel structures 462 may be spaced apart from each other in the second and third directions D2 and D3 on the first region I of the substrate 100 to form a memory channel array, and memory channel structures of the memory channel structures 462 included in the memory channel array may be connected to each other by the channel connection pattern 510. Particularly, the charge storage structure 402 may not be formed on a portion of the outer sidewall of each of the channels 412, and the channel connection pattern 510 may contact the outer sidewalls of the channels 412, and may electrically connect the channels 412 to each other.

The dummy memory channel structure 464 may contact an upper surface of the CSP 240 on the third region III of the substrate 100, and may extend through the sacrificial layer structure 290, the gate electrode structure, the first insulation pattern 315 and the third and fourth insulating interlayers 340 and 350. In example embodiments, the dummy memory channel structure 464 may include a second filling pattern 444 having a pillar shape extending in the first direction D1, a dummy channel 414 having a cup shape on a sidewall of the second filling pattern 444, a second capping pattern 454 contacting upper surfaces of the second filling pattern 444 and the dummy channel 414, and a dummy charge storage structure 404 on an outer sidewall of the dummy channel 414 and a sidewall of the second capping pattern 454.

The dummy charge storage structure 404 may include a dummy tunnel insulation pattern 394, a dummy charge storage pattern 384 and a first dummy blocking pattern 374 sequentially stacked on the outer sidewall of the dummy channel 414 in the horizontal direction.

The dummy memory channel structure 464 may not serve as a channel in which data may be stored or charge carriers may move, and may prevent the gate electrode structure from leaning or collapse. Thus, the dummy memory channel structure 464 may be referred to as a support structure 464.

In example embodiments, a plurality of support structures 464 may be spaced apart from each other in the second and third directions D2 and D3 on the third region III of the substrate 100 to form a support structure array. The support structure array may include support structure columns, each of which may include support structures of the support structures 464 disposed in the third direction D3, spaced apart from each other in the second direction D2.

In example embodiments, the support structure 464 may be formed on a portion of the third region III of the substrate 100 adjacent to each of the fifth division patterns 627. FIG. 2 shows one support structure column is formed on the portion of the third region III of the substrate 100 adjacent to each of the fifth division patterns 627, however, the disclosure is not limited thereto. Thus, a plurality of support structure columns may be spaced apart from each other in the second direction D2 on the portion of the third region III of the substrate 100 adjacent to each of the fifth division patterns 627.

Each of the channel 412 and the dummy channel 414 may include undoped polysilicon, each of the first and second filling patterns 442 and 444 may include an oxide (e.g., silicon oxide) and each of the first and second capping patterns 452 and 454 may include doped polysilicon.

Each of the tunnel insulation pattern 392 and the dummy tunnel insulation pattern 394 may include an oxide (e.g., silicon oxide), each of the charge storage pattern 382 and the dummy charge storage pattern 384 may include a nitride (e.g., silicon nitride), and each of the first blocking pattern 372 and the first dummy blocking pattern 374 may include an oxide (e.g., silicon oxide).

The first insulation pattern structure 600 may extend through a portion of the gate electrode structure on the second region II of the substrate 100, and may have a shape of a rectangle, an ellipse, a circle, etc., in a plan view. In example embodiments, the first insulation pattern structure 600 may extend through the second pad of the gate electrode structure having a relatively large length in the second direction D2. The first insulation pattern structure 600 may include second and third insulation patterns 317 and 327 alternately and repeatedly stacked in the first direction D1.

The second insulation pattern structure 605 may extend through a portion of the gate electrode structure on the third region III of the substrate 100, and may have a shape of a rectangle, an ellipse, a circle, etc., in a plan view. In example embodiments, the second insulation pattern structure 605 may be formed on a central portion in the second direction D2 of the third region III of the substrate 100, and the support structures 464 may be formed at each of opposite sides in the second direction D2 through the gate electrode structure. The second insulation pattern structure 605 may include fourth and fifth insulation patterns 319 and 329 alternately and repeatedly stacked in the first direction D1.

The second and fourth insulation patterns 317 and 319 may include a material substantially the same as that of the first insulation pattern 315 (that is, an oxide, such as silicon oxide), and the third and fifth insulation patterns 327 and 329 may include a nitride (e.g., silicon nitride).

The second blocking pattern 615 may cover lower and upper surfaces of each of the first to third gate electrodes 752, 754 and 756, and a sidewall of each of the first to third gate electrodes 752, 754 and 756 facing the memory channel structure 462 and the support structure 464. The second blocking pattern 615 may contact sidewalls of the third and fifth insulation patterns 327 and 329. The second blocking pattern 615 may include a metal oxide, e.g., aluminum oxide, hafnium oxide, etc.

The third insulating interlayer 340 may be formed on the support layer 300, and may cover sidewalls of the gate electrode structure and the first insulation pattern 315. The fourth insulating interlayer 350 may be formed on the third insulating interlayer 340 and the first insulation pattern 315.

The fifth to eighth insulating interlayers 480, 560, 650 and 700 may be sequentially stacked on the fourth insulating interlayer 350, the memory channel structure 462 and the support structure 464.

The first to third upper contact plugs 632, 634 and 636 may extend through the third to sixth insulating interlayers 340, 350, 480 and 560, the first insulation pattern 315 and the second blocking pattern 615 to contact upper surfaces of the first to third gate electrodes 752, 754 and 756, respectively. The fourth upper contact plugs 640 may extend through the fifth and sixth insulating interlayers 480 and 560 to contact an upper surface of the first capping pattern 452.

The first and second upper contact plugs 632 and 634 may contact upper surfaces of pads of the first and second gate electrodes 752 and 754, respectively, on the second region II of the substrate 100.

The third upper contact plug 636 may also be formed on the third region III of the substrate 100 as well as on the second region II of the substrate 100. That is, the third upper contact plugs 636 may contact upper surfaces of the pads, respectively, of the third gate electrode 756, which may be formed at end portions, respectively, in the second direction D2 of the third gate electrode 756.

The fifth to eighth upper contact plugs 662, 664, 666 and 670 may extend through the seventh insulating interlayer 650 to contact upper surfaces of the first to fourth upper contact plugs 632, 634, 636 and 640, respectively.

The first and second through vias 684 and 686 may extend through the third to sixth insulating interlayers 340, 350, 480 and 560, the first insulation pattern structure 600, the support layer 300, the sacrificial layer structure 290, the CSP 240 and an upper portion of the second insulating interlayer 170 to contact upper surfaces of the sixth and seventh lower wirings 204 and 206, respectively, on the second region II of the substrate 100. The third through via 688 may extend through the third to sixth insulating interlayers 340, 350, 480 and 560, the second insulation pattern structure 605, the support layer 300, the sacrificial layer structure 290, the CSP 240 and an upper portion of the second insulating interlayer 170 to contact an upper surface of the eighth lower wiring 208 on the third region III of the substrate 100.

The sixth to eighth insulation patterns 694, 696 and 698 may be formed on sidewalls of the first to third through vias 684, 686 and 688, respectively.

The first to fifth upper wirings 712, 714, 716, 718 and 720 may extend through the eighth insulating interlayer 700.

In example embodiments, the first upper wiring 712 may contact an upper surface of the fifth upper contact plug 662, the second upper wiring 714 may commonly contact upper surfaces of the sixth upper contact plug 664 and the first through via 684, the third upper wiring 716 may commonly contact upper surfaces of the seventh upper contact plug 666 and the second through via 686 on the second region II of the substrate 100, the fourth upper wiring 718 may commonly contact upper surfaces of the seventh upper contact plug 666 and the third through via 688 on the third region III of the substrate 100, and the fifth upper wiring 720 may extend in the third direction D3 to commonly contact upper surfaces of the eighth upper contact plugs 670 disposed in the third direction D3 on the first region I of the substrate 100.

In example embodiments, the fifth upper wiring 720 may serve as a bit line of the semiconductor device.

The layouts of the first to fifth upper wirings 712, 714, 716, 718 and 720 are illustrative, and the disclosure is not limited thereto.

The third gate electrode 756 serving as an SSL and included in each of the gate electrode structures may be electrically connected to the third transistor through the third upper contact plug 636, the seventh upper contact plug 666, the third upper wiring 716 and the second through via 686 on the second region II of the substrate 100, and may be electrically connected to the fourth transistor through the third upper contact plug 636, the seventh upper contact plug 666, the fourth upper wiring 718 and the third through via 688 on the third region III of the substrate 100.

That is, electrical signals may be applied from the third and fourth transistors to the third gate electrode 756 through the third upper contact plugs 636, respectively, which may contact pads at opposite end portions, respectively, in the second direction D2 of the third gate electrode 756. Thus, when compared to the second gate electrode 754 to which electrical signals may be applied from the second transistor through the second upper contact plug 634 that may contact a pad at an end portion in the second direction D2 of the second gate electrode 754, a resistance between the third gate electrode 756 and the third upper contact plug 636 may decrease so as to reduce an RC-delay.

When compared to a related art semiconductor device including gate electrode structures, that each of which may have steps disposed at opposite sides in a direction (e.g., a direction corresponding to the second direction D2), and spaced apart from each other in the direction (e.g., the direction corresponding to the second direction D2), each of the gate electrode structures of the semiconductor device in accordance with example embodiments may have steps disposed only at one side in the second direction D2, except for an upper portion of each of the gate electrode structures in which the third gate electrodes 756 are formed, and thus the semiconductor device may have an enhanced integration degree.

In example embodiments, in the semiconductor device, the first region I and the second region II may be disposed in the second direction D2 at each of opposite sides in the second direction D2 of the third region I, and the semiconductor device may be symmetric with reference to the third region I.

The first to third gate electrodes 752, 754 and 756 may be electrically connected to the pass transistors on the substrate 100 through the upper contact plugs 632, 662, 634, 664, 636 and 666 on the upper surfaces of the pads thereof, the upper wirings 712, 714 and 716, and the through vias 684 and 686 extending through the first insulation pattern structure 600 on the second region II of the substrate 100, however, the disclosure is not limited thereto.

For example, at least one of the first to third gate electrodes 752, 754 and 756 may be electrically connected to the pass transistors on the substrate 100 via a through contact plug, which may extend through the at least one of the first to third gate electrodes 752, 754 and 756, the gate electrode structure, the first insulation patterns 315, the support layer 300, the sacrificial layer structure 290, the CSP 240 and an upper portion of the second insulating interlayer 170 to contact lower wirings on the substrate 100.

The through contact plug may be electrically connected to only one of the first to third gate electrodes 752, 754 and 756, and an insulation pattern may be formed between the through contact plug and others of the first to third gate electrodes 752, 754 and 756, the support layer 300, CSP 240, etc., including a conductive material, such that the through contact plug may be electrically insulated therefrom.

FIGS. 5, 6, 7, 8, 9, 10, 11, 12, 13, 14, 15, 16, 17, 18, 19, 20, 21, 22, 23, 24, 25, 26, 27, 28, 29, 30, 31, 32, 33, 34 and 35 are diagrams illustrating a method of manufacturing a semiconductor device in accordance with example embodiments. Particularly, FIGS. 5, 8, 10, 16, 18, 27, 30 and 33 are plan views, and FIGS. 6-7, 9, 11-15, 17, 19-26, 28-29, 31-32 and 34-35 are cross-sectional views.

FIGS. 6-7, 9, 11, 13, 19, 23, 25, 28, 31 and 34 are cross-sectional views taken along lines A-A' of corresponding plan views, respectively, FIGS. 12, 14-15, 17, 20-22, 24, 26, 29, 32 and 35 are cross-sectional views taken along lines B-B' of corresponding plan views, respectively. FIGS. 6 to 35 are drawings of region X of FIG. 1, and FIG. 15 includes enlarged cross-sectional views of regions Y and Z, respectively, of FIG. 14.

Figure 5:
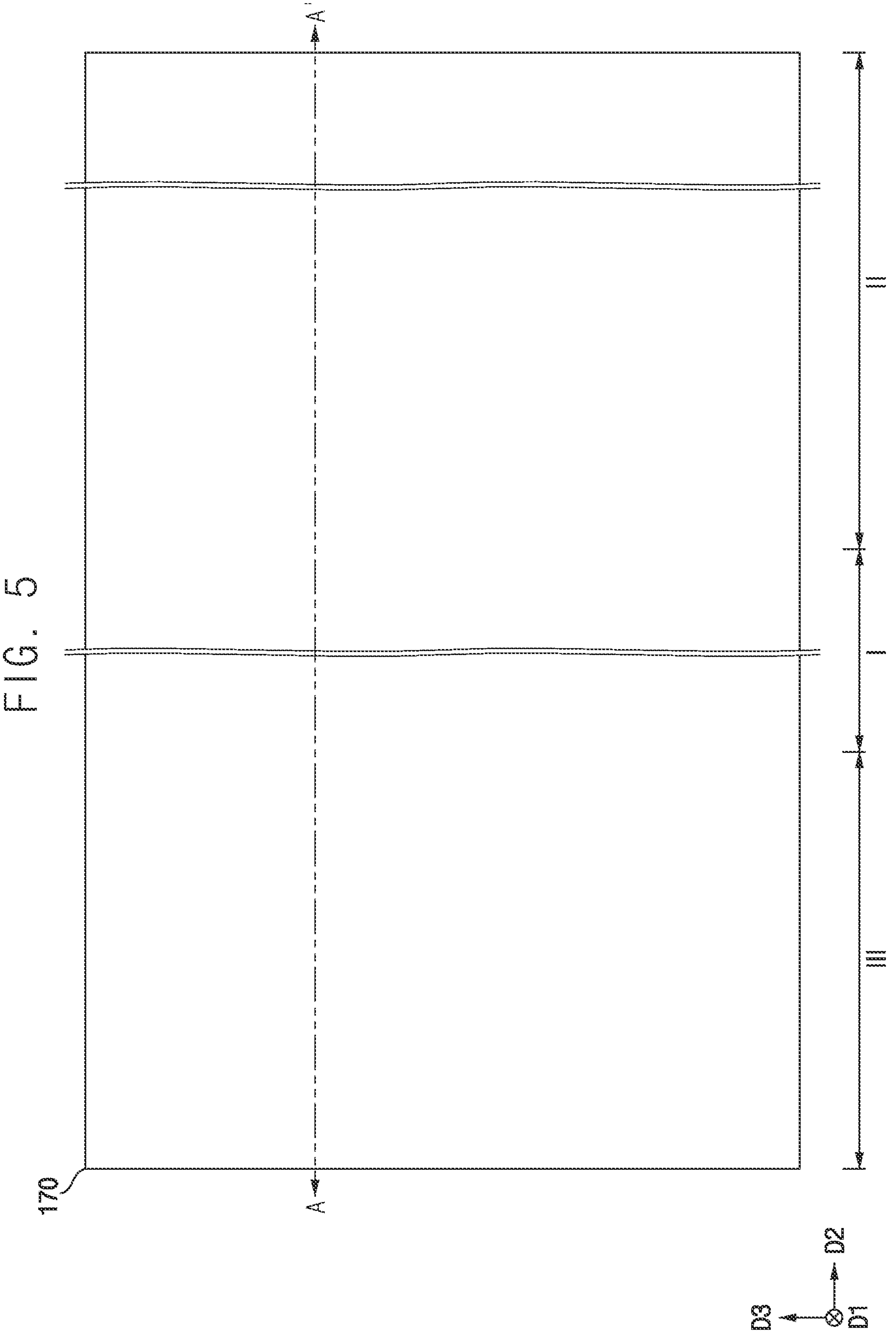
FIGS. 5, 6, 7, 8, 9, 10, 11, 12, 13, 14, 15, 16, 17, 18, 19, 20, 21, 22, 23, 24, 25, 26, 27, 28, 29, 30, 31, 32, 33, 34 and 35 are diagrams illustrating a method of manufacturing a semiconductor device in accordance with example embodiments.
Figure 6:
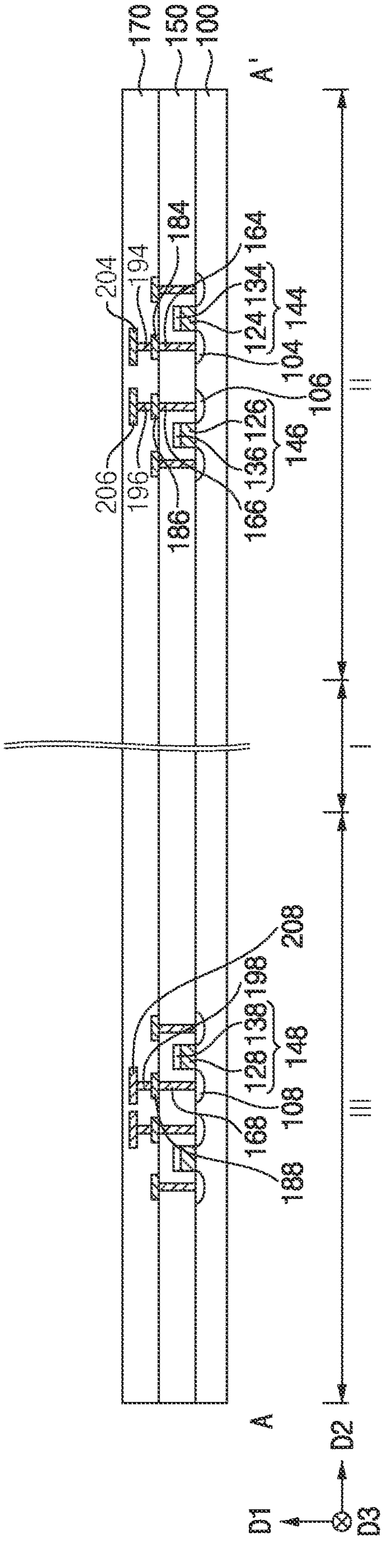

Referring to FIGS. 5 and 6, a lower circuit pattern may be formed on a substrate 100, and first and second insulating interlayers 150 and 170 may be sequentially formed on the substrate 100 to cover the lower circuit pattern.

Referring to FIGS. 5 and 6 together with FIG. 4, a first transistor may be formed on a first region I of the substrate 100, second and third transistors may be formed on a second region II of the substrate 100, and a fourth transistor may be formed on a third region III of the substrate 100.

A first insulating interlayer 150 may be formed on the substrate 100 to cover the first to fourth transistors, and first, second, third and fourth lower contact plugs 162, 164, 166 and 168 may extend through the first insulating interlayer 150 to contact first to fourth impurity regions 102, 104, 106 and 108, respectively.

First to eighth lower wirings 182, 184, 186, 188, 202, 204, 206 and 208, and first to fourth lower vias 192, 194, 196 and 198 may be formed on the first insulating interlayer 150, and a second insulating interlayer 170 may be formed on the first insulating interlayer 150.

The elements of the lower circuit pattern may be formed by a patterning process or a damascene process.

Figure 7:
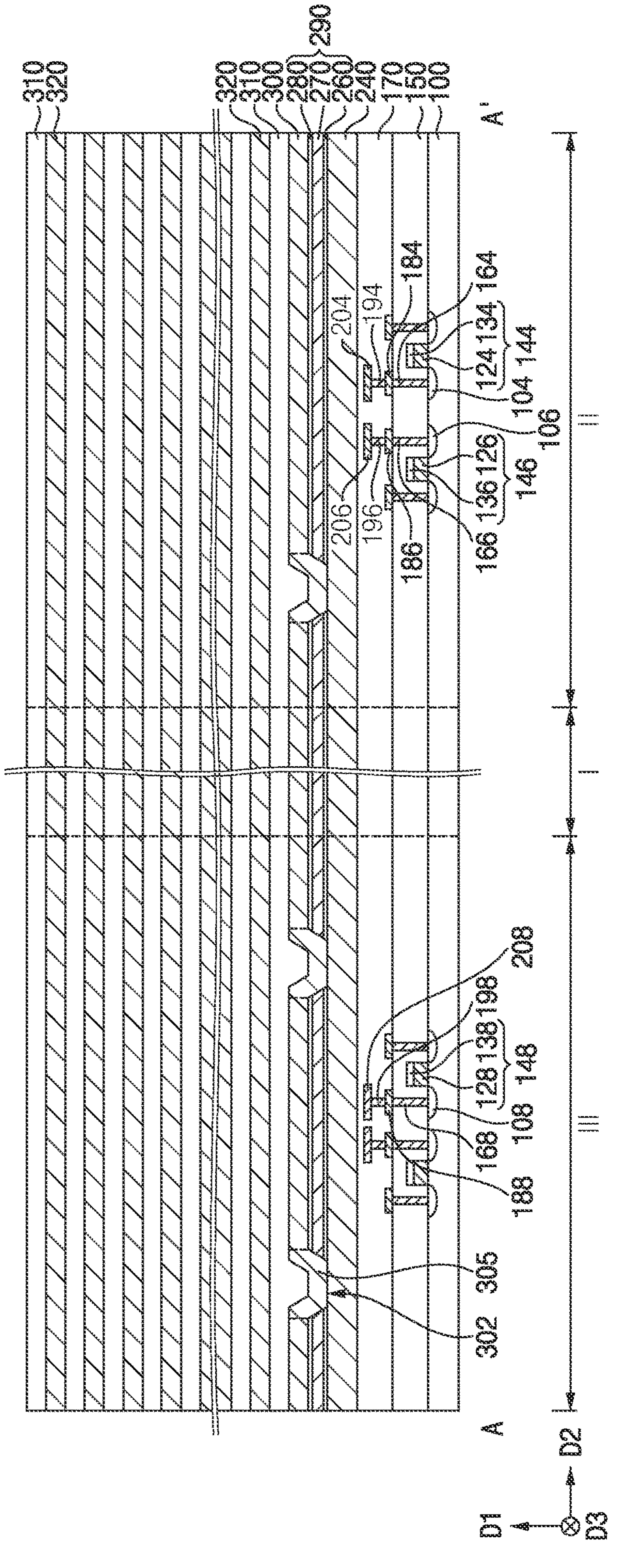

Referring to FIG. 7, a common source plate (CSP) 240 and a sacrificial layer structure 290 may be sequentially formed on the second insulating interlayer 170, a portion of the sacrificial layer structure 290 may be removed to form a first opening 302 exposing an upper surface of the CSP 240, and a support layer 300 may be formed an upper surface of the sacrificial layer structure 290 and the exposed upper surface of the CSP 240.

The sacrificial layer structure 290 may include first to third sacrificial layers 260, 270 and 280 which are sequentially stacked. Each of the first and third sacrificial layers 260 and 280 may include, for example, an oxide such as silicon oxide, and the second sacrificial layer 270 may include, for example, a nitride such as silicon nitride.

The first opening 302 may be formed in various layouts in a plan view. For example, a plurality of first openings 302 may be spaced apart from each other in the second and third directions D2 and D3 on the first region I of the substrate 100, the first opening 302 may extend in the third direction D3 on a portion of the second region II of the substrate 100 adjacent to the first region I of the substrate 100, and a plurality of first openings 302, each of which may extend in the third direction D3, may be spaced apart from each other in the second direction D2 on the third region III of the substrate 100.

The support layer 300 may include a material having an etch selectivity with respect to the first to third sacrificial layers 260, 270, and 280, for example, polysilicon doped with n-type impurities. The support layer 300 may be formed to have a constant thickness, and accordingly, a first recess may be formed on a portion of the support layer 300 in the first opening 302. Hereinafter, a portion of the support layer 300 in the first opening 302 may be referred to as a support pattern 305.

Insulation layers 310 and fourth sacrificial layers 320 may be alternately and repeatedly stacked in the first direction D1 on the support layer 300 and the support pattern 305, and accordingly, a mold layer including the insulation layers 310 and the fourth sacrificial layers 320 may be formed. The insulation layers 310 may include, for example, an oxide such as silicon oxide, and the fourth sacrificial layers 320 may include a material having an etch selectivity with respect to the insulation layer 310, for example, a nitride such as silicon nitride.

Referring to FIG. 7 together with FIG. 8, a first division pattern 330 may be further formed through a portion of a lowermost one of the fourth sacrificial layers 320. The first division pattern 330 may be formed on the second region II of the substrate 100. In example embodiments, a plurality of first division patterns 330 may be spaced apart from each other in each of the second and third directions D2 and D3.

Figure 9:
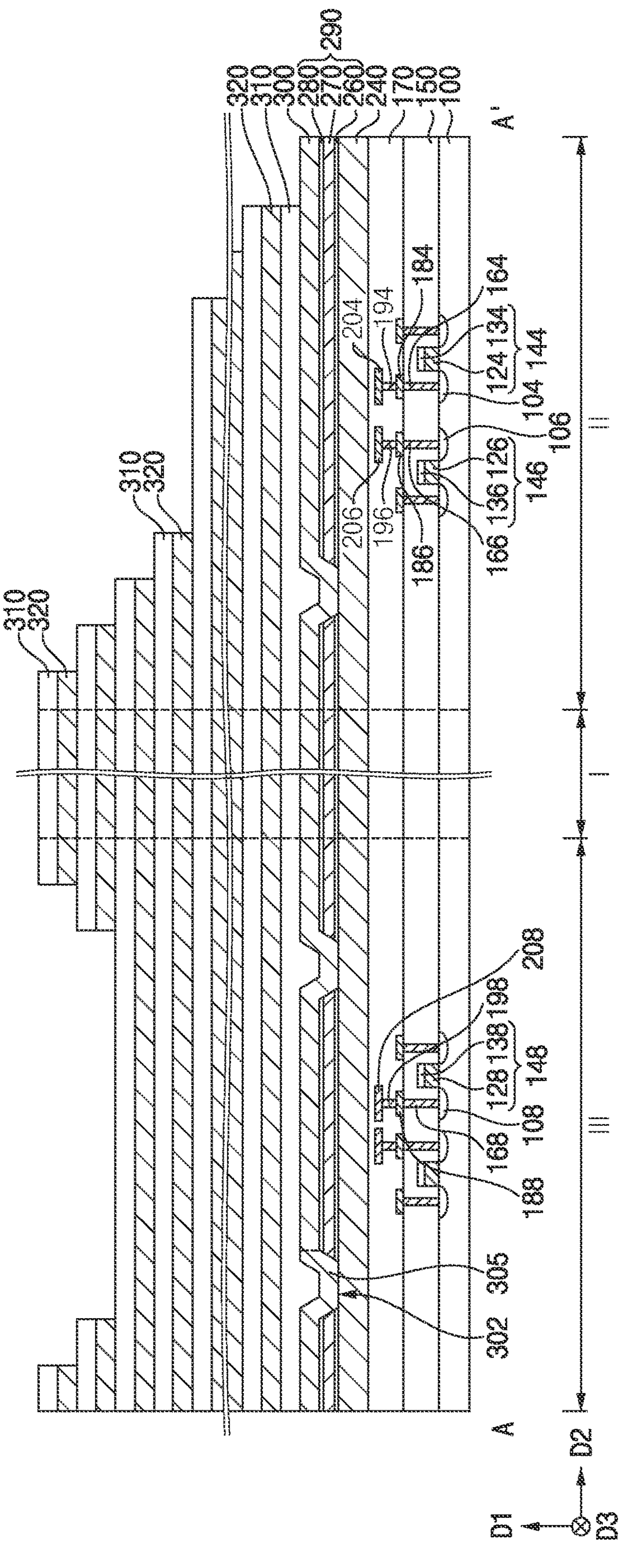

Referring to FIGS. 8 and 9, a first photoresist pattern may be formed on an uppermost insulation layer of the insulation layers 310 to partially cover the uppermost insulation layer of the insulation layers 310. The uppermost insulation layer of the insulation layers 310 and an uppermost sacrificial layer of the fourth sacrificial layers 320 may be etched using the first photoresist pattern as an etching mask. Thus, a portion of one of the insulation layers 310 directly under the uppermost sacrificial layer of the fourth sacrificial layers 320 may be exposed.

Referring to FIGS. 8 and 9 together with FIG. 1, the first photoresist pattern may cover the first region I of the substrate 100 at each of opposite sides in the second direction D2 of the third region III of the substrate 100, and edge portions of each of the second and third regions II and III of the substrate 100 adjacent to the first region I of the substrate 100 in the second direction D2.

After performing a trimming process for reducing an area of the first photoresist pattern, the uppermost insulation layer of the insulation layers 310, the uppermost sacrificial layer of the fourth sacrificial layers 320, the exposed insulation layer of the insulation layers 310, and one of the fourth sacrificial layers 320 directly under the exposed insulation layer of the insulation layers 310 may be etched using the reduced first photoresist pattern as an etching mask.

Thus, steps each of which may include one fourth sacrificial layer 320 and one insulation layer 310 sequentially stacked may be formed on each of the second and third regions II and III of the substrate 100. In example embodiments, the steps may be arranged in the second direction D2.

FIG. 9 shows the steps are formed at upper two levels, respectively, however, the disclosure is not limited thereto. Thus, for example, the steps may be formed only at an uppermost one level, or at upper three levels, respectively.

After removing the first photoresist pattern, a second photoresist pattern may be formed on and partially cover one of the insulation layers 310 at a third level from above. Referring to FIG. 9 together with FIG. 1, the second photoresist pattern may cover the third region III of the substrate 100, the first regions I of the substrate 100 at opposite sides, respectively, in the second direction D2 of the third region III of the substrate 100, and a portion of each of the second regions II of the substrate 100.

An etching process using the second photoresist pattern as an etching mask and a trimming process may be repeatedly performed to form steps each of which may include one fourth sacrificial layer 320 and an insulation layer 310 sequentially stacked on the second region II of the substrate 100. In an example embodiment, the steps may be arranged in the second direction D2. Alternatively, the steps may be arranged in the third direction D3 as well as in the second direction D2.

Hereinafter, a structure including the insulation layers 310 and the fourth sacrificial layers 320 alternately and repeatedly stacked on the sacrificial layer structure 290 in the first direction D1 and having a staircase shape may be referred to as a mold. The mold may have a staircase shape entirely on the second region II of the substrate 100, and may have a staircase shape at upper levels on the third region III of the substrate 100.

In example embodiments, lengths in the second direction D2 of the steps included in the mold may be constant except for some. The length of some of the steps in the second direction D2 may be greater than the length of other steps in the second direction D2. Hereinafter, steps having a relatively small length may be referred to as first steps, and steps having a relatively large length may be referred to as second steps. FIGS. 8 and 9 show one of the second steps. In each of the plan views after FIG. 8, the steps are indicated by dotted lines.

The mold may be formed on the support layer 300 and the support pattern 305 on the first to third regions I, II and III of the substrate 100, and a portion of an upper surface of an edge of the support layer 300 may not be covered but exposed by the mold.

Figure 10:
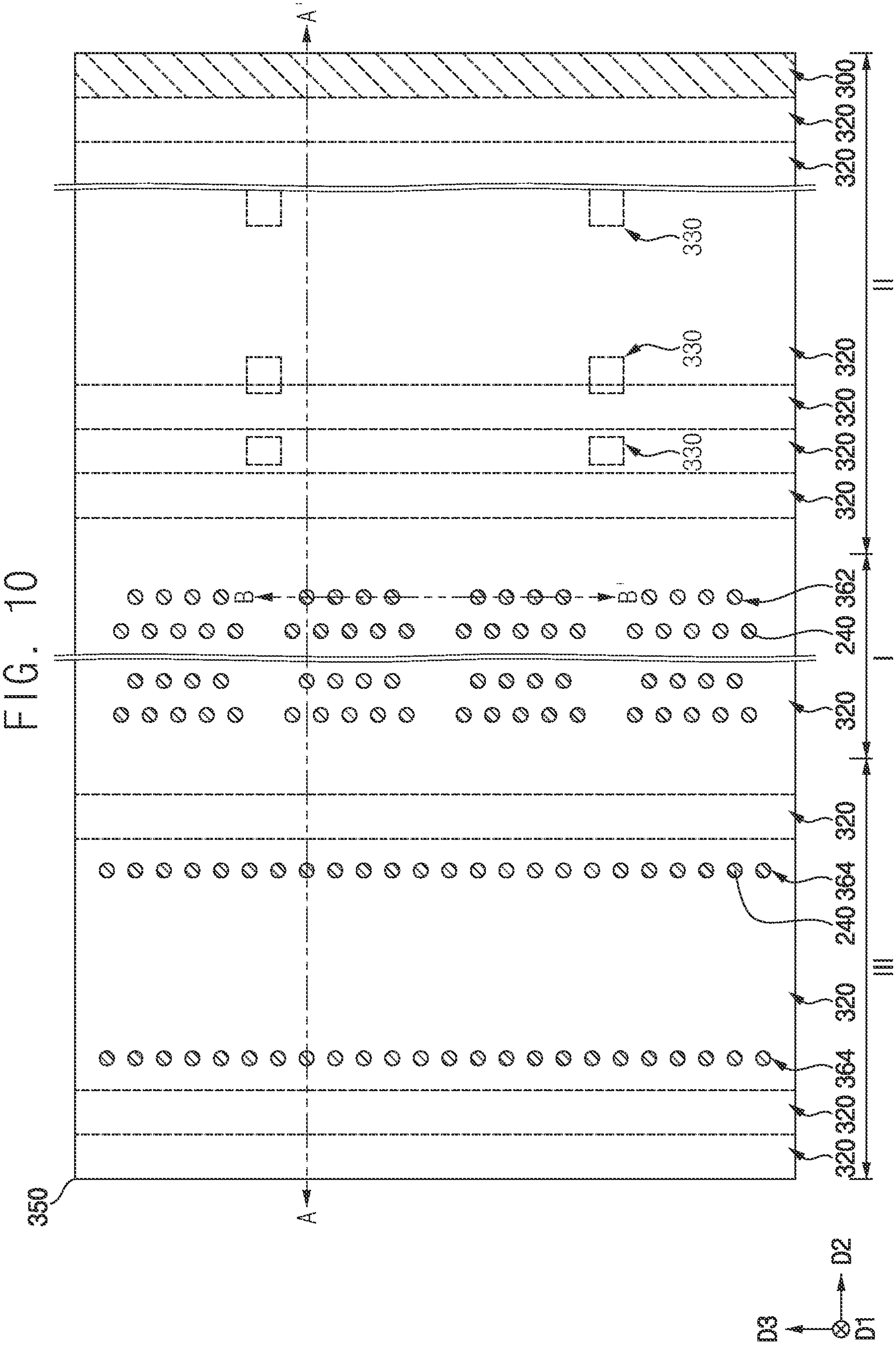
Figure 11:
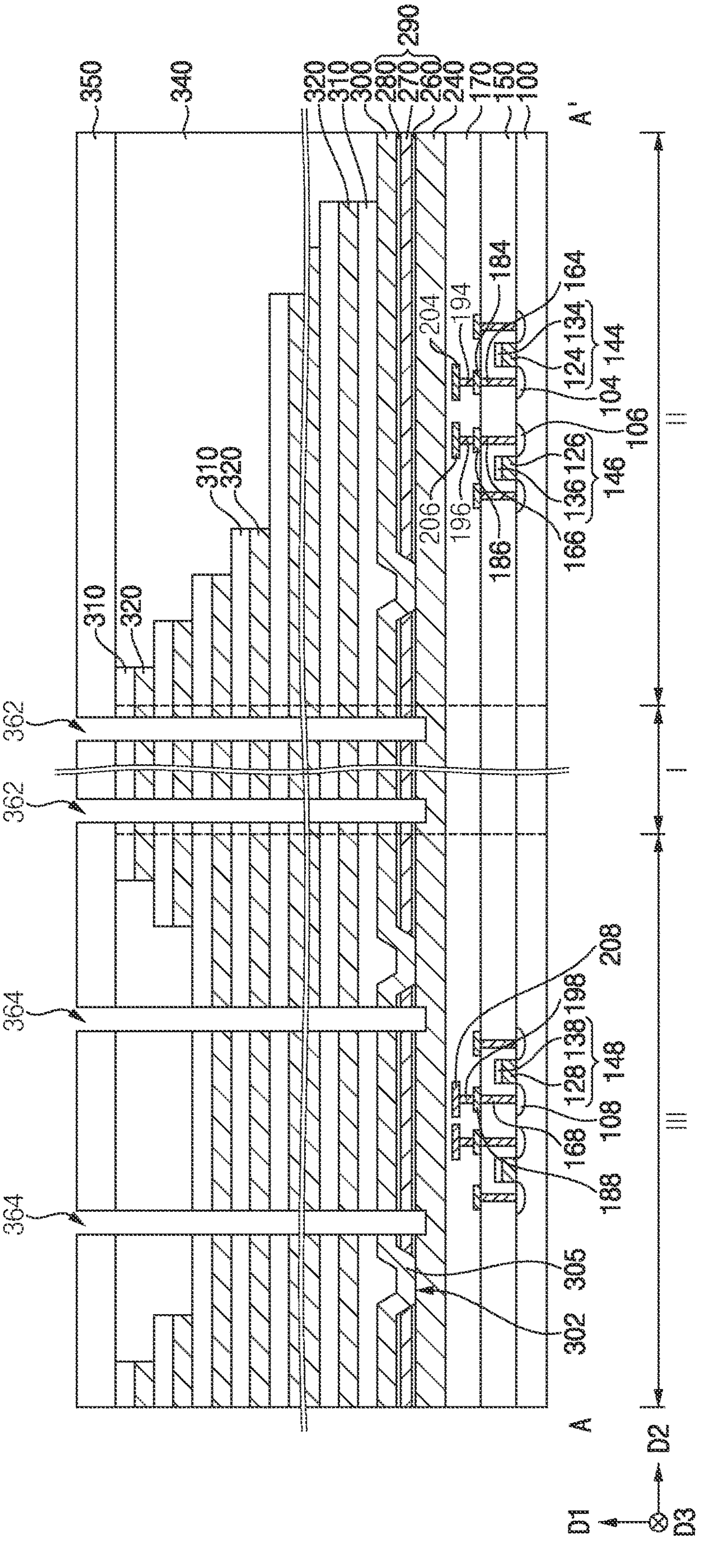
Figure 12:
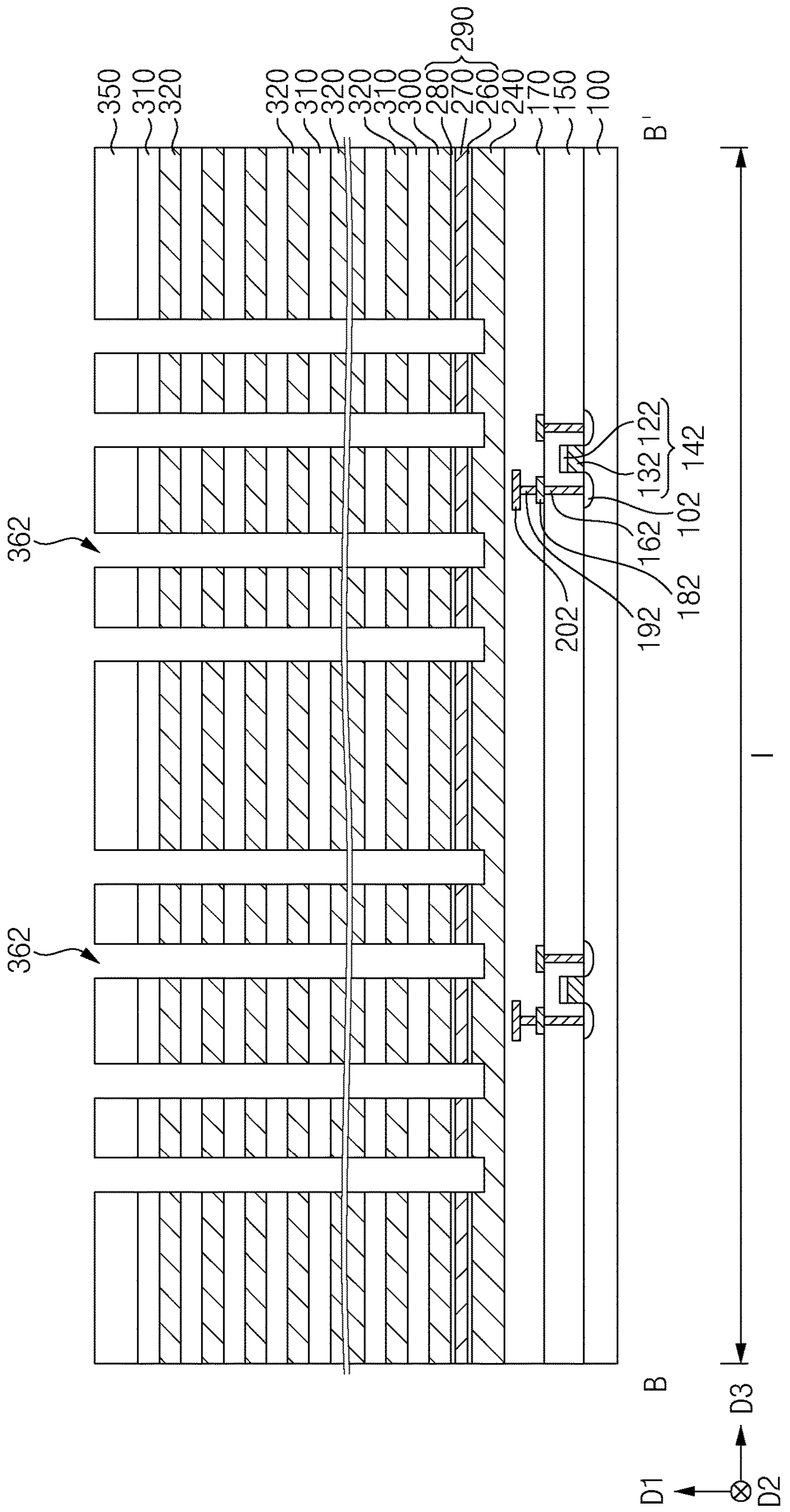

Referring to FIGS. 10 to 12, a third insulating interlayer 340 may be formed on the CSP 240 to cover the mold and the exposed upper surface of the support layer 300, and the third insulating interlayer 340 may be planarized until an upper surface of the uppermost insulation layer of the insulation layers 310 is exposed. Accordingly, a sidewall of the mold may be covered by the third insulating interlayer

340. A fourth insulating interlayer 350 may be formed on upper surfaces of the mold and the third insulating interlayer 340.

An etching process may be performed to form first and second channel holes 362 and 364 extending in the first direction D1 through the fourth insulating interlayer 350, the mold, the support layer 300 and the sacrificial layer structure 290 to expose an upper surface of the CSP 240 on the first and third regions I and III, respectively, of the substrate 100.

In example embodiments, a plurality of first channel holes 362 may be formed along the second and third directions D2 and D3 on the first region I of the substrate 100, and a plurality of second channel holes 364 may be formed along the second and third directions D2 and D3 on the third region III of the substrate 100.

FIGS. 10 and 12 show a second channel hole column including a plurality of second channel holes 364 disposed in the third direction D3 at each of opposite edge portions in the second direction D2 of the third region III of the substrate 100, however, the disclosure is not limited thereto. For example, a plurality of second channel hole columns, each of which may include a plurality of second channel holes 364 disposed in the third direction D3 at each of opposite edge portions in the second direction D2 of the third region III of the substrate 100, spaced apart from each other in the second direction D2.

Figure 13:
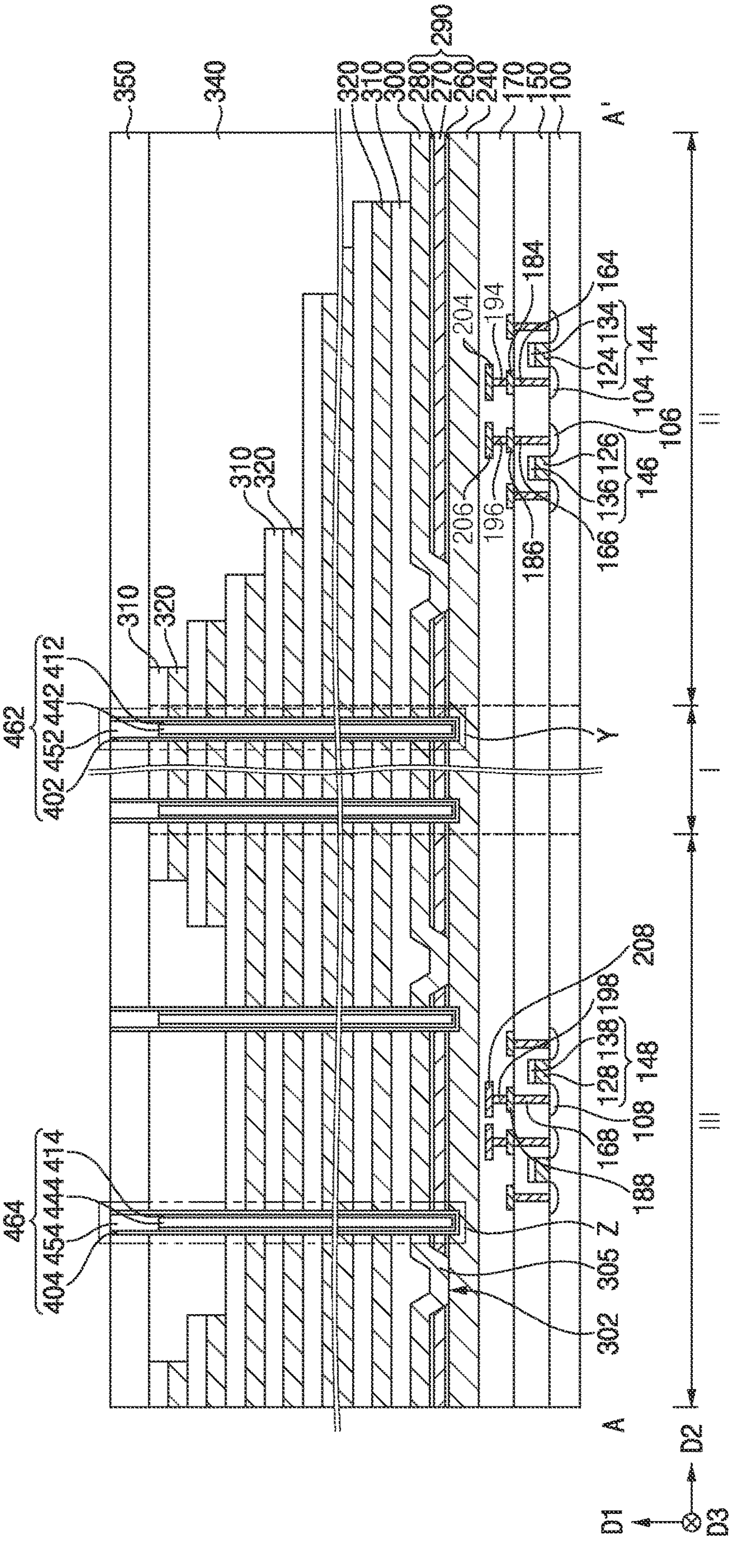
Figure 14:
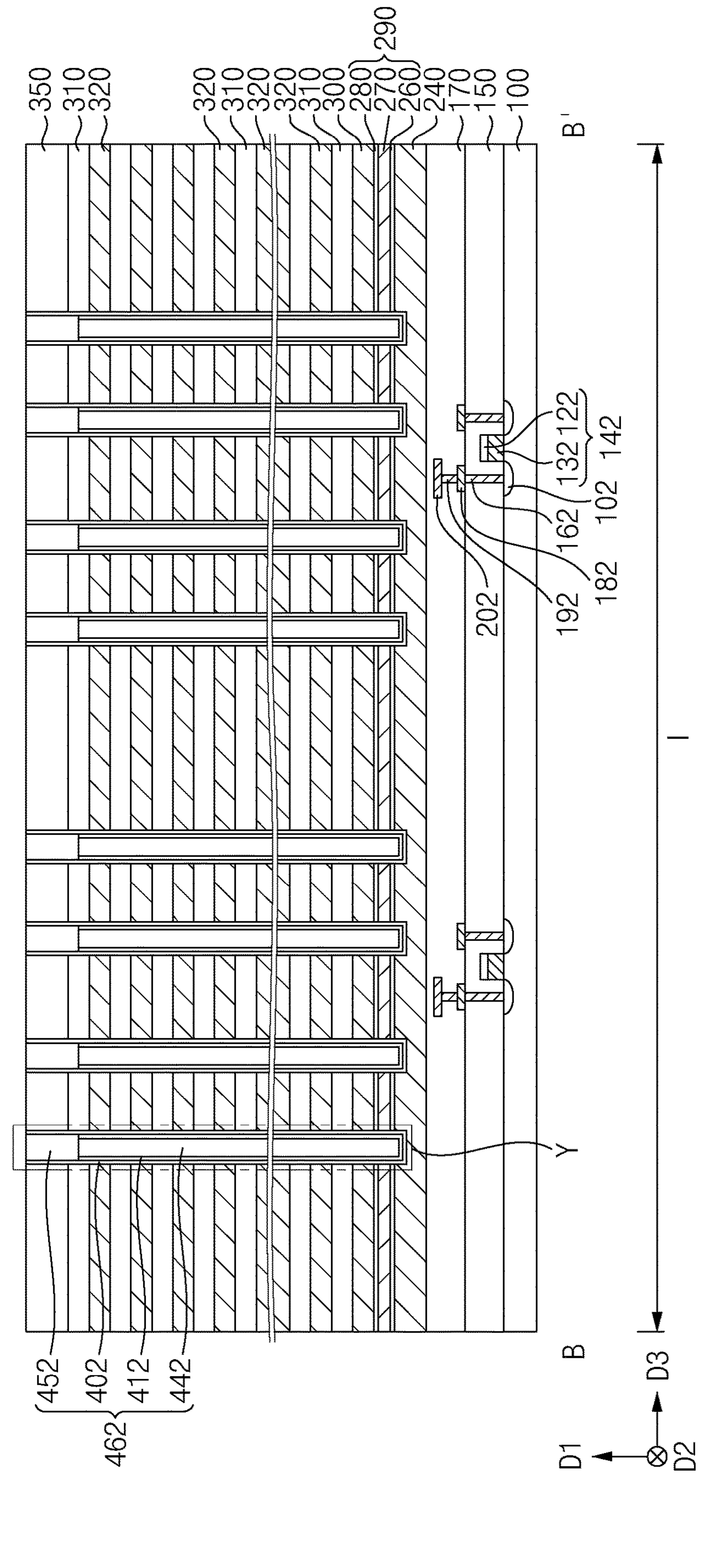

Referring to FIGS. 13 to 15, a charge storage structure layer and a channel layer may be sequentially formed on sidewalls of the first and second channel holes 362 and 364, the exposed upper surface of the CSP 240 and an upper surface of the fourth insulating interlayer 350, and a filling layer may be formed on the channel layer to sufficiently fill a remaining portion of the first and second channel holes 362 and 364.

The charge storage structure layer may include a first blocking layer, a charge storage layer and a tunnel insulation layer which are sequentially stacked.

The filling layer, the channel layer, and the charge storage structure layer may be planarized until the upper surface of the fourth insulating interlayer 350 is exposed. Thus, a charge storage structure 402, a channel 412 and a first filling pattern 442 may be formed in the first channel hole 362, and a dummy charge storage structure 404, a dummy channel 414 and a second filling pattern 444 may be formed in the second channel hole 364. The charge storage structure 402 may include a first blocking pattern 372, a charge storage pattern 382 and a tunnel insulation pattern 392 that are sequentially stacked, and the dummy charge storage structure 404 may include a first dummy blocking pattern 374, a dummy charge storage pattern 384 and a dummy tunnel insulation pattern 394 that are sequentially stacked.

Upper portions of the first filling pattern 442 and the channel 412 may be removed to form a second recess, and upper portions of the second filling pattern 444 and the dummy channel 414 may be removed to form a third recess. First and second capping patterns 452 and 454 may be formed to fill the second and third recesses, respectively.

The charge storage structure 402, the channel 412, the first filling pattern 442 and the first capping pattern 452 in the first channel hole 362 may collectively form a memory channel structure 462, and the dummy charge storage structure 404, the dummy channel 414, the second filling pattern 444 and the second capping pattern 454 in the second channel hole 364 may collectively form a dummy memory channel structure 464. The dummy memory channel structure 464 may also be referred to as a support structure 464.

In example embodiments, a plurality of memory channel structures 462 may be spaced apart from each other in the second and third directions D2 and D3 on the first region I of the substrate 100 to form a memory channel array, and a plurality of support structures 464 may be spaced apart from each other in the second and third directions D2 and D3 on the third region III of the substrate 100 to form a support structure array.

The support structure array may include a plurality of support structure columns, each of which may include a plurality of support structures 464 disposed in the third direction D3 at each of edge portions in the second direction D2 of the third region III of the substrate 100, spaced apart from each other in the second direction D2.

Figure 16:
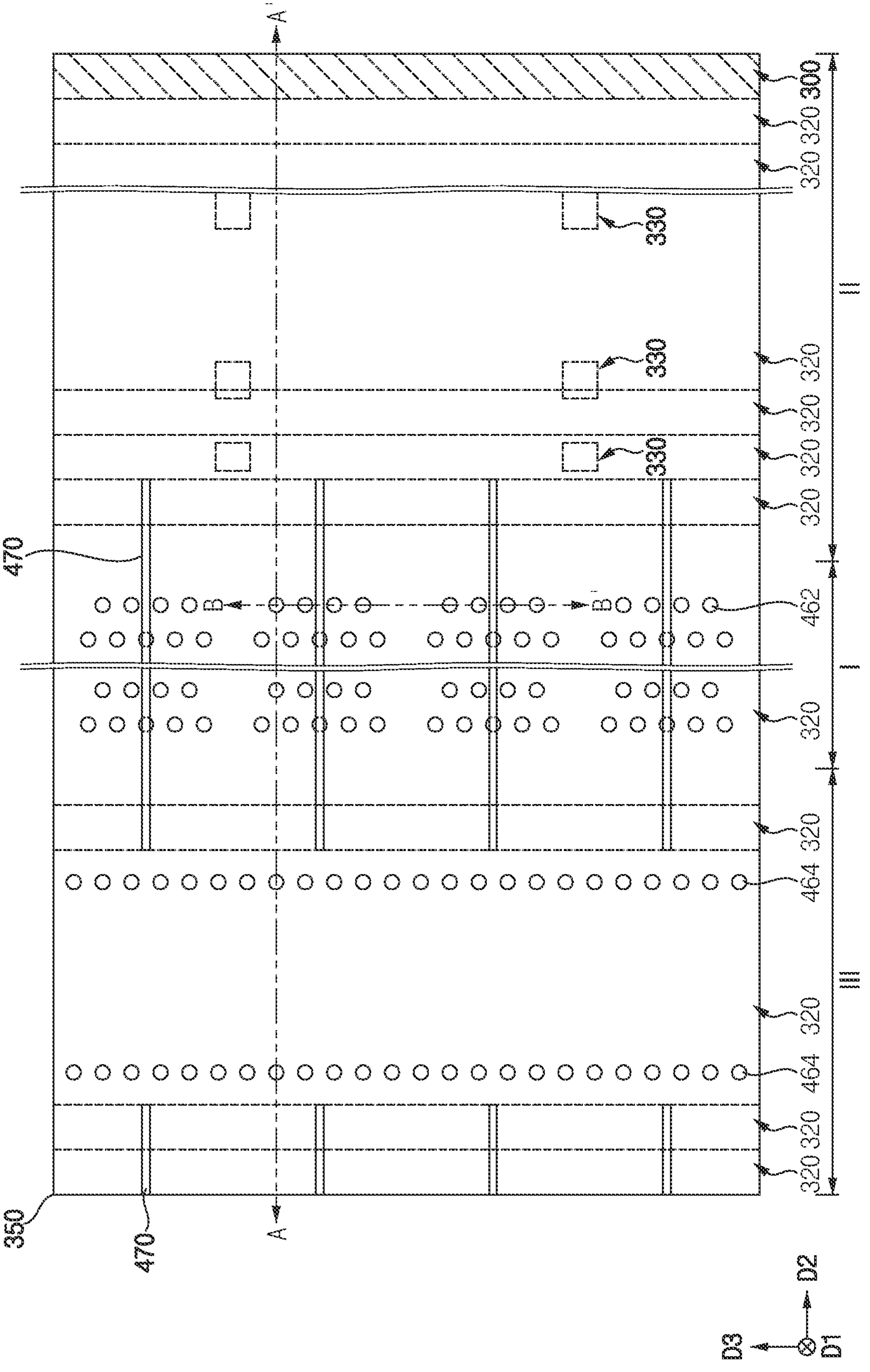
Figure 17:
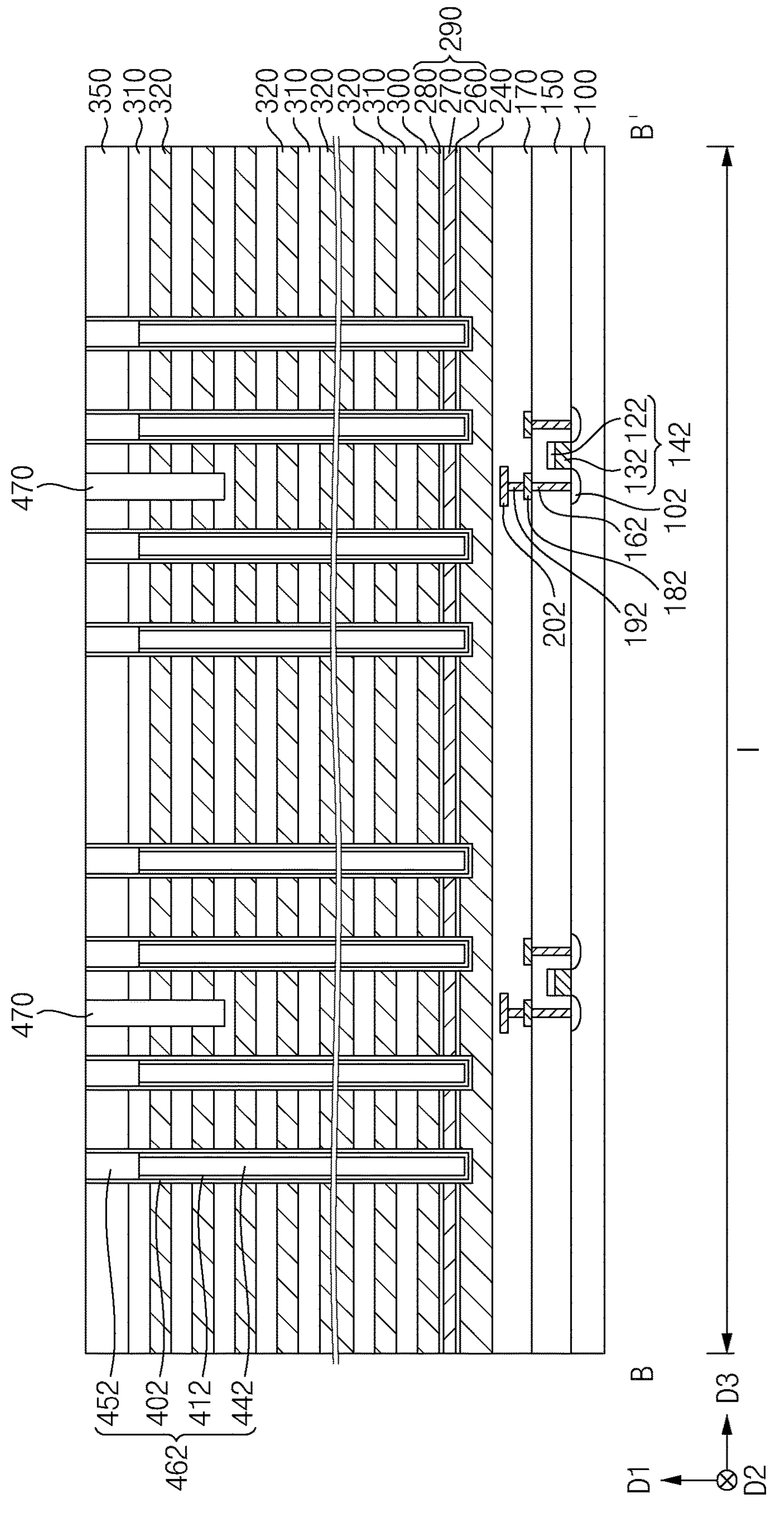

Referring to FIGS. 16 and 17, the fourth insulating interlayer 350, a number of the insulation layers 310 and the fourth sacrificial layers 320 may be etched to form a second opening extending in the second direction D2 through the fourth insulating interlayer 350 and the number of the insulation layers 310 and the fourth sacrificial layers 320, and a second division pattern 470 may be formed to fill the second opening.

In an example embodiment, the second division pattern 470 may extend through an upper portion of the memory channel structure 462. The second division pattern 470 may extend not only through the upper portion of the memory channel structure 462, but also through the fourth insulating interlayer 350, the fourth sacrificial layers 320 at upper two levels, respectively, and the insulation layers 310 at the upper two levels, respectively, and may extend partially through one of the insulation layers 310 at a third level from above. The second division pattern 470 may extend in the second direction D2 on the first region I of the substrate 100 and an edge portion of the third region III of the substrate 100 adjacent to the first region I in the second direction D2, and may extend through, for example, upper two steps in the mold. Accordingly, the fourth sacrificial layers 320 at the upper two levels may be divided in the third direction D3 by the second division pattern 470.

Figure 18:
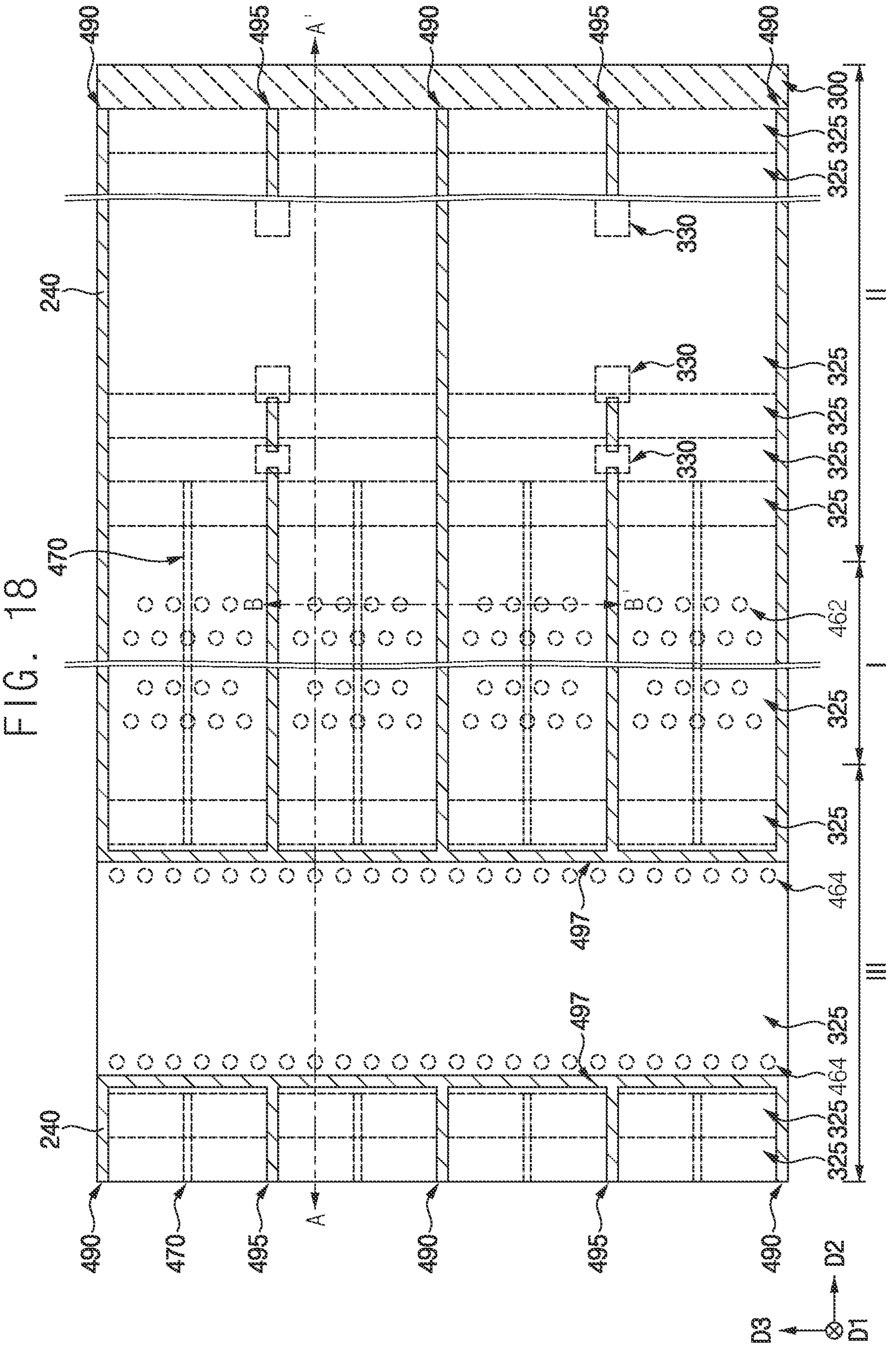
Figure 19:
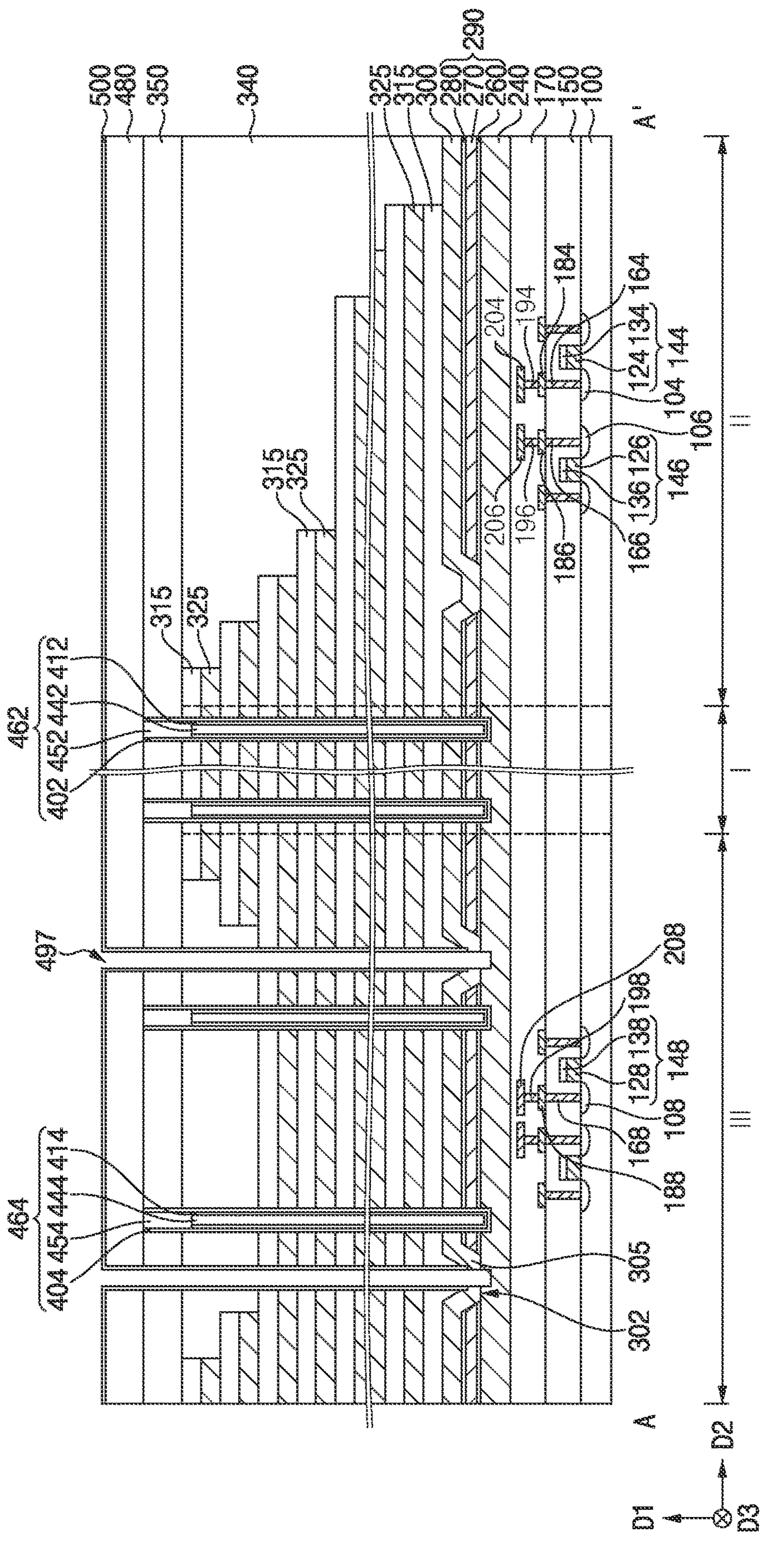
Figure 20:
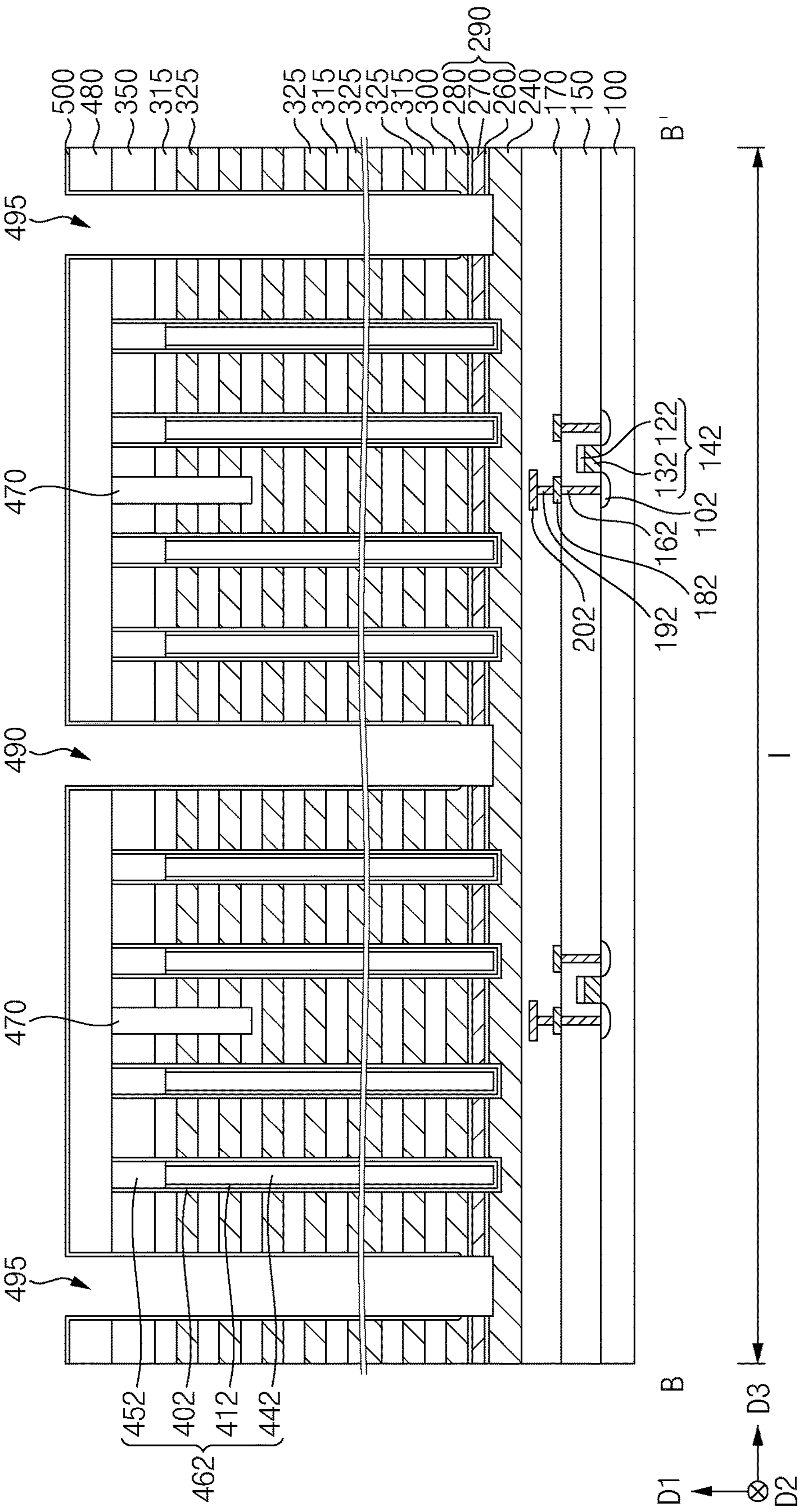

Referring to FIGS. 18 to 20, a fifth insulating interlayer 480 may be formed on the fourth insulating interlayer 350, the memory channel structure 462, the support structure 464 and the second division pattern 470, and third to fifth openings 490, 495 and 497 extending through the third to fifth insulating interlayers 340, 350 and 480 and the mold may be formed by an etching process.

In example embodiments, the third opening 490 may extend in the second direction D2 on the first and second regions I and II of the substrate 100 and an edge portion of the third region III of the substrate 100 adjacent to the first region I of the substrate 100 in the second direction D2, to end portions in the second direction D2 of the steps of the mold on the second region II of the substrate 100 and to end portions in the second direction D2 of the steps of the mold on the third region III of the substrate 100. A plurality of third openings 490 may be spaced apart from each other in the third direction D3. Accordingly, the mold may be divided into a plurality of parts spaced apart from each other in the third direction D3 by the third openings 490. As the third opening 490 is formed, the insulation layers 310 and the fourth sacrificial layers 320 included in the mold may be divided into first insulation patterns 315 and fourth sacrificial patterns 325, respectively, each of which may extend in the second direction D2.

In example embodiments, the fourth opening 495 may continuously extend in the second direction D2 on the first region I of the substrate 100 and an end portion of the third region III of the substrate 100 adjacent to the first region I of the substrate 100 in the second direction D2. However, the fourth openings 495 may be spaced apart from each other in second directions D2 on the second region II of the substrate 100.

The fourth openings 495 spaced apart from each other in the second direction D2 may be disposed between the third openings 490 adjacent to each other in the third direction D3. However, unlike the third openings 490 extending to the end portions of the molds on the second region II of the substrate 100 in the second direction D2, the fourth openings 495 may be spaced apart from each other in the second direction D2 on the second region II of the substrate 100, and thus the mold may not be entirely separated by the fourth opening 495. In example embodiments, each part of the mold between the fourth openings 495 spaced apart from each other in the second direction D2 may at least partially overlap the first division pattern 330 in the first direction D1.

In example embodiments, each of the fourth openings 495 may continuously extend in the second direction D2 on the first region I of the substrate 100, in the end portion of the third region III of the substrate 100 adjacent to the first region I of the substrate 100 in the second direction D2 and in the end portion of the second region II of the substrate 100 adjacent to the first region I of the substrate 100 in the second direction D2. Each of the fourth openings 495 may continuously extend, for example, to opposite end portions of the steps at the upper two levels in the mold. Accordingly, for example, the fourth sacrificial patterns 325 at the upper two levels, respectively, of the mold may be spaced apart from each other in the third direction D3 by the fourth opening 495 and the second division patterns 470 at opposite sides, respectively, in the second direction D2 of the fourth opening 495.

In example embodiments, the fifth opening 497 may extend in the third direction D3 on each of opposite edge portions in the second direction D2 of the third region III of the substrate 100, and may be connected to end portions of the third and fourth openings 490 and 495. Each of the fifth openings 497 may be spaced apart in the second direction D2 from the steps on each of opposite edge portions of the third region III of the substrate 100.

FIGS. 18 and 19 show that each of the fifth openings 497 is disposed between the support structures 464 and the steps. However, the disclosure is not limited thereto. For example, each of the fifth openings 497 may be disposed between the support structure columns included in the support structure array. In this case, the support structures 464 may be disposed between the fifth openings 497 and the steps.

The mold may be divided in the third direction D3 on the first and second regions I and II of the substrate 100, and may be divided in the second direction D2 on the third region III of the substrate 100 by the etching process for forming the third to fifth openings 490, 495 and 497. However, the mold may not lean or collapse due to the support structures 464 and the memory channel structures 462.

In example embodiments, the etching process may be performed until the third to fifth openings 490, 495 and 497 expose an upper surface of the support layer 300 or an upper surface of the support pattern 305, and the third to fifth openings 490, 495 and 497 may further extend through an upper portion of the support layer 300 or an upper portion of the support pattern 305.

A spacer layer may be formed on sidewalls of the third to fifth openings 490, 495 and 497 and on the fifth insulating interlayer 480, and portions of the spacer layer on bottoms of the third to fifth openings 490, 495 and 497 may be removed by an anisotropic etching process to form a spacer 500. Accordingly, the upper surface of the support layer 300 or the upper surface of the support pattern 305 may be partially exposed.

Each of the third to fifth openings 490, 495 and 497 may be enlarged downwardly by removing the exposed portion of the support layer 300 or the support pattern 305, and a portion of the sacrificial layer structure 290 thereunder. Accordingly, each of the third to fifth openings 490, 495 and 497 may expose the upper surface of the CSP 240, and further extend through an upper portion of the CSP 240.

In example embodiments, the spacer 500 may include, for example, undoped polysilicon. The spacer 500 may cover the sidewalls of the third to fifth openings 490, 495 and 497 when the sacrificial layer structure 290 is partially removed, and thus the first insulation patterns 315 and the fourth sacrificial patterns 325 of the mold may not be removed.

Figure 21:
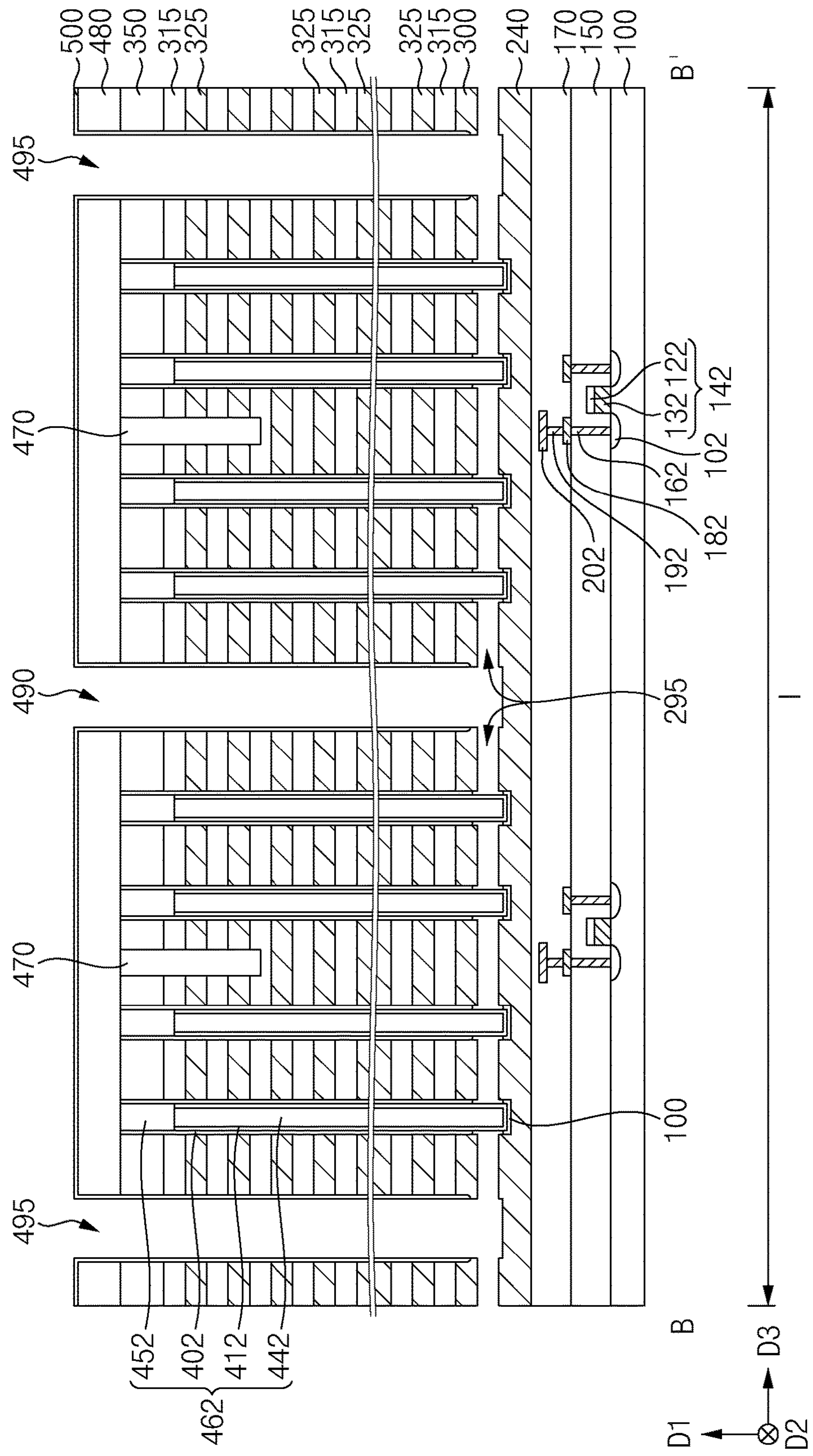

Referring to FIG. 21, the sacrificial layer structure 290 may be removed through the third to fifth openings 490, 495 and 497, for example, by a wet etching process to form a first gap 295.

The wet etching process may be performed using, for example, hydrofluoric acid (HF) and/or phosphoric acid ($H_3PO_4$). In example embodiments, each of the third to fifth openings 490, 495 and 497 on some portions of the second and third regions II and III of the substrate 100 may extend through the support pattern 305 instead of extending through the support layer 300 and the sacrificial layer structure 290 thereunder. Accordingly, a portion of the sacrificial layer structure 290 on the second and third regions III of the substrate 100 may not be removed by the wet etching process.

As the first gap 295 is formed, a lower surface of the support layer 300 and the upper surface of the CSP 240 may be exposed. In addition, a portion of an outer sidewall of the charge storage structure 402 may be exposed by the first gap 295, and the exposed outer sidewall of the charge storage structure 402 may also be removed during the wet etching process to expose an outer sidewall of the channel 412. Accordingly, the charge storage structure 402 may be divided into two parts. That is, an upper portion of the charge storage structure 402 may extend through the mold to cover most of the outer sidewall of the channel 412, and a lower portion of the charge storage structure 402 may be formed on the CSP 240 to cover a bottom surface of the channel 412.

Figure 22:
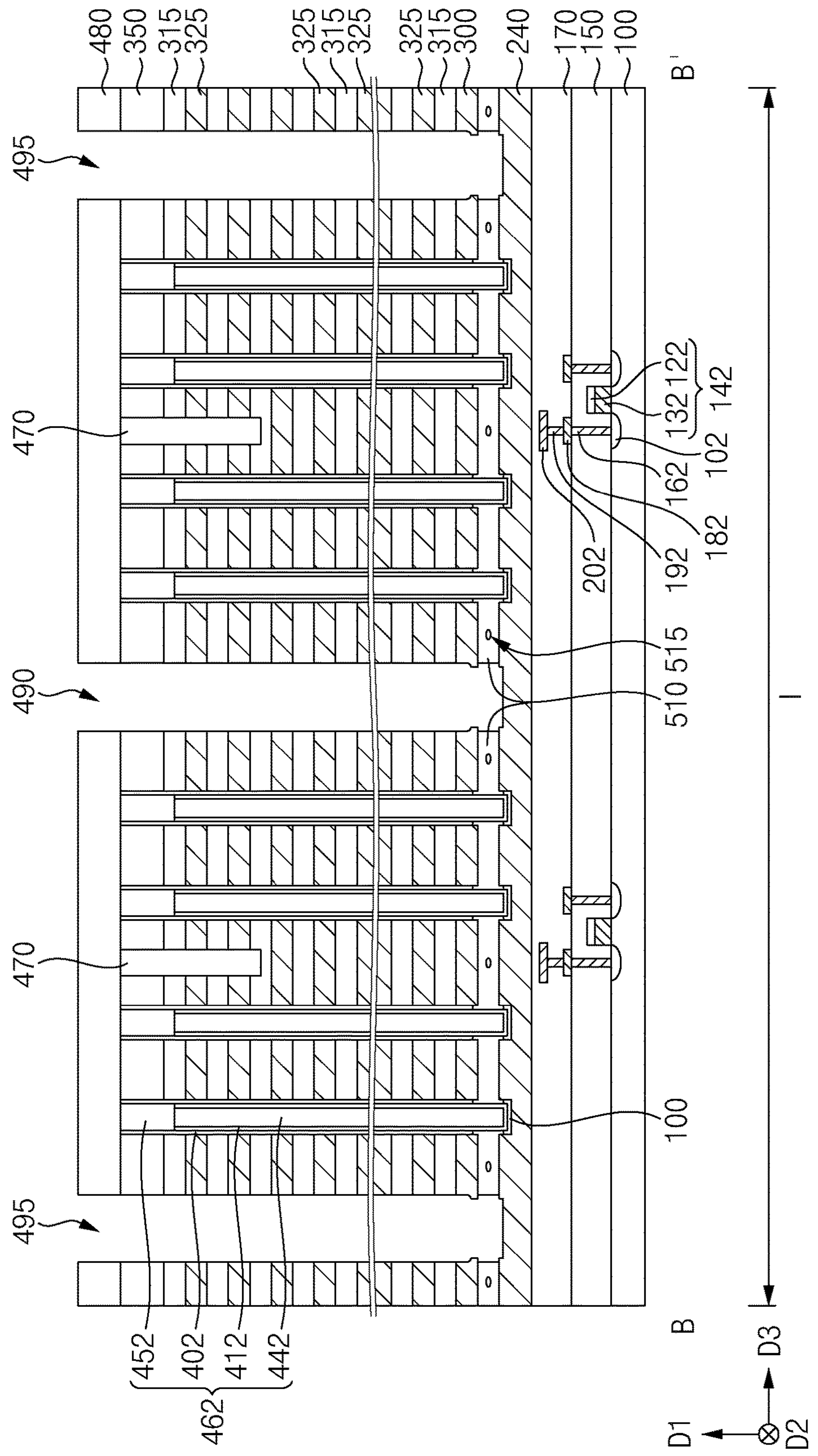

Referring to FIG. 22, the spacer 500 may be removed, and a channel connection layer may be formed on the sidewalls of the third to fifth openings 490, 495 and 497 and in the first gap 295. Portions of the channel connection layer in the third to fifth openings 490, 495 and 497 may be removed by an etch back process to form a channel connection pattern 510.

As the channel connection pattern 510 is formed, channels of a plurality of channels 412 between the third and fourth openings 490 and 495 adjacent to each other in the third direction D3 may be connected to each other.

In an example embodiment, an air gap 515 may be formed in the channel connection pattern 510.

Figure 23:
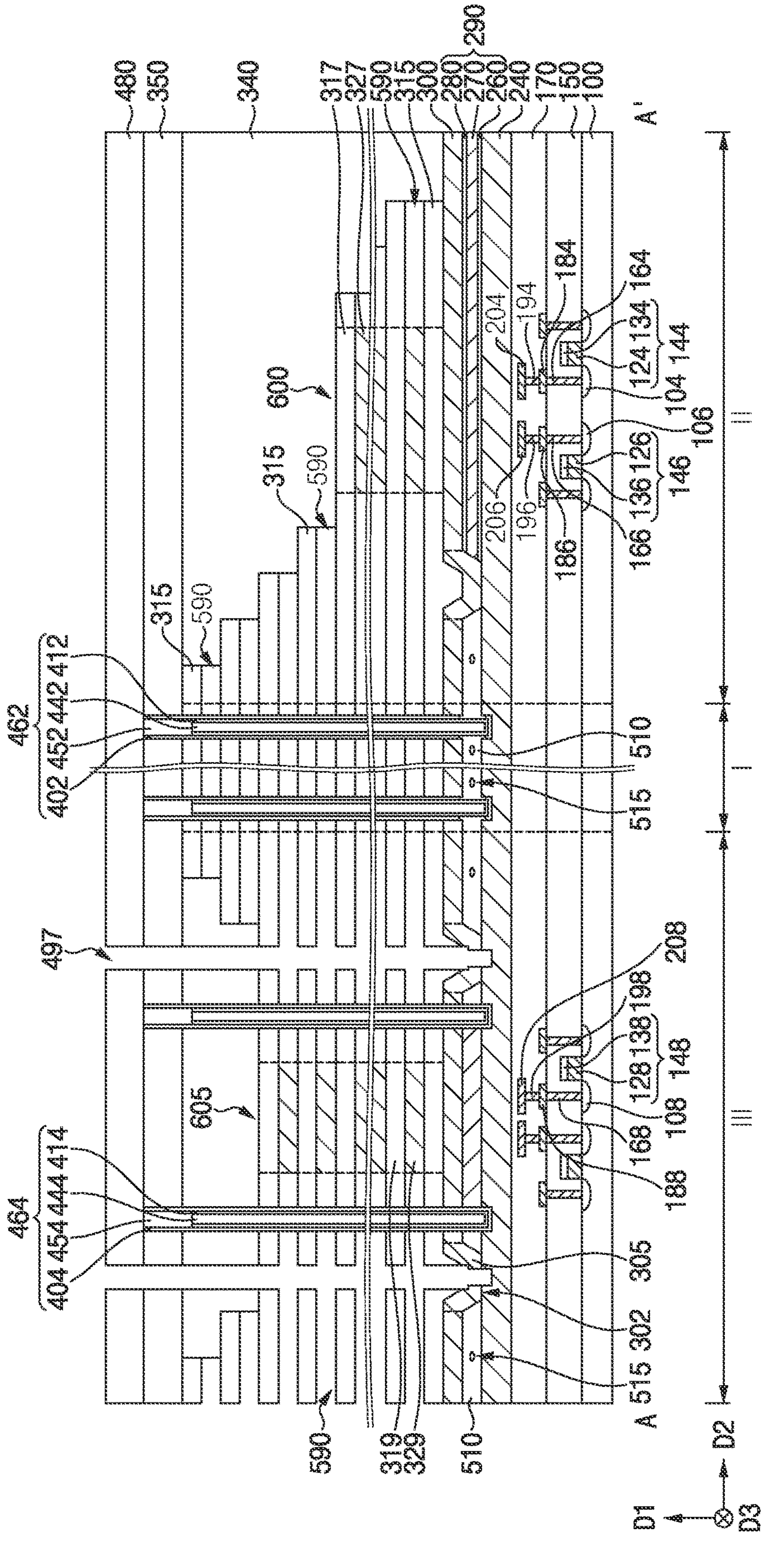
Figure 24:
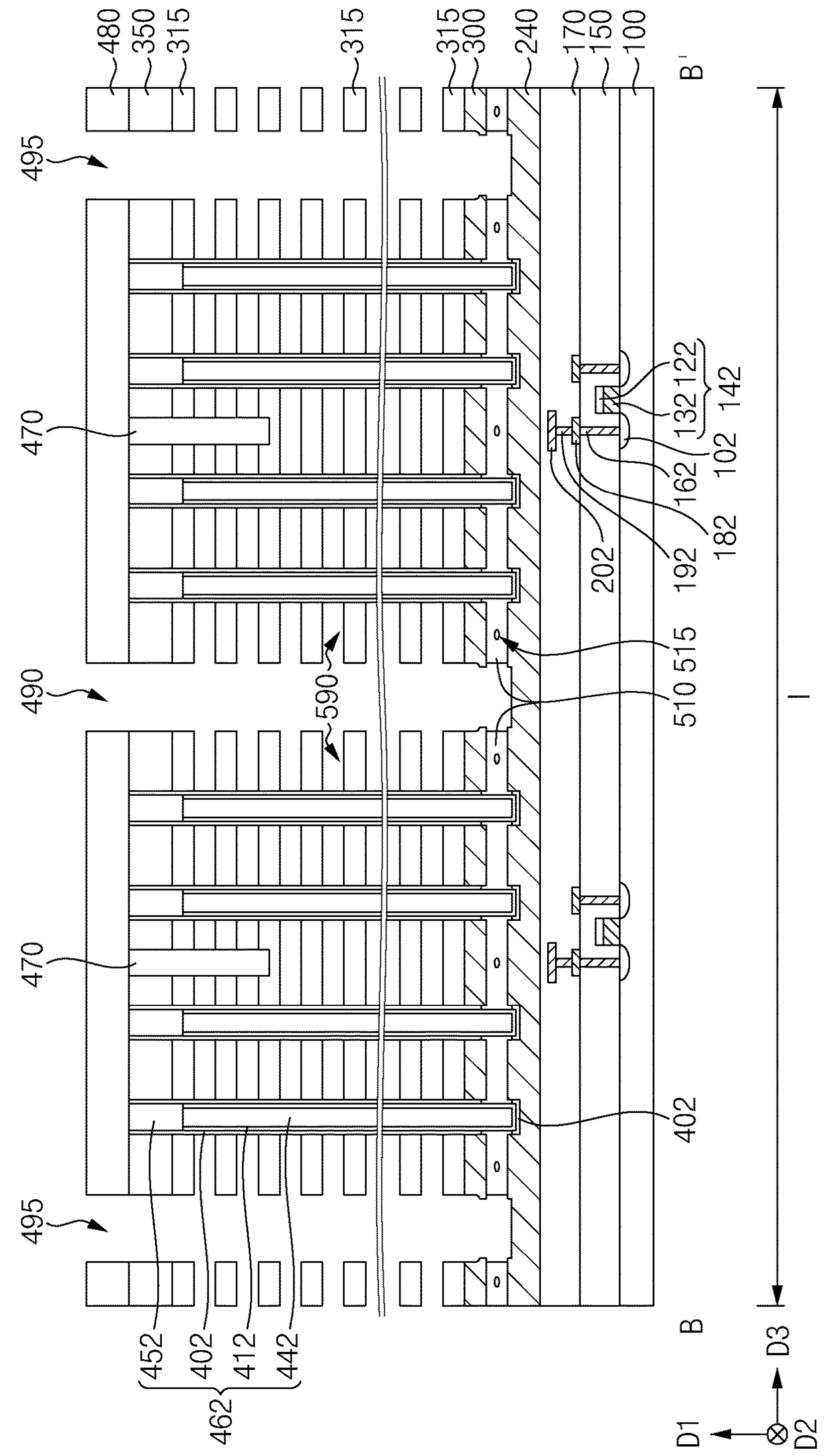

Referring to FIGS. 23 and 24, the fourth sacrificial patterns 325 exposed by the third to fifth openings 490, 495 and 497 may be removed to form a second gap 590 between the first insulation patterns 315 at respective levels, and a portion of the outer sidewall of the charge storage structure 402 included in the memory channel structure 462 and a portion of an outer sidewall of the dummy charge storage structure 404 may be exposed by the second gap 590.

In example embodiments, the fourth sacrificial patterns 325 may be removed by a wet etching process using an etching solution including, for example, $H_3PO_4$ or $H_2SO_4$.

The wet etching process may be performed through the third to fifth openings 490, 495 and 497. Thus, a portion of the fourth sacrificial pattern 325 between adjacent third and fourth openings 490 and 495 on the first region I of the substrate 100 may be entirely removed by an etching solution, which may be provided from both of the third and fourth openings 490.

However, if the fourth opening 495 is not formed between the third openings 490 on the second region II of the substrate 100, a portion of the fourth sacrificial pattern 325 between adjacent openings of the third openings 490 on the second region II of the substrate 100 may not be entirely removed by an etching solution, which may be provided only from the third openings 490. A remaining portion of the fourth sacrificial pattern 325 on the second region II of the substrate 100 may be referred to as a third insulation pattern 327. Additionally, a portion of the first insulation pattern 315 overlapping the third insulation pattern 327 in the first direction D1 may be referred to as a second insulation pattern 317. The second and third insulation patterns 317 and 327 alternately and repeatedly stacked in the first direction D1 may form a first insulation pattern structure 600.

That is, the first insulation pattern structure 600 may extend through a portion of the mold on the second region II of the substrate 100, and may have a shape of, for example, a rectangle, an ellipse, a circle, etc., in a plan view. In example embodiments, the first insulation pattern structure 600 may extend through the second step having a relatively large length in the second direction D2 of the mold.

A distance between adjacent openings of the fifth openings 497 in the second direction D2 on the third region III of the substrate 100 is large such that the fourth sacrificial pattern 325 may not be entirely removed by an etching solution provided from the fifth openings 497 in the second direction D2. Thus, the fourth sacrificial pattern 325 may partially remain on the third region III of the substrate 100, which may be referred to as a fifth insulation pattern 329. Additionally, a portion of the first insulation pattern 315 overlapping the fourth insulation pattern 319 in the first direction D1 may be referred to as a fourth insulation pattern 319. The fourth and fifth insulation patterns 319 and 329 alternately and repeatedly stacked in the first direction D1 may form a second insulation pattern structure 605.

The second insulation pattern structure 605 may extend through a portion of the mold on the third region III of the substrate 100, and may have a shape of, e.g., a rectangle in a plan view.

Figure 25:
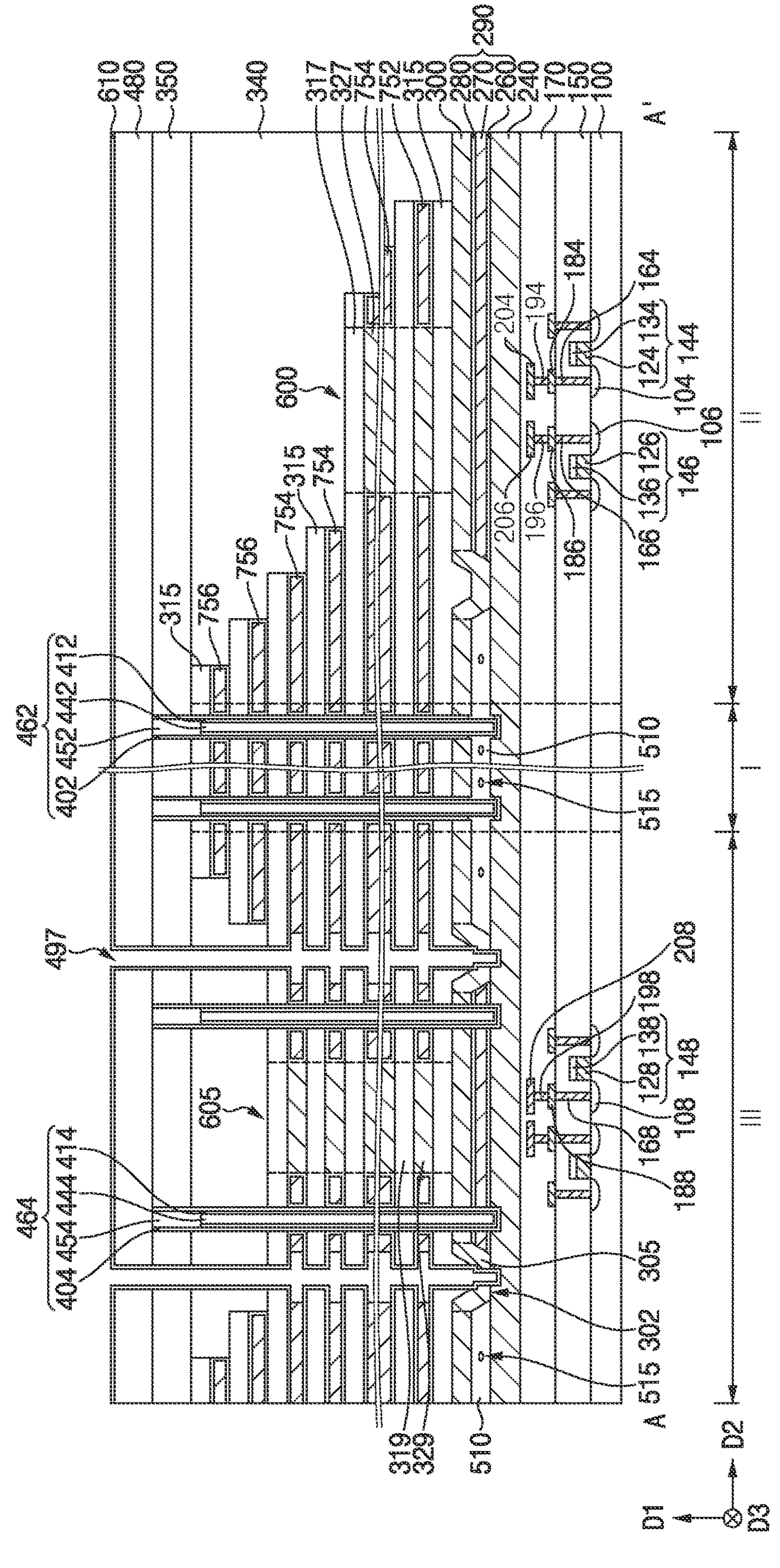
Figure 26:
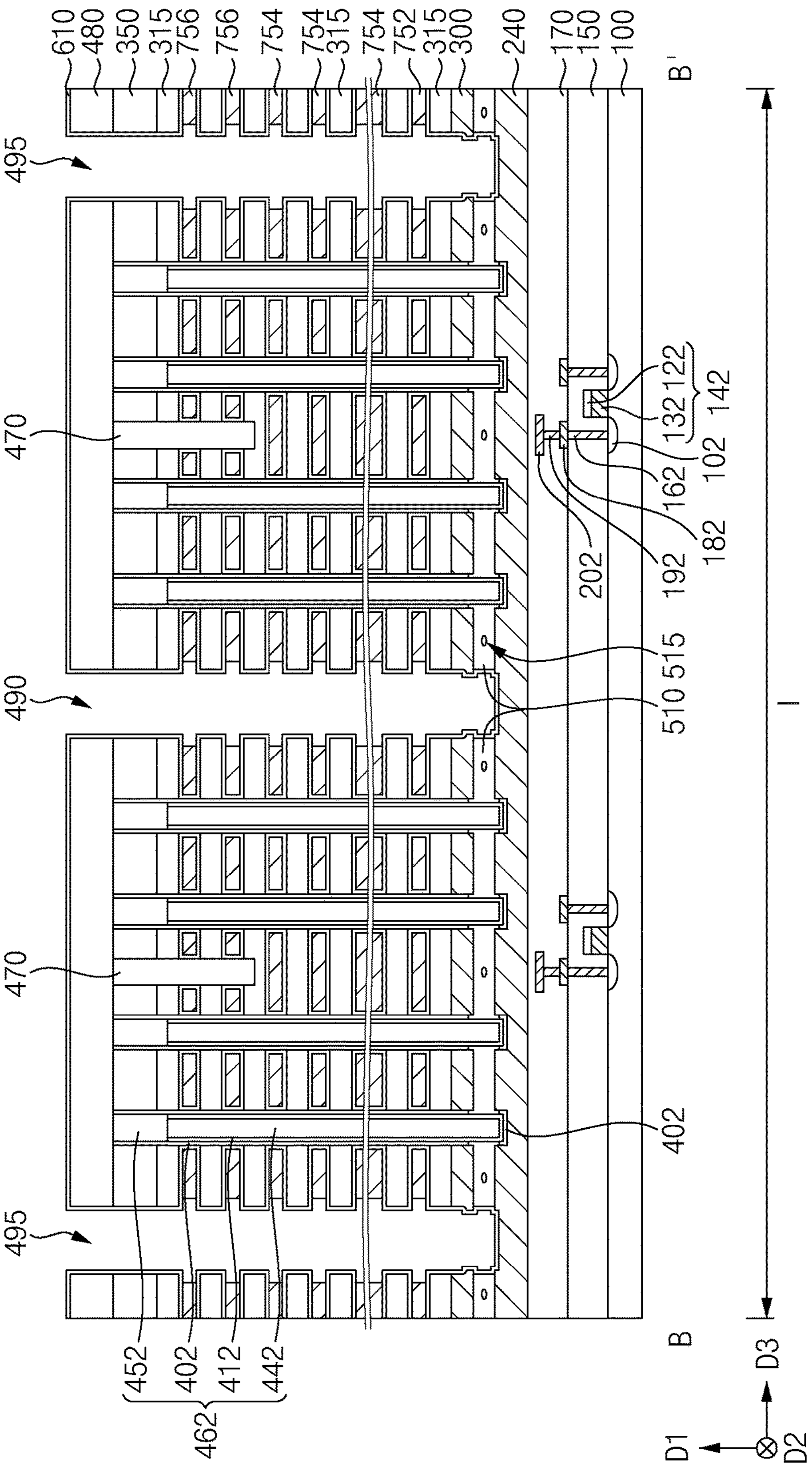

Referring to FIGS. 25 and 26, a second blocking layer 610 may be formed on the outer sidewalls of the charge storage structure 402 and the dummy charge storage structure 404 exposed by the third to fifth openings 490, 495 and 497, inner walls of the second gaps 590, surfaces of the first insulation patterns 315, and a sidewall and an upper surface of the fifth insulating interlayer 480, and a gate electrode layer may be formed on the second blocking layer 610.

The gate electrode layer may include a gate barrier layer and a gate conductive layer sequentially stacked.

The gate electrode layer may be partially removed to form a gate electrode in each of the second gaps 590. In example embodiments, the gate electrode layer may be partially removed by a wet etching process.

In example embodiments, the gate electrode may extend in the second direction D2, and a plurality of gate electrodes may be spaced apart from each other in the first direction D1 to form a gate electrode structure.

In example embodiments, a plurality of gate electrode structures may be spaced apart from each other by the third openings 490 in the third direction D3. As illustrated above, the fourth opening 495 may not continuously extend to the end portion of the gate electrode structure in the second direction D2, and thus the gate electrode structure may not be entirely divided by the fourth openings 495 in the third direction D3.

However, a lowermost gate electrode of the gate electrodes in the gate electrode structure may be divided by the fourth openings 495, the first division pattern 330 and the first insulation pattern structure 600 in the third direction D3, and the gate electrodes at upper two levels may be divided by the fourth opening 495 and the second division pattern 470 in the third direction D3.

The gate electrode structure may include first, second and third gate electrodes 752, 754 and 756 sequentially stacked in the first direction D1. In example embodiments, each of the third gate electrodes 756 may extend in the second direction D2, and end portions in the second direction D2 of each of the third gate electrodes 756 may be formed on the second and third regions II and III of the substrate 100 to form pads, respectively.

Figure 27:
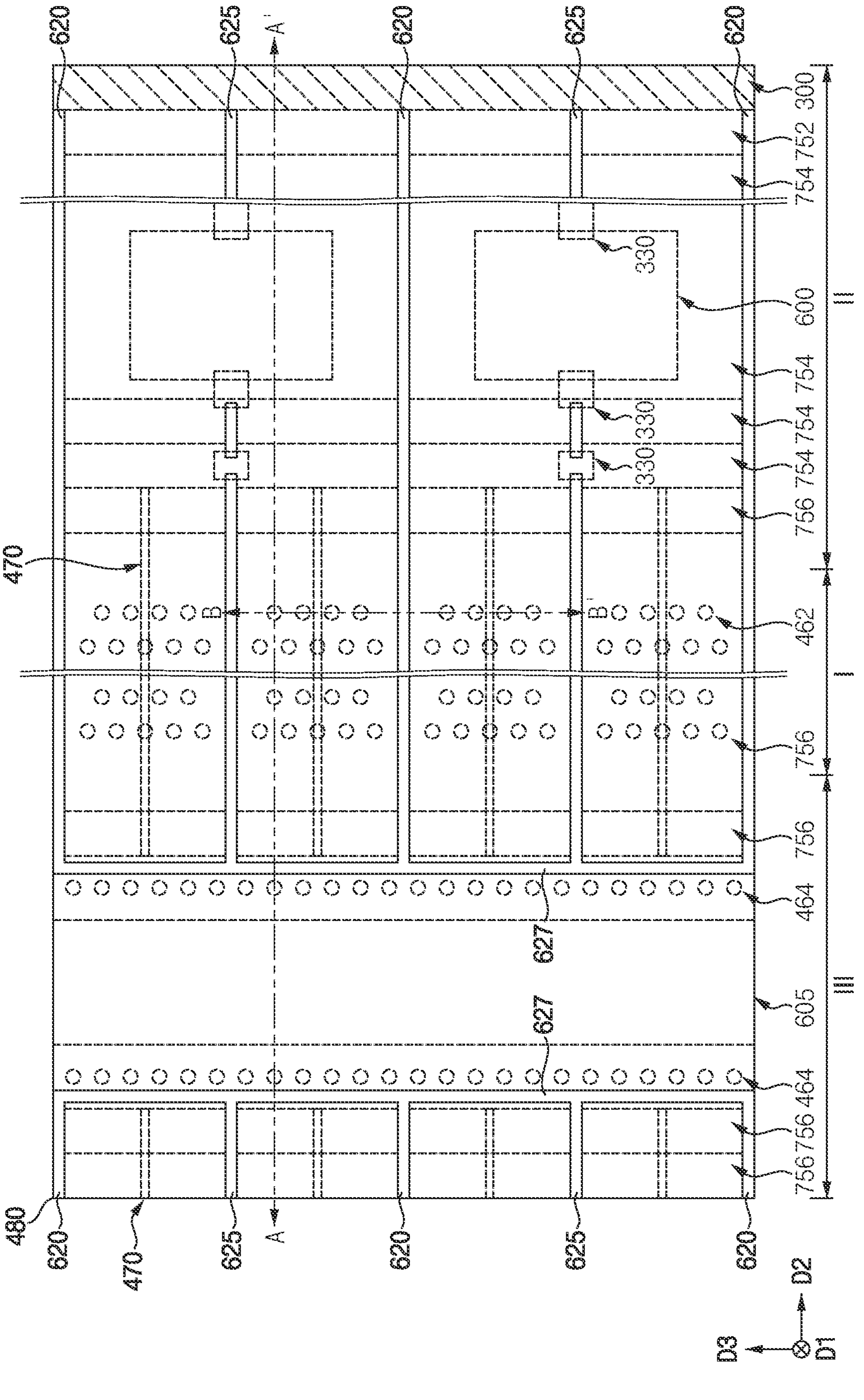
Figure 28:
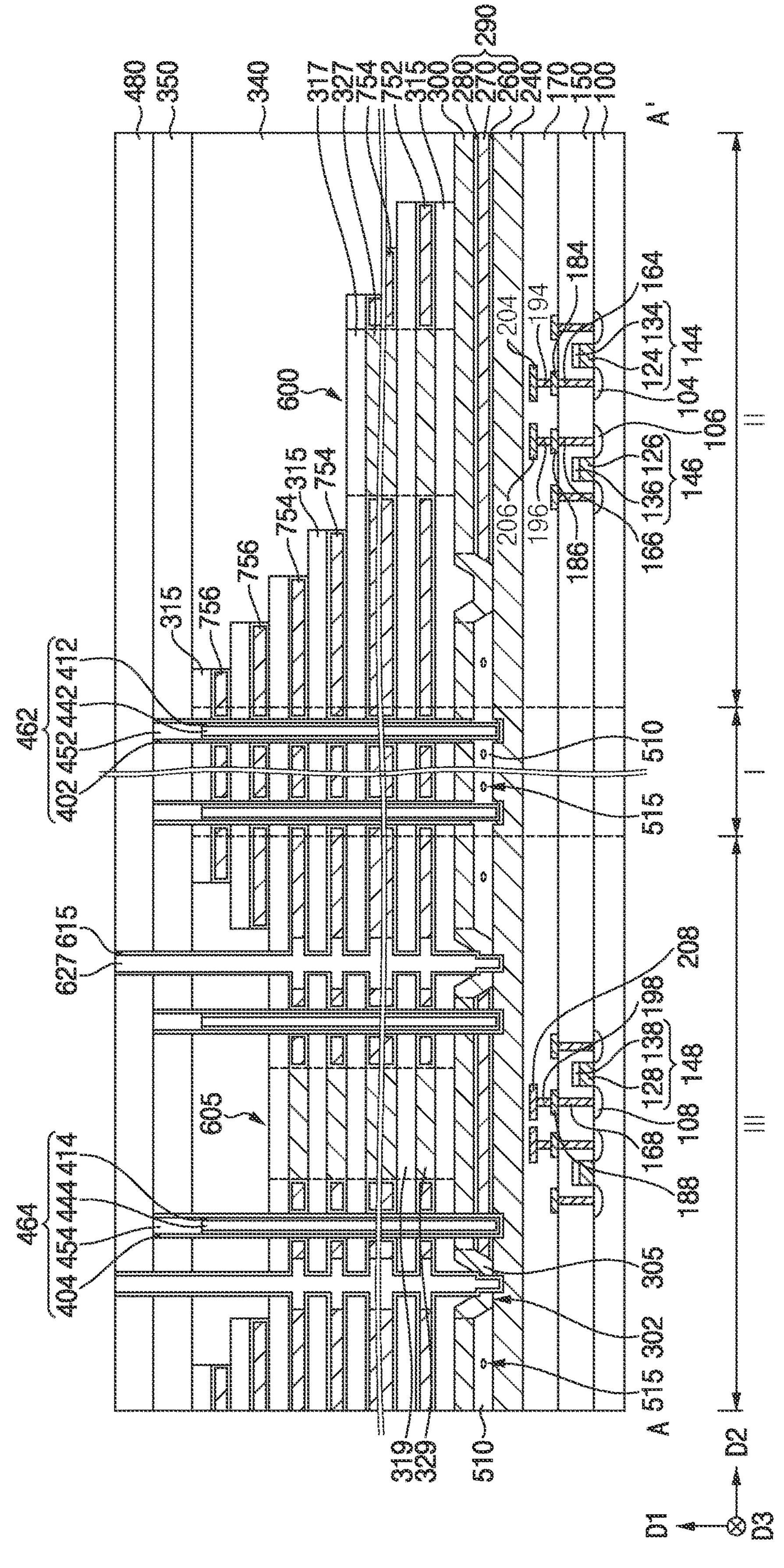
Figure 29:
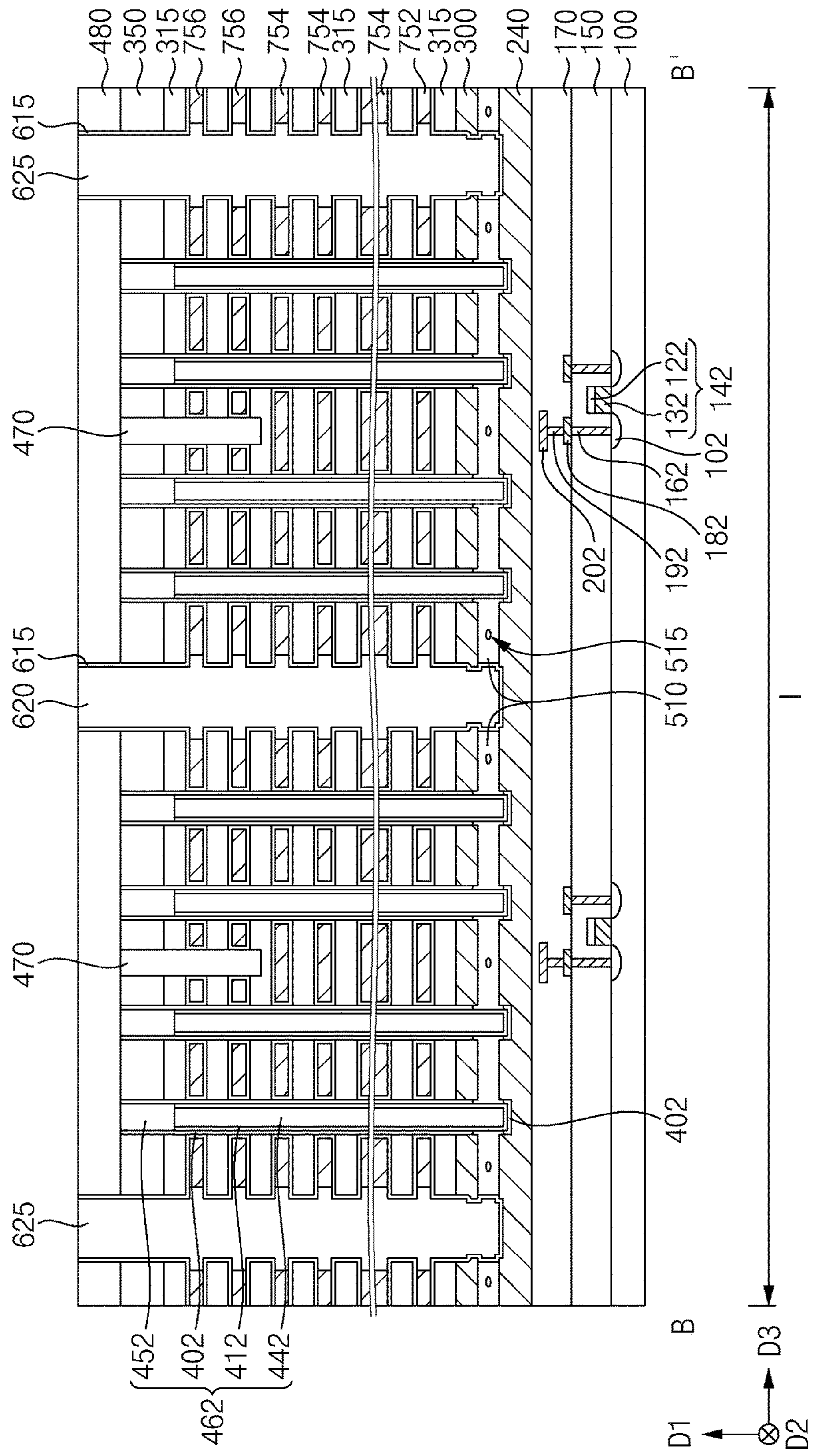

Referring to FIGS. 27 to 29, a third division layer may be formed on the second blocking layer 610 in the third to fifth openings 490, 495 and 497, and may be planarized until an upper surface of the fifth insulating interlayer 480 is exposed.

Thus, third to fifth division patterns 620, 625 and 627 may be formed in the third to fifth openings 490, 495 and 497, respectively, and the second blocking layer 610 may be transformed into a second blocking pattern 615.

Figure 30:
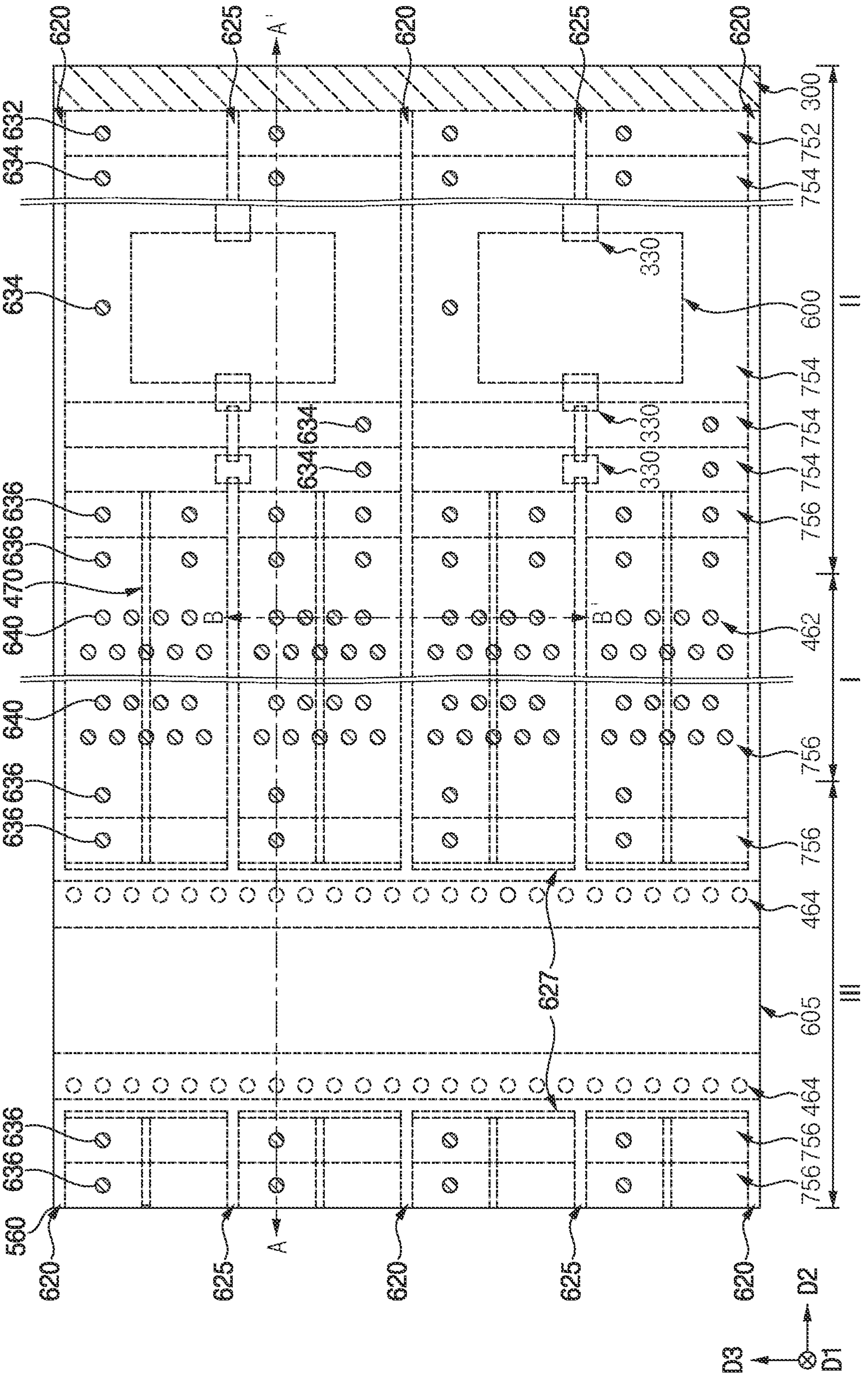
Figure 31:
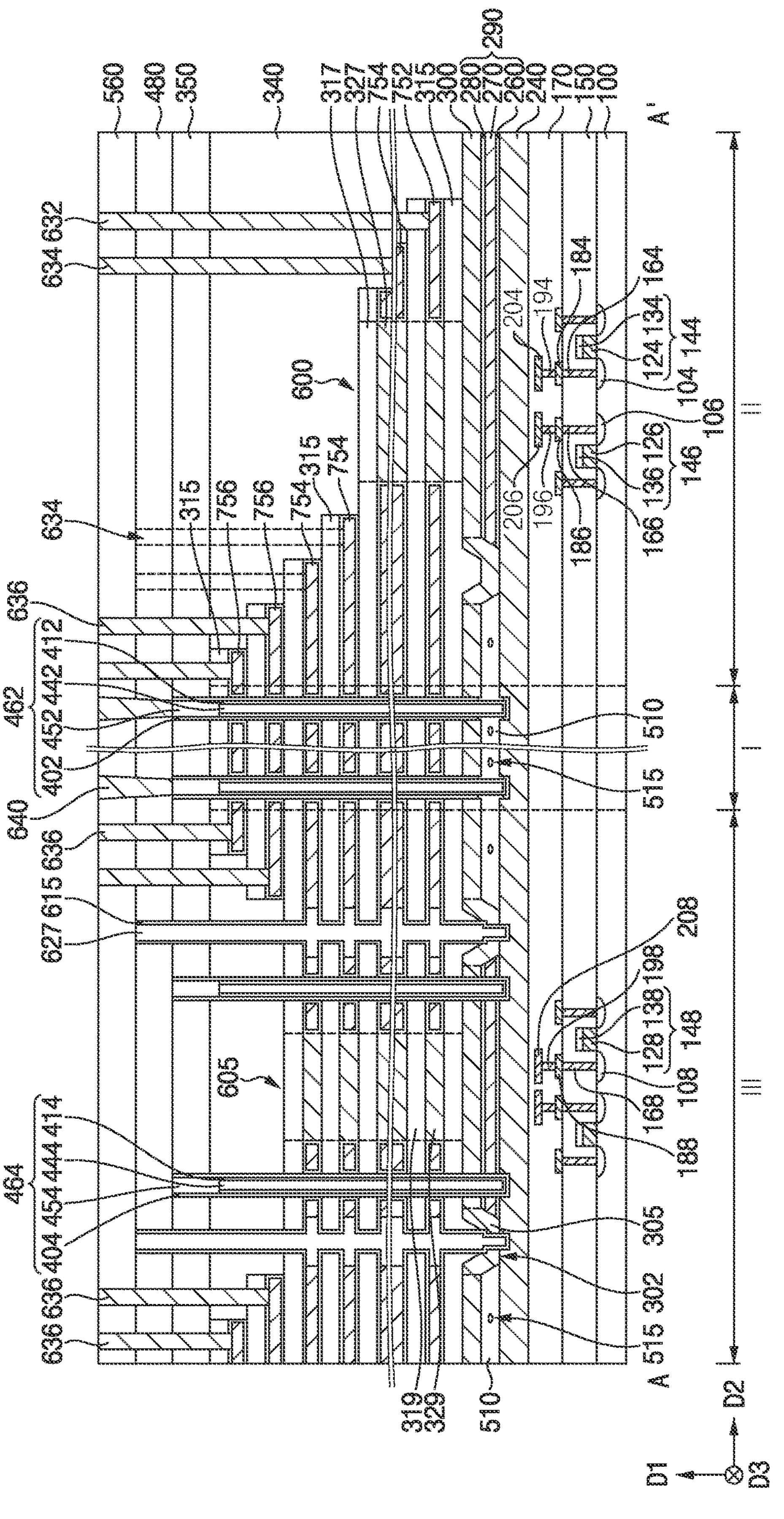
Figure 32:
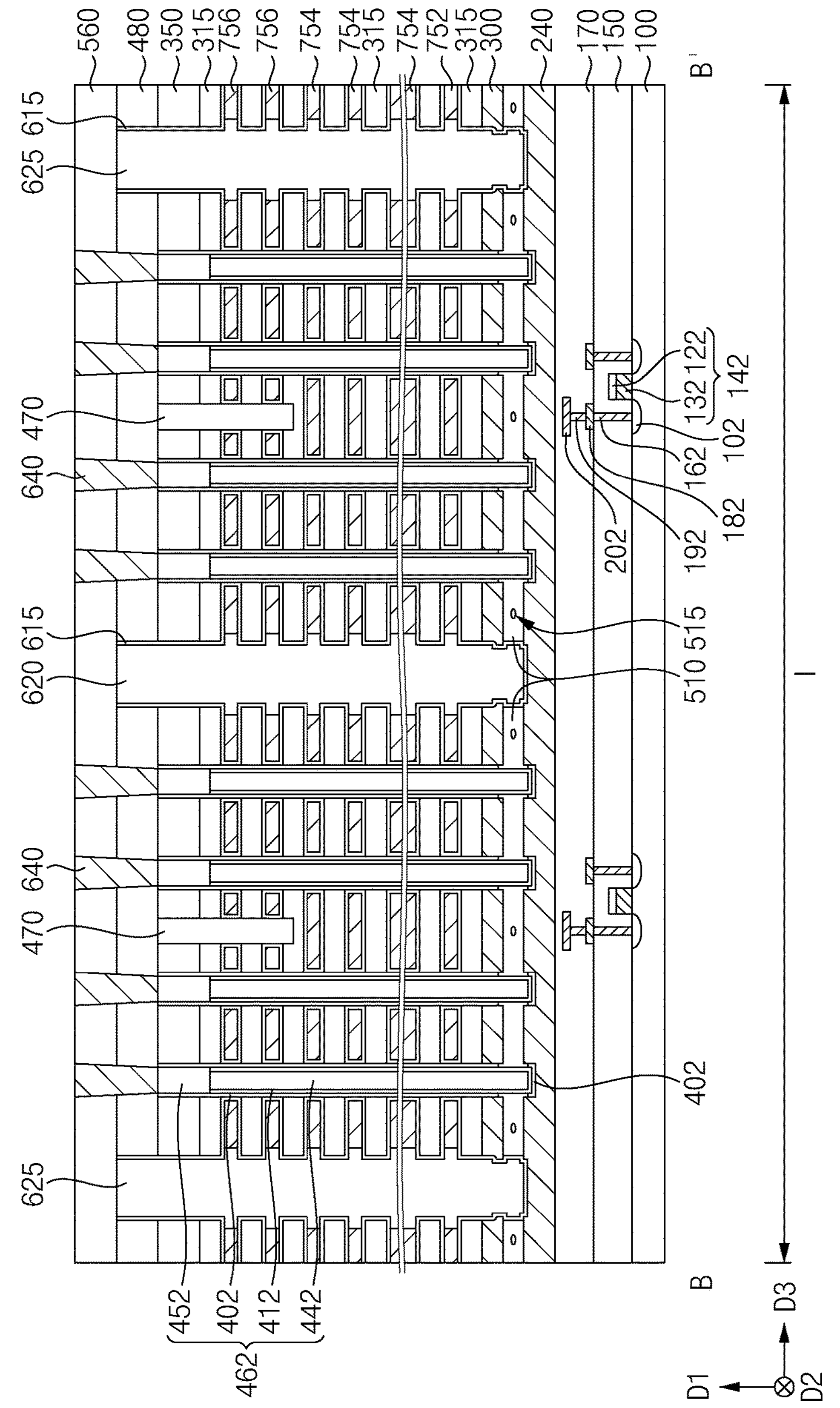

Referring to FIGS. 30 to 32, a sixth insulating interlayer 560 may be formed on the fifth insulating interlayer 480. First to third upper contact plugs 632, 634 and 636 may extend through the third to sixth insulating interlayers 340, 350, 480 and 560, the first insulation pattern 315 and the second blocking pattern 615, to contact upper surfaces of the first to third gate electrodes 752, 754 and 756, respectively. A fourth upper contact plug 640 extending through the fifth and sixth insulating interlayers 480 and 560 to contact an upper surface of the first capping pattern 452 may be formed.

The first and second upper contact plugs 632 and 634 may contact upper surfaces of the pads of the first and second gate electrodes 752 and 754, respectively, on the second region II of the substrate 100.

The third upper contact plug 636 may be formed on the third region III of the substrate 100 as well as on the second region II of the substrate 100. That is, the third upper contact plugs 636 may contact respective upper surfaces of pads of the third gate electrode 756 at opposite end portions in the second direction D2 of the third gate electrode 756.

Figure 33:
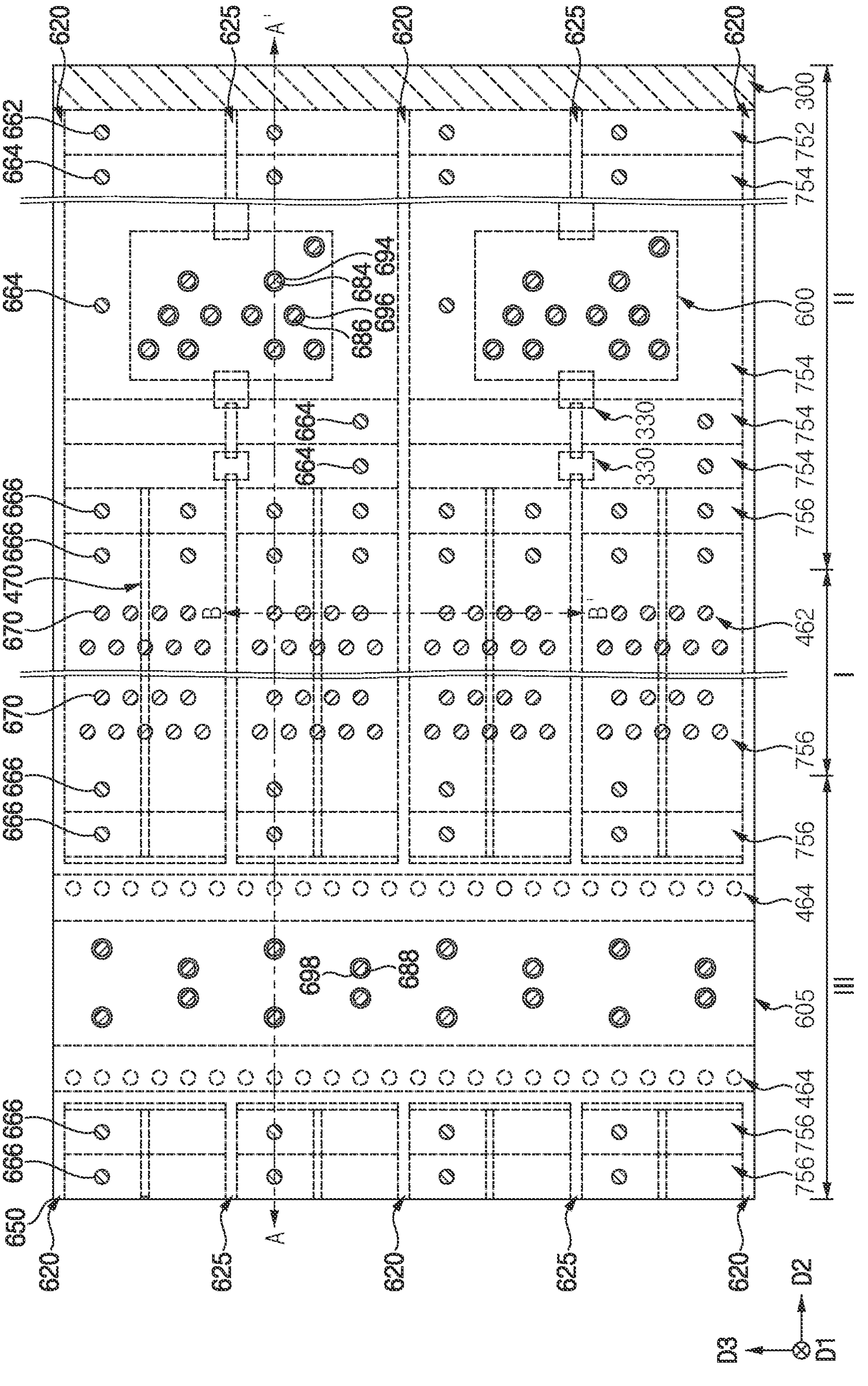
Figure 34:
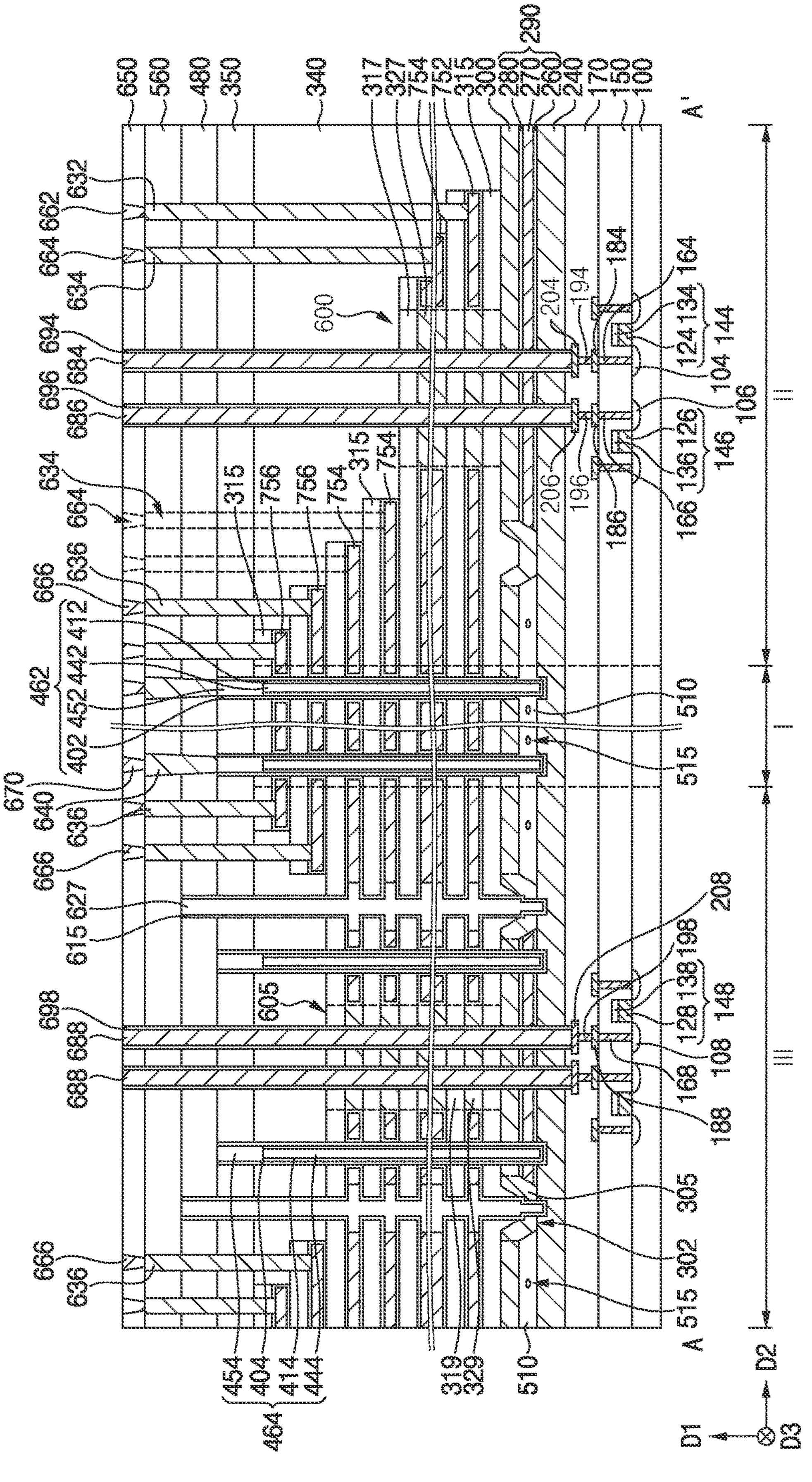
Figure 35:
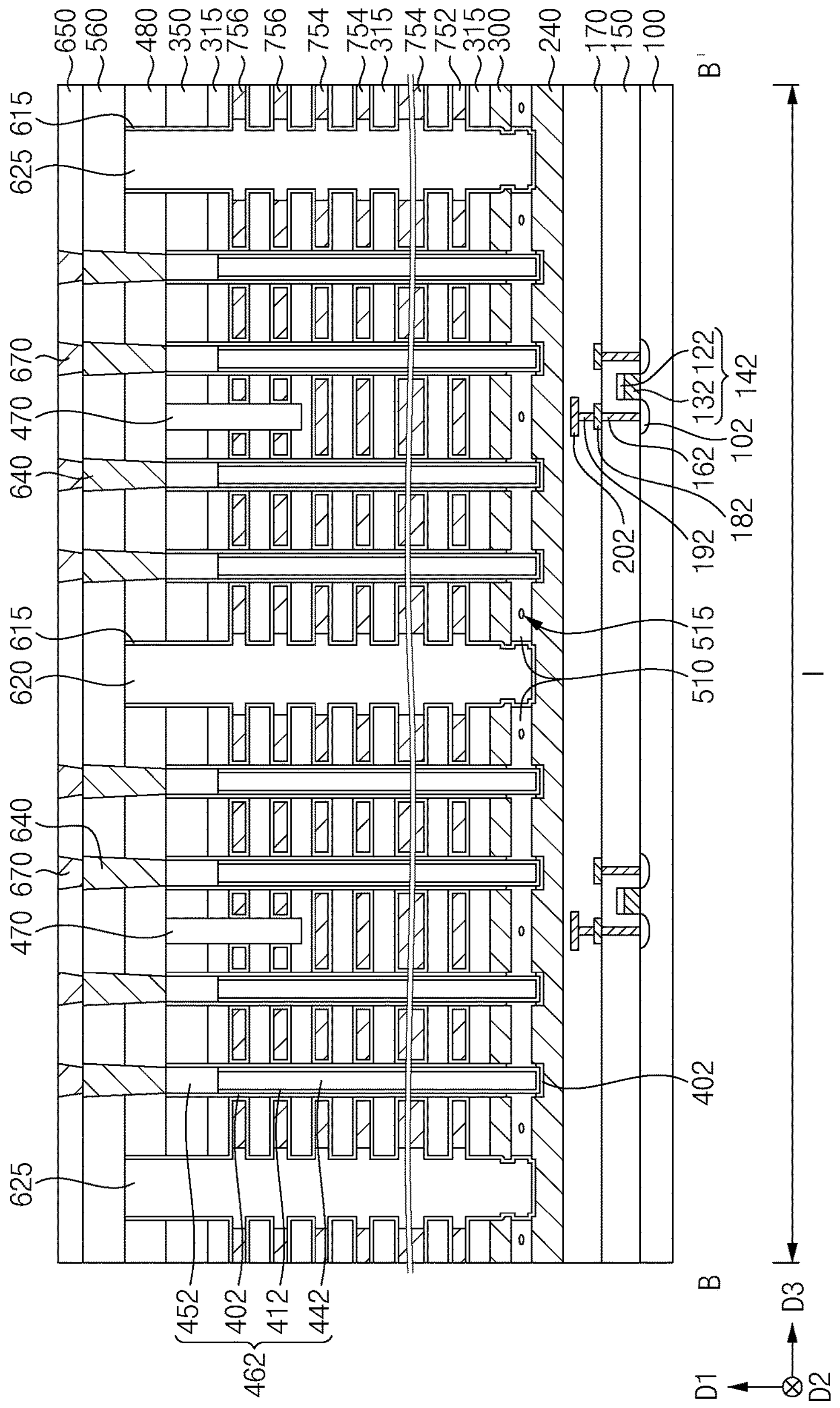

Referring to FIGS. 33 to 35, a seventh insulating interlayer 650 may be formed on the sixth insulating interlayer 560, and fifth to eighth upper contact plugs 662, 664, 666 and 670 may be formed to contact upper surfaces of the first to fourth upper contact plugs 632, 634, 636 and 640, respectively.

Additionally, first and second through vias 684 and 686 extending through the third to sixth insulating interlayers 340, 350, 480 and 560, the first insulation pattern structure 600, the support layer 300, the sacrificial layer structure 290, the CSP 240 and an upper portion of the second insulating interlayer 170 to contact upper surfaces of the sixth and seventh lower wirings 204 and 206, respectively, may be formed on the second region II of the substrate 100. A third through via 688 extending through the third to sixth insulating interlayers 340, 350, 480 and 560, the second insulation pattern structure 605, the support layer 300, the sacrificial layer structure 290, the CSP 240 and the upper portion of the second insulating interlayer 170 to contact an upper surface of the eighth lower wiring 208 may be formed on the third region III of the substrate 100.

Sixth to eighth insulation patterns 694, 696 and 698 may be formed on sidewalls of the first to third through vias 684, 686 and 688, respectively.

Referring to FIGS. 1 to 4, an eighth insulating interlayer 700 may be formed on the seventh insulating interlayer 650, and first to fifth upper wirings 712, 714, 176, 718 and 720 may be formed through the eighth insulating interlayer 700.

In example embodiments, the first upper wiring 712 may contact an upper surface of the fifth upper contact plug 662, the second upper wiring 714 may contact upper surfaces of the sixth upper contact plug 664 and the first through via 684, the third upper wiring 716 may contact upper surfaces of the seventh upper contact plug 666 and the second through via 686 on the second region II of the substrate 100, the fourth upper wiring 718 may contact upper surfaces of the seventh upper contact plug 666 and the third through via 688 on the third region III of the substrate 100, and the fifth upper wiring 720 may contact upper surfaces of the eighth upper contact plugs 670 disposed in the third direction D3 and extend in the third direction D3 on the first region I of the substrate 100.

The layouts of the first to fifth upper wirings 712, 714, 716, 718 and 720 may be various.

The semiconductor device may be manufactured by the above processes.

Figure 36:
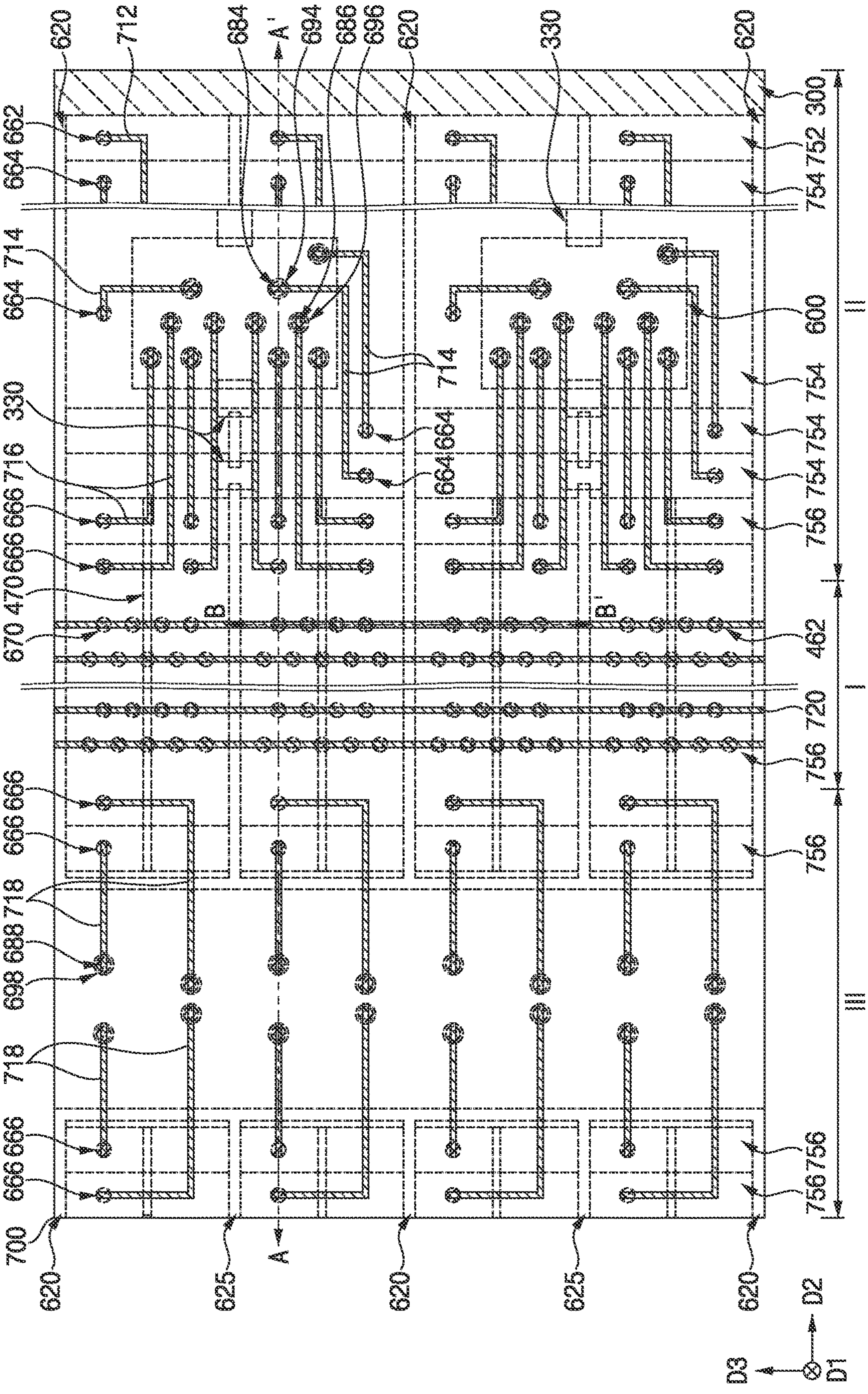
FIG. 36 is a diagram illustrating a semiconductor device in accordance with example embodiments.
Figure 37:
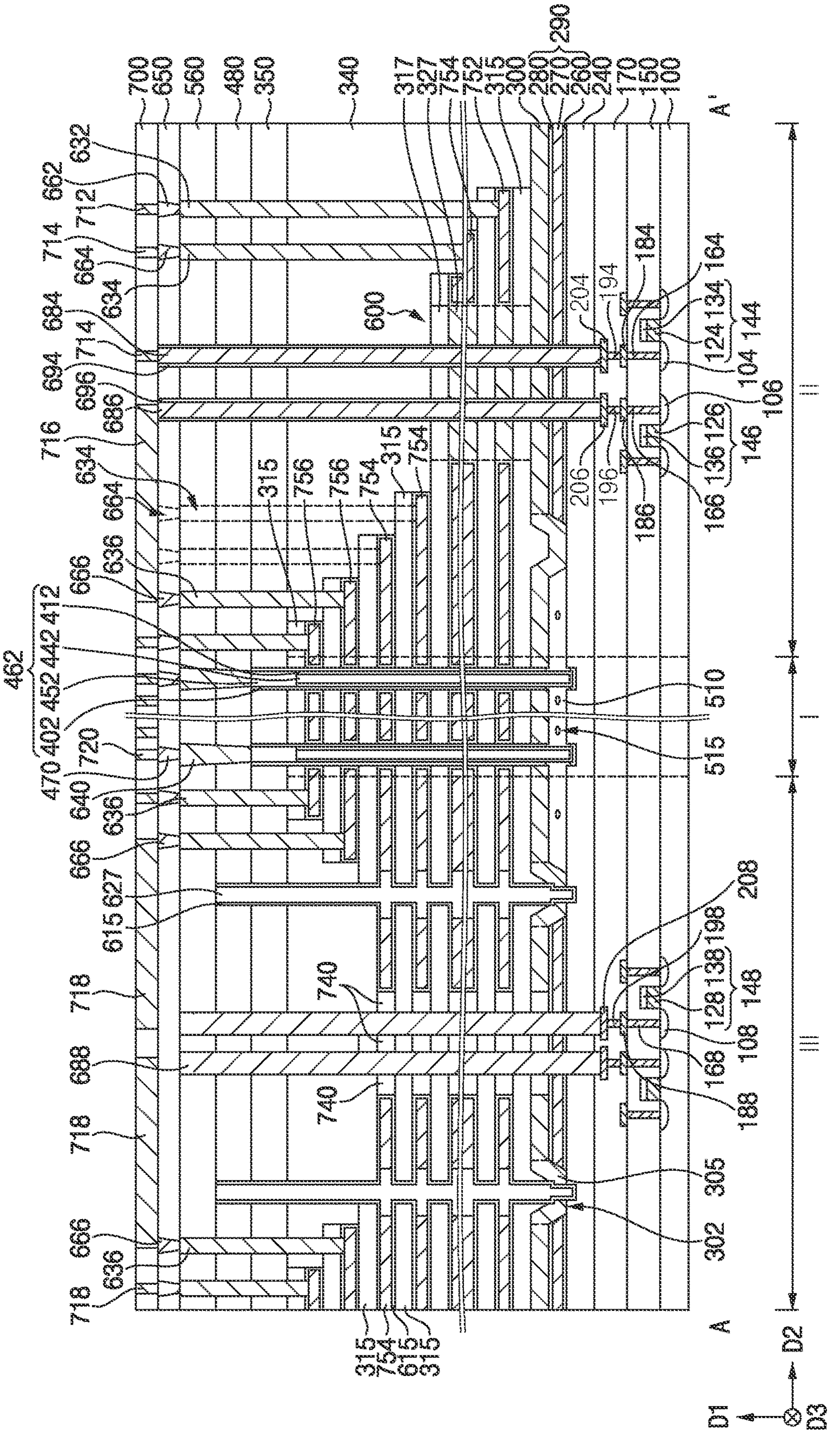
FIG. 37 is a cross-sectional view illustrating a semiconductor device in accordance with example embodiments.

FIG. 36 is a diagram illustrating a semiconductor device in accordance with example embodiments. FIG. 37 is a cross-sectional view illustrating a semiconductor device in accordance with example embodiments. FIGS. 36 and 37 are a plan view and a cross-sectional view, respectively, illustrating a semiconductor device in accordance with example embodiments, which may correspond to FIGS. 2 and 3, respectively. This semiconductor device may be substantially the same as or similar to that of FIGS. 1 to 4, except for not including the second insulation pattern structure 605 and the support structure 464.

Referring to FIGS. 36 and 37, the second insulation pattern structure 605 and the support structure 464 may not be formed on the third region III of the substrate 100.

That is, when compared to the semiconductor device of FIGS. 1 to 4, a width in the second direction D2 of the third region III of the substrate 100 may be relatively small, and thus when the third to fifth openings 490, 495 and 497 are formed by the processes substantially the same as or similar to those illustrated with reference to FIGS. 23 and 24, a distance between the fifth openings 497 on the third region III of the substrate 100 may be small.

Accordingly, the portion of the fourth sacrificial pattern 325 between the fifth openings 497 on the third region III of the substrate 100 may be entirely removed so that the second insulation pattern structure 605 may not be formed, and the first to third gate electrodes 752, 754 and 756 that may be formed by the processes substantially the same as or similar to those illustrated with reference to FIGS. 25 and 26 may also be formed on a central portion in the second direction D2 of the third region III of the substrate 100.

As the distance between the fifth openings 497 is small, the support structure 464 may not be formed between the fifth openings 497.

Additionally, instead of the eighth insulation pattern 698 entirely covering a sidewall of the third through via 688 on the third region III of the substrate 100, a ninth insulation pattern 740 may be formed on a sidewall of the third through via 688 facing each of the first to third gate electrodes 752, 754 and 756 and the support layer 300.

Figure 38:
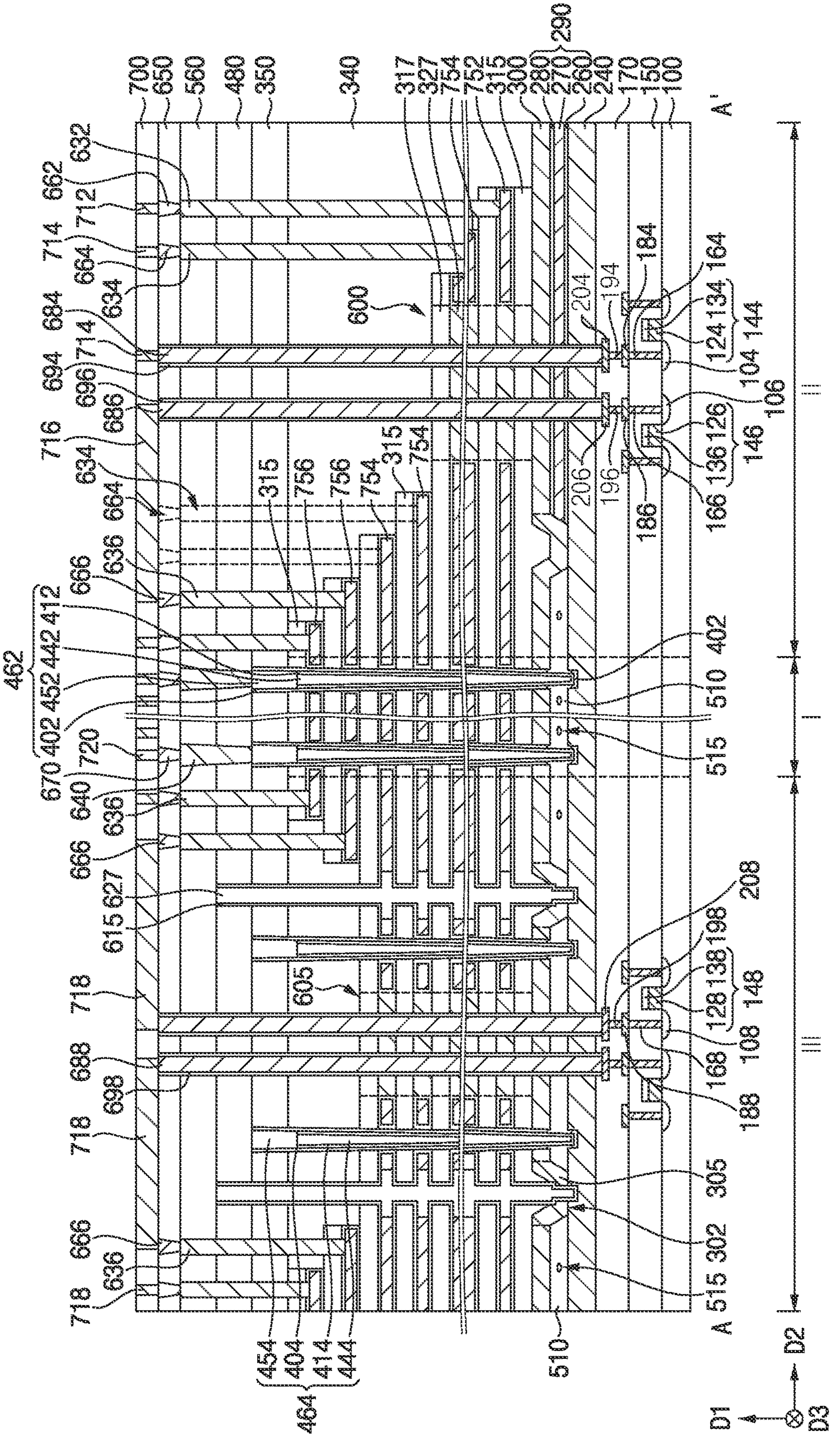
FIG. 38 is a cross-sectional view illustrating a semiconductor device in accordance with example embodiments.

FIG. 38 is a cross-sectional view illustrating a semiconductor device in accordance with example embodiments, which may correspond to FIG. 3. This semiconductor device may be substantially the same as or similar to that of FIGS. 1 to 4, except for the shape of the memory channel structure 462.

Referring to FIG. 38, each of the memory channel structure 462 and the support structure 464 included in the semiconductor device may include sequentially stacked lower and upper portions, and each of the lower and upper portions may have a width gradually decreasing from a top toward a bottom thereof. In example embodiments, an upper surface of the lower portion of each of the memory channel structure 462 and the support structure 464 may have a width greater than a width of a lower surface of the upper portion of each of the memory channel structure 462 and the support structure 464.

FIG. 38 shows that each of the memory channel structure 462 and the support structure 464 includes two portions, that is, the lower and upper portions, but the disclosure is not limited thereto, and each of the memory channel structure 462 and the support structure 464 may include three or more portions sequentially stacked. Each of the portions of each of the memory channel structure 462 and the support structure 464 may have a width gradually decreasing from a top toward a bottom thereof, and an upper surface of a relatively lower portion may have a width greater than a width of a lower surface of an upper portion directly over the relatively lower portion.

Figure 39:
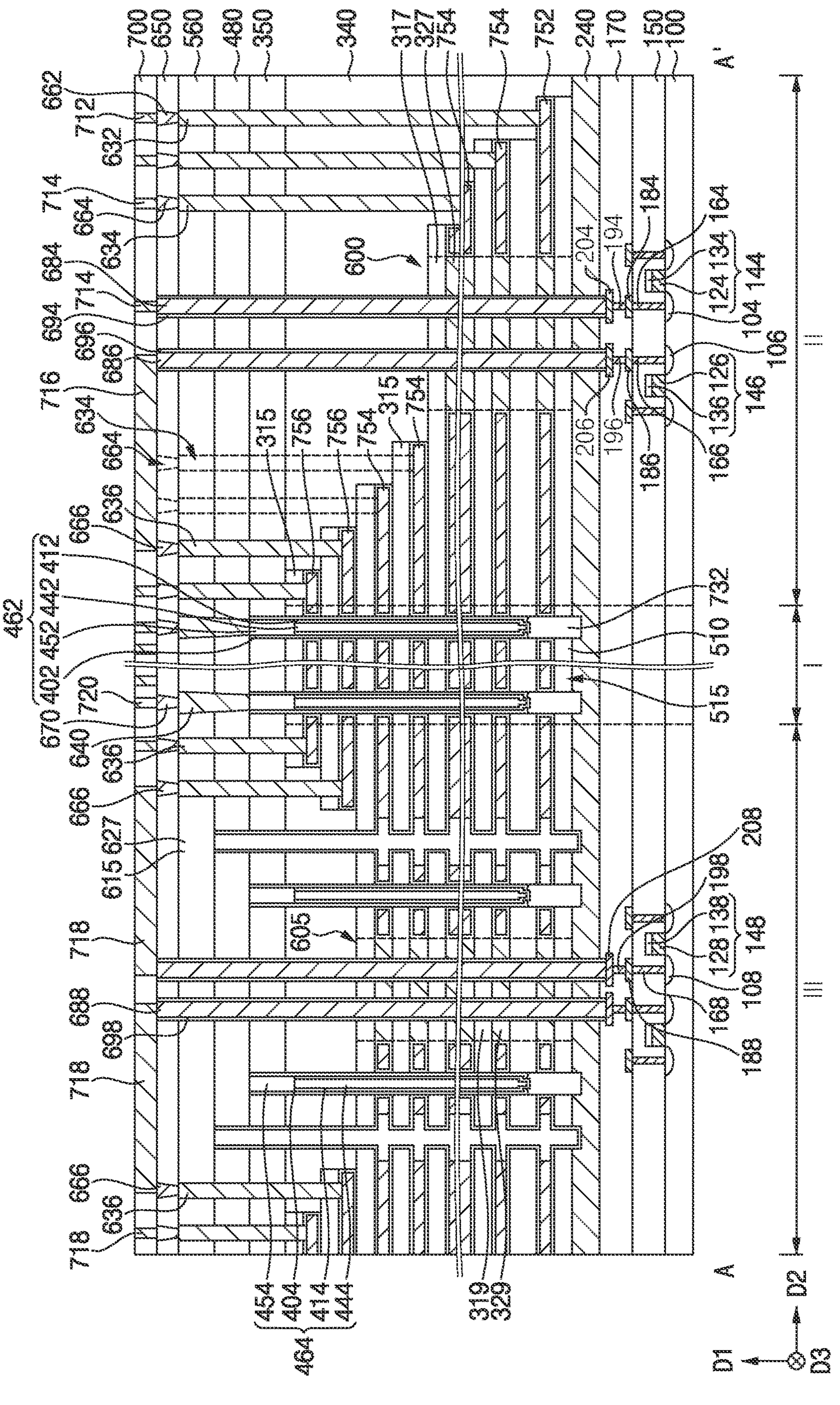
FIG. 39 is a cross-sectional view illustrating a semiconductor device in accordance with example embodiments.

FIG. 39 is a cross-sectional view illustrating a semiconductor device in accordance with example embodiments, which may correspond to FIG. 3. The semiconductor device may be substantially the same as or similar to the semiconductor device illustrated in FIGS. 1 to 4, except for the memory channel structure 462, the support structure 464, the channel connection pattern 510, the support layer 300 and the support pattern 305.

Referring to FIG. 39, the memory channel structure 462 may further include a semiconductor pattern 732 on the substrate 100, and the charge storage structure 402, the channel 412, the first filling pattern 442 and the first capping pattern 452 may be formed on the semiconductor pattern 732.

The semiconductor pattern 732 may include, for example, single crystalline silicon or polysilicon. In an example embodiment, an upper surface of the semiconductor pattern 732 may be located at a height between heights of lower and upper surfaces of one of the first insulation patterns 315 that may be disposed between the first and second gate electrodes 752 and 754. The charge storage structure 402 may have a cup-like shape of which a central lower surface is opened on the upper surface of the semiconductor pattern 732, and may contact an edge upper surface of the semiconductor pattern 732. The channel 412 may have a cup-like shape, and may contact a central upper surface of the semiconductor pattern 732. Thus, the channel 412 may be electrically connected to the CSP 240 through the semiconductor pattern 732.

The support structure 464 may further include the semiconductor pattern 732 on the substrate 100, and the dummy charge storage structure 404, the dummy channel 414, the second filling pattern 444 and the second capping pattern 454 may be formed on the semiconductor pattern 732.

The channel connection pattern 510, the support layer 300 and the support pattern 305 may not be formed between the CSP 240 and the first gate electrode 752. In an example embodiment, one of the first insulation patterns 315 between the first and second gate electrodes 752 and 754 may have a thickness greater than that of overlying insulation patterns of the first insulation patterns 315.

Figure 40:
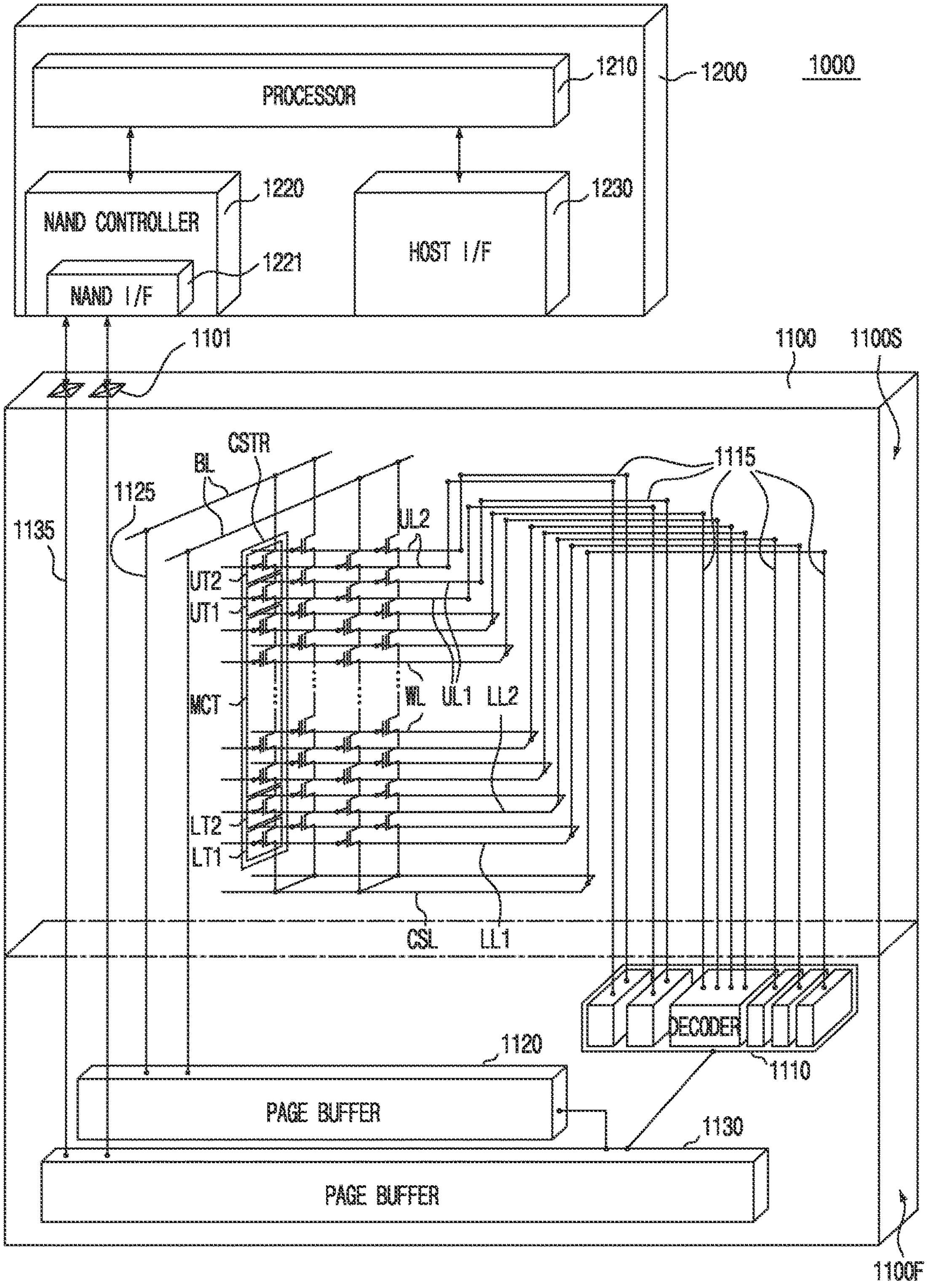
FIG. 40 is a diagram illustrating an electronic system including a semiconductor device in accordance with example embodiments.

FIG. 40 is a diagram illustrating an electronic system including a semiconductor device in accordance with example embodiments.

Referring to FIG. 40, an electronic system 1000 may include a semiconductor device 1100 and a controller 1200 electrically connected to the semiconductor device 1100. The electronic system 1000 may be a storage device including one or a plurality of semiconductor devices 1100 or an electronic device including a storage device. For example, the electronic system 1000 may be a solid state drive (SSD) device, a universal serial bus (USB), a computing system, a medical device, or a communication device that may include one or a plurality of semiconductor devices 1100.

The semiconductor device 1100 may be a non-volatile memory device, for example, a NAND flash memory device that will be illustrated with reference to FIGS. 1 to 4. The semiconductor device 1100 may include a first structure 1100F and a second structure 1100S on the first structure 1100F. The first structure 1100F may be a peripheral circuit structure including a decoder circuit 1110, a page buffer 1120, and a logic circuit 1130. The second structure 1100S may be a memory cell structure including a bit line BL, a common source line CSL, word lines WL, first and second upper gate lines UL1 and UL2, first and second lower gate lines LL1 and LL2, and memory cell strings CSTR between the bit line BL and the common source line CSL.

In the second structure 1100S, each of the memory cell strings CSTR may include lower transistors LT1 and LT2 adjacent to the common source line CSL, upper transistors UT1 and UT2 adjacent to the bit line BL, and a plurality of memory cell transistors MCT between the lower transistors LT1 and LT2 and the upper transistors UT1 and UT2. The number of the lower transistors LT1 and LT2 and the number of the upper transistors UT1 and UT2 may be varied in accordance with example embodiments.

In example embodiments, the upper transistors UT1 and UT2 may include string selection transistors, and the lower transistors LT1 and LT2 may include ground selection transistors. The lower gate lines LL1 and LL2 may be gate electrodes of the lower transistors LT1 and LT2, respectively. The word lines WL may be gate electrodes of the memory cell transistors MCT, respectively, and the upper gate lines UL1 and UL2 may be gate electrodes of the upper transistors UT1 and UT2, respectively.

In example embodiments, the lower transistors LT1 and LT2 may include a lower erase control transistor LT1 and a ground selection transistor LT2 that may be connected to each other in serial. The upper transistors UT1 and UT2 may include a string selection transistor UT1 and an upper erase control transistor UT2. At least one of the lower erase control transistor LT1 and the upper erase control transistor UT2 may be used in an erase operation for erasing data stored in the memory cell transistors MCT through GIDL phenomenon.

The common source line CSL, the first and second lower gate lines LL1 and LL2, the word lines WL, and the first and second upper gate lines UL1 and UL2 may be electrically connected to the decoder circuit 1110 through first connection wirings 1115 extending to the second structure 1110S in the first structure 1100F. The bit lines BL may be electrically connected to the page buffer 1120 through second connection wirings 1125 extending to the second structure 1100S in the first structure 1100F.

In the first structure 1100F, the decoder circuit 1110 and the page buffer 1120 may perform a control operation for at least one selected memory cell transistor among the plurality of memory cell transistors MCT. The decoder circuit 1110 and the page buffer 1120 may be controlled by the logic circuit 1130. The semiconductor device 1100 may communicate with the controller 1200 through an input/output pad 1101 electrically connected to the logic circuit 1130. The input/output pad 1101 may be electrically connected to the logic circuit 1130 through an input/output connection wiring 1135 extending to the second structure 1100S in the first structure 1100F.

The controller 1200 may include a processor 1210, a NAND controller 1220, and a host interface 1230. The electronic system 1000 may include a plurality of semiconductor devices 1100, and in this case, the controller 1200 may control the plurality of semiconductor devices 1100.

The processor 1210 may control operations of the electronic system 1000 including the controller 1200. The processor 1210 may be operated by firmware, and may control the NAND controller 1220 to access the semiconductor device 1100. The NAND controller 1220 may include a NAND interface 1221 for communicating with the semiconductor device 1100. Through the NAND interface 1221, control command for controlling the semiconductor device 1100, data to be written in the memory cell transistors MCT of the semiconductor device 1100, data to be read from the memory cell transistors MCT of the semiconductor device 1100, etc., may be transferred. The host interface 1230 may provide communication between the electronic system 1000 and an outside host. When control command is received from the outside host through the host interface 1230, the processor 1210 may control the semiconductor device 1100 in response to the control command.

Figure 41:
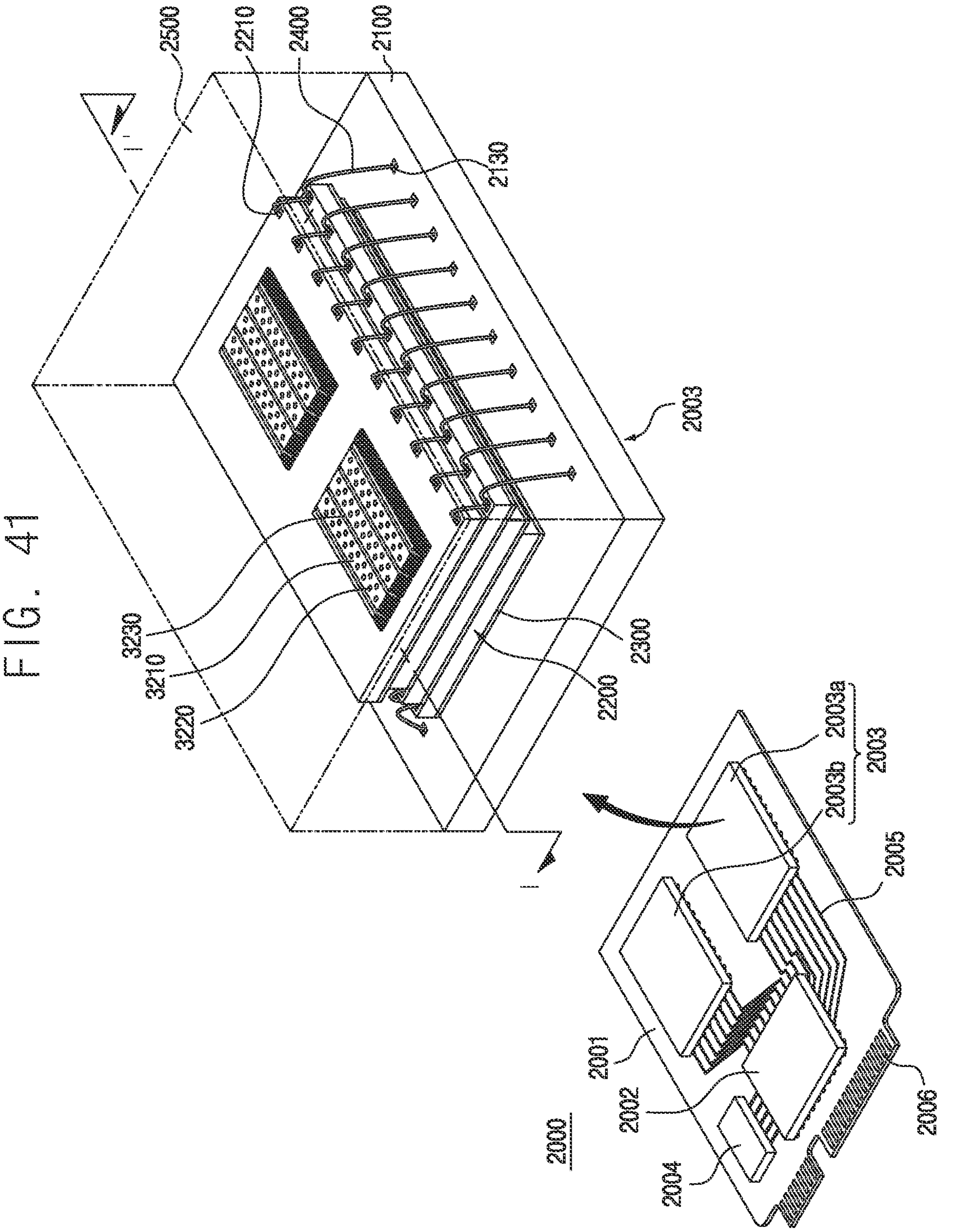
FIG. 41 is a diagram illustrating an electronic system including a semiconductor device in accordance with example embodiments.

FIG. 41 is a diagram illustrating an electronic system including a semiconductor device in accordance with example embodiments.

Referring to FIG. 41, an electronic system 2000 may include a main substrate 2001, a controller 2002 mounted on the main substrate 2001, at least one semiconductor package 2003, and a dynamic random access memory (DRAM) device 2004. The semiconductor package 2003 and the DRAM device 2004 may be connected to the controller 2002 by wiring patterns 2005 on the main substrate 2001.

The main substrate 2001 may include a connector 2006 having a plurality of pins connected to an outside host. The number and layout of the plurality pins in the connector 2006 may be changed depending on communication interface between the electronic system 2000 and the outside host. In example embodiments, the electronic system 2000 may communicate with the outside host according to one of a USB, peripheral component interconnect express (PCI-Express), serial advanced technology attachment (SATA), M-Phy for universal flash storage (UFS), etc. In example embodiments, the electronic system 2000 may be operated by power source provided from the outside host through the connector 2006. The electronic system 2000 may further include power management integrated circuit (PMIC) for distributing the power source provided from the outside host to the controller 2002 and the semiconductor package 2003.

The controller 2002 may write data in the semiconductor package 2003 or read data from the semiconductor package 2003, and may enhance the operation speed of the electronic system 2000.

The DRAM device 2004 may be a buffer memory for reducing the speed difference between the semiconductor package 2003 for storing data and the outside host. The DRAM device 2004 included in the electronic system 2000 may serve as a cache memory, and may provide a space for temporarily storing data during the control operation for the semiconductor package 2003. If the electronic system 2000 includes the DRAM device 2004, the controller 2002 may further include a DRAM controller for controlling the DRAM device 2004 in addition to the NAND controller for controlling the semiconductor package 2003.

The semiconductor package 2003 may include first and second semiconductor packages 2003*a* and 2003*b* spaced apart from each other. The first and second semiconductor packages 2003*a* and 2003*b* may be semiconductor packages each of which may include a plurality of semiconductor chips 2200. Each of the first and second semiconductor packages 2003*a* and 2003*b* may include a package substrate 2100, the semiconductor chips 2200, bonding layers 2300 disposed under the semiconductor chips 2200, a connection structure 2400 for electrically connecting the semiconductor chips 2200 and the package substrate 2100, and a mold layer 2500 covering the semiconductor chips 2200 and the connection structure 2400 on the package substrate 2100.

The package substrate 2100 may be a printed circuit board (PCB) including package upper pads 2130. Each semiconductor chip 2200 may include an input/output pad 2210. The input/output pad 2210 may correspond to the input/output pad 1101 of FIG. 40. Each semiconductor chip 2200 may include gate electrode structures 3210, memory channel structures 3220 extending through the gate electrode structures 3210, and division structures 3230 for dividing the gate electrode structures 3210. Each semiconductor chip 2200 may include a semiconductor device that will be illustrated with reference to FIGS. 1 to 4.

In example embodiments, the connection structure 2400 may be a bonding wire for electrically connecting the input/output pad 2210 and the package upper pads 2130. Thus, in each of the first and second semiconductor packages 2003*a* and 2003*b*, the semiconductor chips 2200 may be electrically connected to each other by a bonding wire method, and may be electrically connected to the package upper pads 2130 of the package substrate 2100. Alternatively, in each of the first and second semiconductor packages 2003*a* and 2003*b*, the semiconductor chips 2200 may be electrically connected to each other by a connection structure including a through silicon via (TSV), instead of the connection structure 2400 of the bonding wire method.

In example embodiments, the controller 2002 and the semiconductor chips 2200 may be included in one package. In example embodiments, the controller 2002 and the semiconductor chips 2200 may be mounted on an interposer substrate different from the main substrate 2001, and the controller 2002 and the semiconductor chips 2200 may be connected to each other by a wiring on the interposer substrate.

Figure 42:
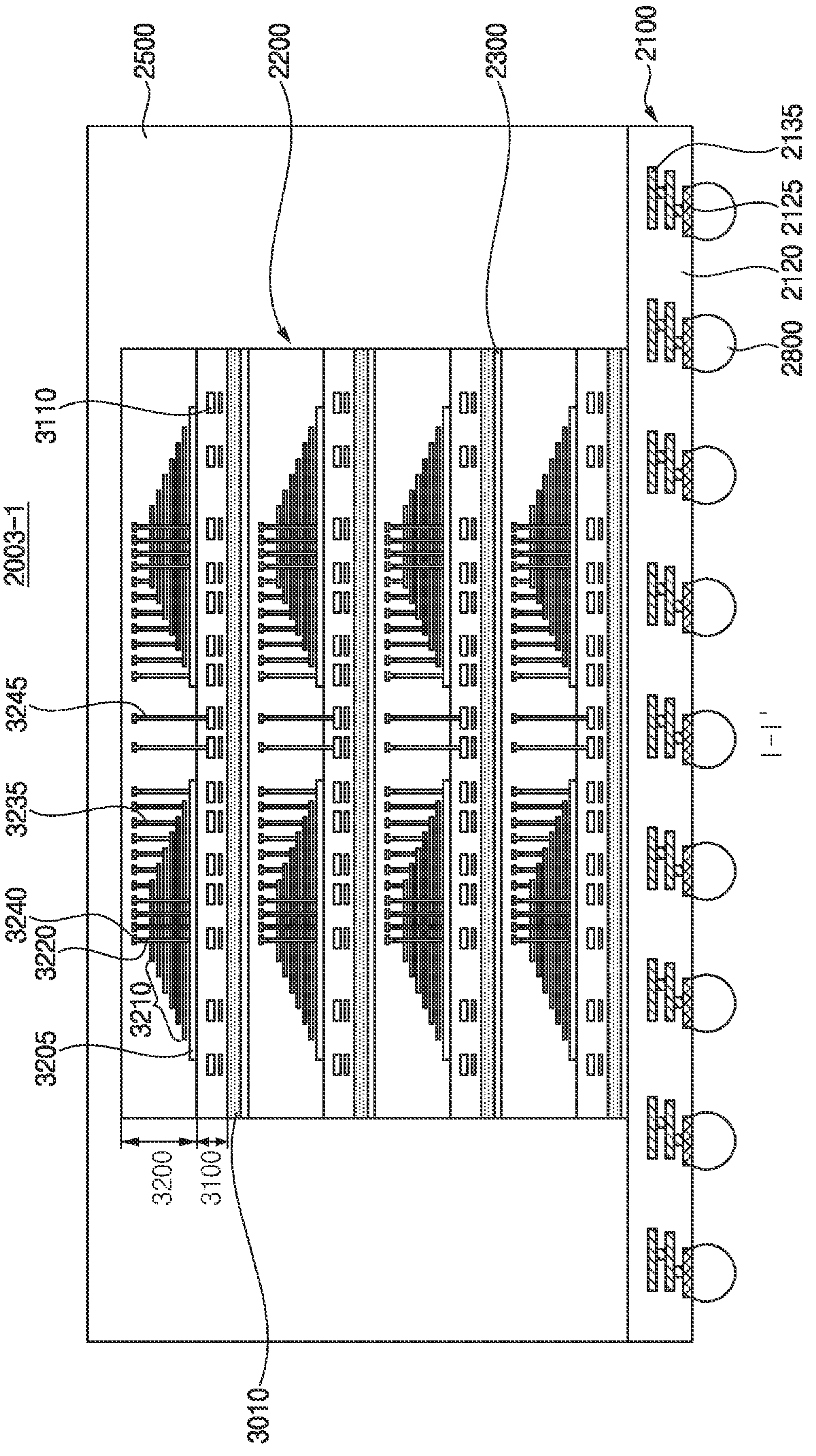
FIG. 42 is a cross-sectional view illustrating a semiconductor package that may include a semiconductor device in accordance with example embodiments.

FIG. 42 is a cross-sectional view illustrating a semiconductor package that may include a semiconductor device in accordance with example embodiments. FIG. 42 illustrates example embodiments of the semiconductor package 2003 shown in FIG. 41, and shows a cross-section taken along a line I-I' of the semiconductor package 2003 in FIG. 41.

Referring to FIG. 42, in the semiconductor package 2003, the package substrate 2100 may be a PCB. The package substrate 2100 may include a substrate body part 2120, upper pads 2130 (refer to FIG. 41) on an upper surface of the substrate body part 2120, lower pads 2125 on a lower surface of the substrate body part 2120 or exposed through the lower surface of the substrate body part 2120, and inner wirings 2135 for electrically connecting the upper pads 2130 and the lower pads 2125 in an inside of the substrate body part 2120. The upper pads 2130 may be electrically connected to the connection structures 2400. The lower pads 2125 may be connected to wiring patterns 2005 of the main substrate 2010 in the electronic system 2000 through conductive connection parts 2800, as shown in FIG. 41.

Each semiconductor chip 2200 may include a semiconductor substrate 3010, and a first structure 3100 and a second structure 3200 sequentially stacked on the semiconductor substrate 3010. The first structure 3100 may include a peripheral circuit region in which peripheral circuit wirings 3110 may be formed. The second structure 3200 may include a common source line 3205, a gate electrode structure 3210 on the common source line 3205, memory channel structures 3220 and division structures 3230 (refer to FIG. 41) extending through the gate electrode structure 3210, bit lines 3240 electrically connected to the memory channel structures 3220, and gate connection wirings 3235 electrically connected to the word lines WL of the gate electrode structure 3210 (refer to FIG. 40).

Each semiconductor chip 2200 may include a through wiring 3245 being electrically connected to the peripheral circuit wirings 3110 of the first structure 3100 and extending in the second structure 3200. The through wiring 3245 may be disposed at an outside of the gate electrode structure 3210, and the through wirings 3245 may extend through the gate electrode structure 3210. Each semiconductor chip 2200 may further include the input/output pad 2210 (refer to FIG. 41) electrically connected to the peripheral circuit wirings 3110 of the first structure 3100.

The semiconductor chips 2200 of FIG. 42 may be electrically connected to each other by the connection structures 2400 in a bonding wire method. However, in example embodiments, semiconductor chips such as the semiconductor chips 2200 of FIG. 42 may be electrically connected to each other by a connection structure including a TSV.

In the semiconductor device in accordance with example embodiments, electric signals may be applied to both end portions of the SSL, and thus the resistance of the SSL may decrease to relieve the resistive-capacitive (RC) delay.

Each of the embodiments provided in the above description is not excluded from being associated with one or more features of another example or another embodiment also provided herein or not provided herein but consistent with the disclosure While example embodiments have been particularly shown and described, it will be understood by one of ordinary skill in the art that variations in form and detail may be made therein without departing from the spirit and scope of the claims.

What is claimed is:

1. A semiconductor device, comprising:

a lower circuit pattern on a substrate;

a common source plate (CSP) on the lower circuit pattern;

a gate electrode structure comprising gate electrodes spaced apart from each other on the CSP in a first direction that is substantially perpendicular to an upper surface of the substrate, each of the gate electrodes extending in a second direction that is substantially parallel to the upper surface of the substrate;

a first insulation pattern structure on a portion of the CSP that is adjacent to the gate electrode structure in the second direction;

a first division pattern extending on the CSP in a third direction that is substantially parallel to the upper surface of the substrate and that crosses the second direction, the first division pattern extending through a portion of the gate electrode structure that is adjacent to the first insulation pattern structure and separating the gate electrode structure in the second direction;

a channel extending through the gate electrode structure in the first direction, the channel being connected to the CSP;

a first through via extending through the CSP and the gate electrode structure in the first direction, the first through via being electrically connected to the lower circuit pattern; and a second through via extending through the CSP and the first insulation pattern structure in the first direction, the second through via being electrically connected to the lower circuit pattern, wherein a first gate electrode among the gate electrodes is commonly connected to the first through via and the second through via.

2. The semiconductor device of claim 1, wherein the first gate electrode is an uppermost gate electrode of the gate electrodes.

3. The semiconductor device of claim 1, wherein the first gate electrode is configured as a string selection line (SSL).

4. The semiconductor device of claim 1, wherein the first gate electrode comprises a first pad and a second pad at opposite end portions of the first gate electrode in the second direction, and wherein the semiconductor device further comprises:

a first contact plug on the first pad of the first gate electrode; and a second contact plug on the second pad of the first gate electrode.

5. The semiconductor device of claim 1, wherein the lower circuit pattern comprises a first transistor and a second transistor respectively connected to the first through via and the second through via.

6. The semiconductor device of claim 1, wherein the first insulation pattern structure comprises a first insulation pattern and a second insulation pattern alternately stacked in the first direction, and wherein the first insulation pattern comprises a material that is different from a material of the second insulation pattern.

7. The semiconductor device of claim 6, further comprising a second insulation pattern structure extending through the gate electrode structure, the second insulation pattern structure comprising a third insulation pattern and a fourth insulation pattern alternately stacked in the first direction, wherein the third insulation pattern comprises a material that is different from a material of the fourth insulation pattern, and wherein the first through via extends through the second insulation pattern structure.

8. The semiconductor device of claim 7, wherein the material of the third insulation pattern is substantially the same as the material of the first insulation pattern, and wherein the material of the fourth insulation pattern is substantially the same as the material of the second insulation pattern.

9. The semiconductor device of claim 1, further comprising a charge storage structure on an outer sidewall of the channel, the charge storage structure extending in the first direction, wherein the channel and the charge storage structure form a memory channel structure.

10. The semiconductor device of claim 9, further comprising a dummy memory channel structure extending through a portion of the gate electrode structure between the first insulation pattern structure and the first division pattern.

11. The semiconductor device of claim 10, further comprising a plurality of gate electrode structures spaced apart from each other in the third direction, the gate electrode structure being one of the plurality of gate electrode structures, and wherein the first division pattern extends through the plurality of gate electrode structures.

12. The semiconductor device of claim 11, further comprising second division patterns, each of the second division patterns extending in the second direction between gate electrodes of the plurality of gate electrode structures that are adjacent to the second division patterns in the third direction, and wherein the second division patterns are connected to the first division pattern.

13. A semiconductor device, comprising:

a lower circuit pattern on a substrate;

a common source plate (CSP) on the lower circuit pattern;

a gate electrode structure comprising gate electrodes spaced apart from each other on the CSP in a first direction that is substantially perpendicular to an upper surface of the substrate, each of the gate electrodes extending in a second direction that is substantially parallel to the upper surface of the substrate;

division patterns on the CSP, each of the division patterns extending through the gate electrode structure in a third direction that is substantially parallel to the upper surface of the substrate and that crosses the second direction;

an insulation pattern structure on a portion of the CSP between the division patterns;

a channel extending through the gate electrode structure in the first direction, the channel being connected to the CSP;

a first through via extending through the CSP and the gate electrode structure in the first direction, the first through via being electrically connected to the lower circuit pattern; and a second through via extending through the CSP and the insulation pattern structure in the first direction, the second through via being electrically connected to the lower circuit pattern, wherein a first gate electrode among the gate electrodes is commonly connected to the first through via and the second through via.

14. The semiconductor device of claim 13, wherein the first gate electrode is an uppermost gate electrode of the gate electrodes, and is configured as a string selection line (SSL).

15. The semiconductor device of claim 13, wherein the first gate electrode comprises a first pad and a second pad at opposite end portions of the first gate electrode in the second direction, and wherein the semiconductor device further comprises:

a first contact plug on the first pad of the first gate electrode; and a second contact plug on the second pad of the first gate electrode.

16. The semiconductor device of claim 13, further comprising a dummy memory channel structure extending through a portion of the gate electrode structure between the insulation pattern structure and each of the division patterns.

17. A semiconductor device, comprising:

a first pass transistor on a second region of a substrate and a second pass transistor on a third region of the substrate, the substrate comprising first regions at opposite sides of the third region, wherein the second region is at a side of at least one of the first regions;

a common source plate (CSP) on the first pass transistor and the second pass transistor;

a gate electrode structure comprising gate electrodes spaced apart from each other on the CSP in a first direction that is substantially perpendicular to an upper surface of the substrate, each of the gate electrodes extending in a second direction that is substantially parallel to the upper surface of the substrate on the first regions, the second region, and the third region of the substrate;

division patterns on the third region of the substrate, each of the division patterns extending through the gate electrode structure in a third direction that is substantially parallel to the upper surface of the substrate and that crosses the second direction;

an insulation pattern structure on a portion of the CSP between the division patterns;

a memory channel structure extending through the gate electrode structure in the first direction on each of the first regions of the substrate, the memory channel structure being connected to the CSP;

a dummy memory channel structure extending through the gate electrode structure in the first direction on the third region of the substrate, the dummy memory channel structure being connected to the CSP;

a first through via extending through the CSP and the gate electrode structure in the first direction on the second region of the substrate, the first through via being electrically connected to the first pass transistor; and a second through via extending through the CSP and the insulation pattern structure in the first direction on the third region of the substrate, the second through via being electrically connected to the second pass transistor, wherein a first gate electrode among the gate electrodes is commonly connected to the first through via and the second through via, and wherein the first gate electrode is configured as a string selection line (SSL).

18. The semiconductor device of claim 17, wherein the insulation pattern structure is on a central portion of the third region of the substrate, and wherein the dummy memory channel structure extends through a portion of the gate electrode structure at sides of the insulation pattern structure that are opposite in the second direction.

19. The semiconductor device of claim 18, wherein the gate electrodes at the opposite sides of the insulation pattern structure are symmetrical in the second direction.

20. The semiconductor device of claim 17, further comprising a plurality of gate electrode structures spaced apart from each other in the third direction, the gate electrode structure being one of the plurality of gate electrode structures, and wherein each of the division patterns extends through the plurality of gate electrode structures.

* * * * *